United States Patent
Fukuhara et al.

(10) Patent No.: US 8,932,794 B2
(45) Date of Patent: Jan. 13, 2015

(54) POSITIVE PHOTOSENSITIVE COMPOSITION AND PATTERN FORMING METHOD USING THE SAME

(75) Inventors: Toshiaki Fukuhara, Shizuoka (JP); Akinori Shibuya, Shizuoka (JP); Takayuki Kato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 576 days.

(21) Appl. No.: 13/059,441

(22) PCT Filed: Sep. 29, 2009

(86) PCT No.: PCT/JP2009/067309
§ 371 (c)(1),
(2), (4) Date: Feb. 17, 2011

(87) PCT Pub. No.: WO2010/035909
PCT Pub. Date: Apr. 1, 2010

(65) Prior Publication Data
US 2011/0136062 A1    Jun. 9, 2011

(30) Foreign Application Priority Data
Sep. 29, 2008 (JP) ................................. 2008-251921

(51) Int. Cl.
| G03F 7/004 | (2006.01) |
| G03F 7/039 | (2006.01) |
| G03F 7/26 | (2006.01) |
| C08F 20/28 | (2006.01) |
| C08F 20/26 | (2006.01) |
| G03F 7/20 | (2006.01) |

(52) U.S. Cl.
CPC ............... *C08F 20/28* (2013.01); *C08F 20/26* (2013.01); *G03F 7/0045* (2013.01); *G03F 7/0046* (2013.01); *G03F 7/0397* (2013.01); *G03F 7/2041* (2013.01); *Y10S 430/111* (2013.01)
USPC .......................... 430/270.1; 430/326; 430/910

(58) Field of Classification Search
USPC ................................. 430/270.1, 325, 326, 910
See application file for complete search history.

(56) References Cited

U.S. PATENT DOCUMENTS

| 7,264,918 B2 * | 9/2007 | Endo et al. ..................... 430/326 |
| 2003/0134225 A1 * | 7/2003 | Fujimori et al. ............ 430/270.1 |
| 2004/0058269 A1 | 3/2004 | Hada et al. |
| 2007/0059639 A1 * | 3/2007 | Kanda et al. ............... 430/270.1 |
| 2007/0149702 A1 | 6/2007 | Ando et al. |
| 2007/0190449 A1 * | 8/2007 | Momose et al. ........... 430/270.1 |
| 2007/0218401 A1 * | 9/2007 | Ando et al. ................. 430/270.1 |
| 2009/0325102 A1 * | 12/2009 | Shibuya et al. ............ 430/270.1 |

FOREIGN PATENT DOCUMENTS

| CN | 101021683 A | 8/2007 |
| EP | 2 141 183 A1 | 1/2010 |
| JP | 2001-033969 A | 2/2001 |
| JP | 2001-042532 A | 2/2001 |
| JP | 2001-056556 A | 2/2001 |
| JP | 2003-167347 A | 6/2003 |
| JP | 2003-223001 A | 8/2003 |
| JP | 2006-065211 A | 3/2006 |
| JP | 2008-224873 A | 9/2008 |
| JP | 2009-237559 A | 10/2009 |
| WO | 2006/038387 A1 | 4/2006 |

OTHER PUBLICATIONS

Machine translation of JP 2001-033969, published on Feb. 9, 2001.*
International Search Report for PCT/JP2009/067309 dated Dec. 1, 2010 [PCT/ISA/210].
Written Opinion for PCT/JP2009/067309 dated Dec. 1, 2010 [PCT/ISA/237].
Extended European Search Report dated Jan. 24, 2013 in European Application No. 09 81 6316.
Office Action dated Jun. 25, 2013 issued by the Japanese Patent Office in corresponding Japanese Application No. 2009-223408.
Office Action from the Taiwanese Patent Office dated Mar. 31, 2014, in a counterpart Taiwanese Application No. 098132820.

* cited by examiner

*Primary Examiner* — Anca Eoff
(74) *Attorney, Agent, or Firm* — Sughrue Mion, PLLC

(57) ABSTRACT

A positive photosensitive composition, includes: (A) a resin having a repeating unit represented by formula (1) as defined in the specification and a repeating unit represented by formula (2) as defined in the specification and being capable of increasing a solubility of the resin (A) in an alkali developer by an action of an acid; (B) a compound capable of generating an acid upon irradiation with actinic rays or radiation; and a solvent, and a pattern forming method uses the positive photosensitive composition.

17 Claims, No Drawings

POSITIVE PHOTOSENSITIVE COMPOSITION AND PATTERN FORMING METHOD USING THE SAME

TECHNICAL FIELD

The present invention relates to a positive photosensitive composition for use in the process of producing a semiconductor such as IC, in the production of a circuit board for liquid crystal, thermal head and the like, and in other photofabrication processes, and a pattern forming method using the composition. More specifically, the present invention relates to a positive photosensitive composition suitable for exposure using a light source that emits far ultraviolet rays at a wavelength of 250 nm or less, preferably 220 nm or less, an electron beam, or the like, and a pattern forming method using the composition.

BACKGROUND ART

A chemical amplification photosensitive composition is a pattern forming material capable of forming a pattern on a substrate by producing an acid in the exposed area upon irradiation with radiation such as far ultraviolet light and through a reaction using this acid as the catalyst, changing the solubility in a developer to differ between the active radiation-irradiated part and the non-irradiated part.

In the case of using a KrF excimer laser as the exposure light source, a resin having small absorption in the region of 248 nm and having a basic skeleton of poly(hydroxystyrene) is primarily used as the main component and therefore, this is an excellent system capable of forming a good pattern with high sensitivity and high resolution compared with conventional naphthoquinonediazide/novolak resin systems.

In the case of using a light source of emitting light at shorter wavelengths, for example, in using an ArF excimer laser (193 nm) as the light source, a satisfactory pattern cannot be formed even by the above-described chemical amplification system because the compound having an aromatic group substantially has large absorption in the region of 193 nm.

In order to solve this problem, a resist containing an alicyclic hydrocarbon structure has been developed for use with an ArF excimer laser. For example, JP-A-2003-167347 and JP-A-2003-223001 describe a composition comprising a repeating unit containing an acid-decomposable group having a polycyclic structure and a non-acid-decomposable repeating unit. In JP-A-2001-56556, a combination of a specific resin and a solvent is studied with an attempt to reduce development defects, edge roughness and iso/dense bias.

Furthermore, the recent demand for a resist pattern with high resolution of 0.11 microns or less requires the development defect of the resist pattern after development to be more reduced than ever before, in addition to the above-described properties.

Development defects are troubles in general detected when the resist pattern after development is observed from directly above, for example, by a surface defect inspection apparatus ("KLA", trade name) manufactured by KLA-Tencor Ltd. This trouble includes, for example, bubble or dust after development and bridges between gaps in resist patterns.

Also, the ArF resist in recent years has a problem that a residue (hereinafter, sometimes referred to as a "scum") is found in the removed portion (space portion). If this scum is present, the pattern is not correctly transferred after etching, which hinders the production of a device.

In order to reduce these development defects and scum, studies and improvements have been heretofore made, mainly focusing on the resist composition such as resin component, acid generator component and solvent component of the resist composition (see, JP-A-2001-56556), but more improvements are being demanded.

SUMMARY OF INVENTION

The present invention has been made under these circumstances, and an object of the present invention is to provide a positive photosensitive composition usable for fine pattern formation in the production of a semiconductor which allows excellent performance and reduction in development defects and scum, and a pattern forming method using the composition.

The present invention is as follows.

(1) A positive photosensitive composition, comprising:

(A) a resin having a repeating unit represented by formula (1) and a repeating unit represented by formula (2) and being capable of increasing a solubility of the resin (A) in an alkali developer by an action of an acid;

(B) a compound capable of generating an acid upon irradiation with actinic rays or radiation; and a solvent:

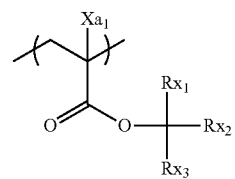

(1)

wherein $Xa_1$ represents a hydrogen atom, a methyl group or a group represented by —$CH_2$—$R_9$ in which $R_9$ represents a hydroxyl group or a monovalent organic group;

each of $Rx_1$ to $Rx_3$ independently represents an alkyl group or a cycloalkyl group, and two members out of $Rx_1$ to $Rx_3$ may combine to form a cycloalkyl group, provided that the group represented by —$C(Rx_1)(Rx_2)(Rx_3)$ in formula (1) has at least one group represented by -$(L)_{n_1}$-P as a substituent;

L represents a divalent linking group;

$n_1$ is 0 or 1; and

P represents a polar group:

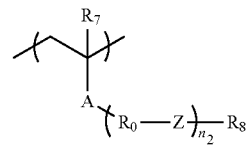

(2)

wherein A represents an ester bond or an amide bond;

$R_0$ represents an alkylene group, a cycloalkylene group or a divalent linking group formed by a combination thereof, and when a plurality of $R_0$'s are present, the plurality of $R_0$'s may be the same or different;

Z represents an ether bond, an ester bond, an amide bond, a urethane bond, a urea bond or a combination thereof, and when a plurality of Z's are present, the plurality of Z's may be the same or different;

$R_8$ represents a monovalent organic group having a lactone structure;

$n_2$ is a repetition number of the structure represented by —$R_0$—Z— in the repeating unit represented by formula (2) and represents an integer of 1 to 5; and $R_7$ represents a hydrogen atom, a halogen atom or an alkyl group.

(2) The positive photosensitive composition as described in (1) above, wherein in the repeating unit represented by formula (1), P is a hydroxyl group, a cyano group or an amide group.

(3) The positive photosensitive composition as described in (1) or (2) above, wherein in the repeating unit represented by formula (1), L is a branched alkylene group.

(4) The positive photosensitive composition as described in any one of (1) to (3) above, wherein in the repeating unit represented by formula (2), $n_2$ is 1.

(5) The positive photosensitive composition as described in any one of (1) to (4) above, wherein in the repeating unit represented by formula (2), $R_8$ is a monovalent organic group containing a lactone structure having a cyano group as a substituent.

(6) The positive photosensitive composition as described in any one of (1) to (5) above, further comprising:

a hydrophobic resin.

(7) The positive photosensitive composition as described in any one of (1) to (6) above, wherein the repeating unit represented by formula (1) is a repeating unit represented by formula (1-1):

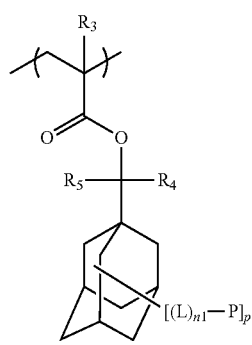

(1-1)

wherein $R_3$ has the same meaning as $Xa_1$ in formula (1);

$R_4$ and $R_5$ have the same meanings as $Rx_1$ and $Rx_2$ in formula (1);

the group represented by -(L)$_{n1}$-P has the same meaning as the group represented by -(L)$_{n1}$-P regarding formula (1); and p represents an integer of from 1 to 15.

(8) The positive photosensitive composition as described in (7) above, wherein in the repeating unit represented by formula (1-1), p is 1.

(9) The positive photosensitive composition as described in any one of (1) to (8) above, wherein the repeating unit represented by formula (2) is a repeating unit represented by formula (2-1):

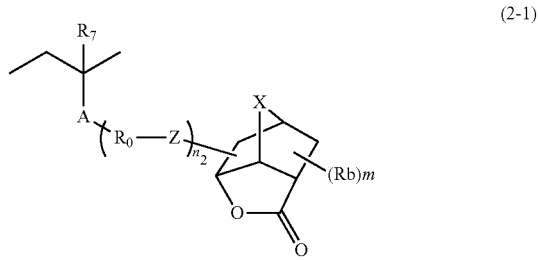

(2-1)

wherein $R_7$, A, $R_0$, Z and $n_2$ have the same meanings as $R_7$, A, $R_0$, Z and $n_2$ in formula (2);

Rb represents an alkyl group, a cycloalkyl group, an alkoxycarbonyl group, a cyano group, a hydroxyl group or an alkoxy group, and when a plurality of Rb's are present, the plurality of Rb's may be the same or different and two members out of the plurality of Rb's may combine to form a ring;

X represents an alkylene group, an oxygen atom or a sulfur atom; and m is the number of substituents and represents an integer of 0 to 5.

(10) The positive photosensitive composition as described in (9) above, wherein in the repeating unit represented by formula (2-1), m is 0 or 1.

(11) The positive photosensitive composition as described in any one of (1) to (6), (9) and (10) above, wherein in the repeating unit represented by formula (1), $Rx_1$ represents an alkyl group (for example, a methyl group), $Rx_2$ and $Rx_3$ are combined to form a cycloalkyl group (for example, an adamantyl group) and —C(CH$_3$)$_2$—P in which P represents a hydroxyl group or a cyano group is bonded to the cycloalkyl group formed by $Rx_2$ and $Rx_3$, and in the repeating unit represented by formula (2), A represents an ester bond, $R_0$ represents an alkylene group (for example, a methylene group), Z represents an ester bond, $n_2$ represents 1 and $R_8$ represents a norbornane lactone (preferably a cyano group-substituted norbornane lactone).

(12) The positive photosensitive composition as described in any one of (1) to (11) above, wherein a content of the repeating unit represented by formula (1) is from 5 to 50 mol % based on all repeating units in the resin (A).

(13) A pattern forming method, comprising:

forming a resist film from the positive photosensitive composition as described in any one of (1) to (12) above; and exposing and developing the resist film.

(14) The pattern forming method as described in (13) above, wherein the resist film is exposed through an immersion liquid.

DESCRIPTION OF EMBODIMENTS

The present invention is described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(A) Resin Having a Repeating Unit Represented by Formula (1) and a Repeating Unit Represented by Formula (2)

and being Capable of Increasing the Solubility in an Alkali Developer by the Action of an Acid The resin (A) has a repeating unit represented by the following formula (1):

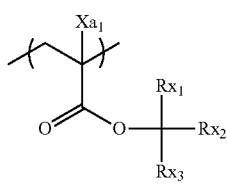

(1)

In formula (1), $Xa_1$ represents a hydrogen atom, a methyl group or a group represented by —$CH_2$—$R_9$. $R_9$ represents a hydroxyl group or a monovalent organic group. Each of $Rx_1$ to $Rx_3$ independently represents an alkyl group (linear or branched) or a cycloalkyl group (monocyclic or polycyclic). Any two members from among $Rx_1$ to $Rx_3$ may be combined to form a cycloalkyl group (monocyclic or polycyclic).

Here, the group represented by —$C(Rx_1)(Rx_2)(Rx_3)$ in formula (1) has, as the substituent, at least one group represented by -$(L)_{n1}$-P.

L represents a divalent linking group, $n_1$ is 0 or 1, and P represents a polar group.

In formula (1), $Xa_1$ represents a hydrogen atom, a methyl group or a group represented by —$CH_2$—$R_9$. $R_9$ represents a hydroxyl group or a monovalent organic group (for example, an alkyl group having a carbon number of 5 or less or an acyl group, preferably an alkyl group having a carbon number of 3 or less, more preferably a methyl group) and is preferably a hydroxyl group. The methyl group of $Xa_1$ may be substituted by a halogen atom (preferably a fluorine atom) or the like. $Xa_1$ is preferably a hydrogen atom, a methyl group, a trifluoromethyl group or a hydroxymethyl group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a cycloalkyl group having a carbon number of 3 to 15, and examples thereof include a monocyclic cycloalkyl group such as cyclopentyl group and cyclohexyl group, and a polycyclic cycloalkyl group such as norbornyl group, tetracyclodecanyl group, tetracyclododecanyl group and adamantyl group.

The cycloalkyl group formed by combining any two members from among $Rx_1$ to $Rx_3$ is preferably a cycloalkyl group having a carbon number of 3 to 15, and examples thereof include a monocyclic cycloalkyl group such as cyclopentyl group and cyclohexyl group, and a polycyclic cycloalkyl group such as norbornyl group, tetracyclodecanyl group, tetracyclododecanyl group and adamantyl group.

In a preferred embodiment, $Rx_1$ is a methyl group or an ethyl group, $Rx_2$ and $Rx_3$ are combined to form the above-described cycloalkyl group, and a -$(L)_{n1}$-P group is bonded to the cycloalkyl group.

Examples of the polar group of P include a hydroxyl group, a cyano group, an amino group, an amide group such as an acid amide group (—$CONH_2$) and an alkylamide group, and a sulfonamide group, and the polar group is preferably a hydroxyl group, a cyano group or an amide group, more preferably a hydroxyl group.

Examples of the divalent linking group of L include a linear or branched alkylene group and a cycloalkylene group, and a branched alkylene group is preferred. The carbon number of the divalent linking group as L is preferably 20 or less, more preferably 15 or less.

Examples of the group represented by -$(L)_{n1}$-P include, when $n_1$=1, a linear or branched alkyl group (preferably having a carbon number of 1 to 10) and a cycloalkyl group (preferably having a carbon number of 3 to 15), each having a hydroxyl group, a cyano group, an amino group, an amide group such as an alkylamide group and an acid amide group or a sulfonamide group. Of these, an alkyl group (preferably having a carbon number of 1 to 5) having a hydroxyl group or a cyano group is preferred, and an alkyl group (preferably having a carbon number of 1 to 5) having a hydroxyl group is more preferred. Further, an alkyl group (preferably having a carbon number of 3 to 5) having a tertiary carbon atom to which a hydroxyl group or a cyano group is substituted is preferred, and —$C(CH_3)_2OH$ or —$C(CH_3)_2CN$ is more preferred.

Each of the groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

It is preferred that P is a hydroxyl group, $n_1$ is 1, and L is a linear or branched alkylene group (preferably having a carbon number of 1 to 5). Of these, L is preferably a branched alkylene group (preferably having a carbon number of 3 to 5) having a tertiary carbon atom to which the hydroxyl group is substituted, and more preferably a branched alkylene group having a carbon number of 3 and including a tertiary carbon atom to which the hydroxyl group is substituted.

The number of groups represented by -$(L)_{n1}$-P in the group represented by —$C(Rx_1)(Rx_2)(Rx_3)$ in formula (1) is preferably from 1 to 3, more preferably 1 or 2, and most preferably 1.

The monomer corresponding to the repeating unit of formula (1) can be synthesized, for example, by the method described in JP-A-2006-16379.

The content of the repeating unit represented by formula (1) is preferably from 5 to 50 mol %, more preferably from 10 to 30 mol %, of all the repeating units in the resin (A).

The resin may contain two or more kinds of repeating units represented by formula (1). The term "two or more kinds" as used herein means to contain one kind of a repeating unit represented by formula (1) and one or more kinds of repeating units represented by formula (1), which are not utterly the same repeating unit as the repeating unit above. The molar ratio of these two kinds of repeating units represented by formula (1) is preferably from 90/10 to 10/90, more preferably from 80/20 to 20/80.

Specific preferred examples of the repeating unit represented by formula (1) are set forth below, but the present invention is not limited thereto.

In the structural formulae below, Q indicates a group represented by -$(L)_{n1}$-P (wherein L, P and $n_1$ have the same meanings as those in formula (1)).

Rx represents a hydrogen atom, $CH_3$, $CF_3$ or $CH_2OH$.

Each of Rxa and Rxb independently represents an alkyl group having a carbon number of 1 to 4.

With respect to each of these groups, when a plurality of members are present, they may be the same or different.

p represents an integer of from 1 to 15.

1
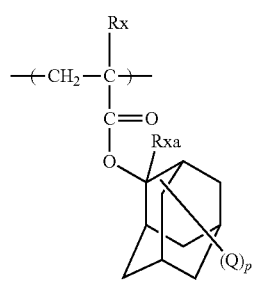
2
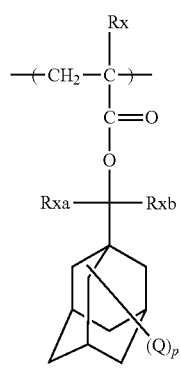
3
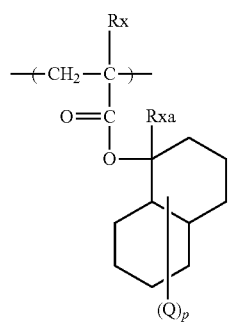
4
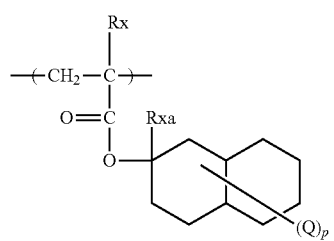
5
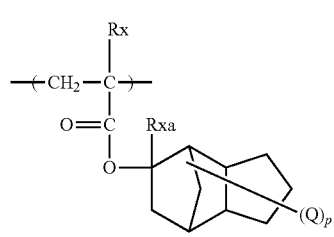
6
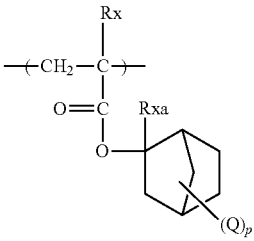
7
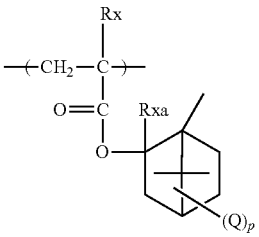
8
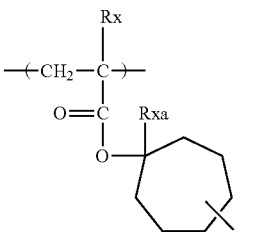
9
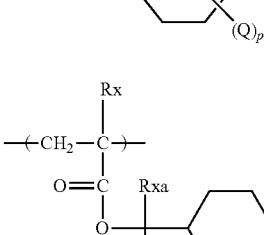
10
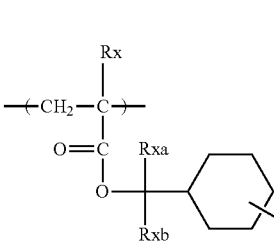
11
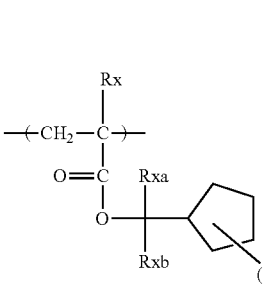

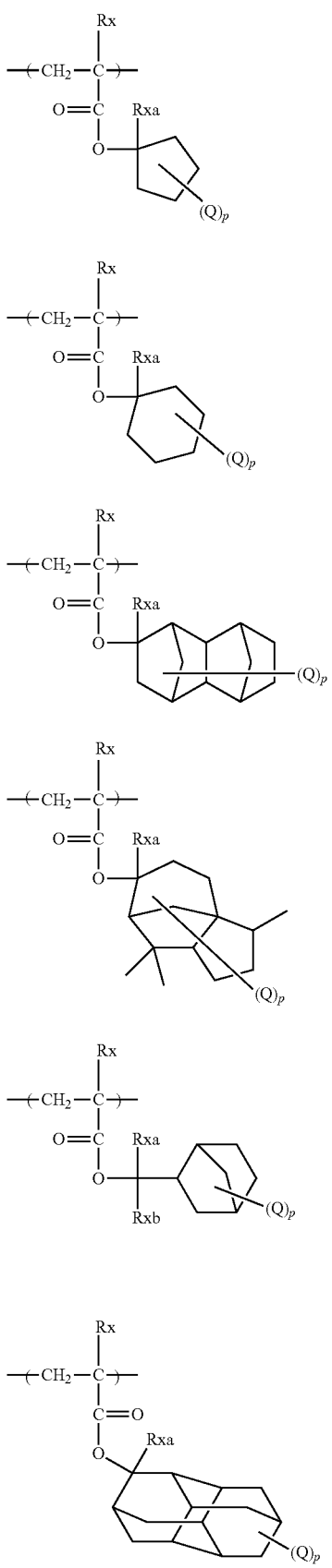

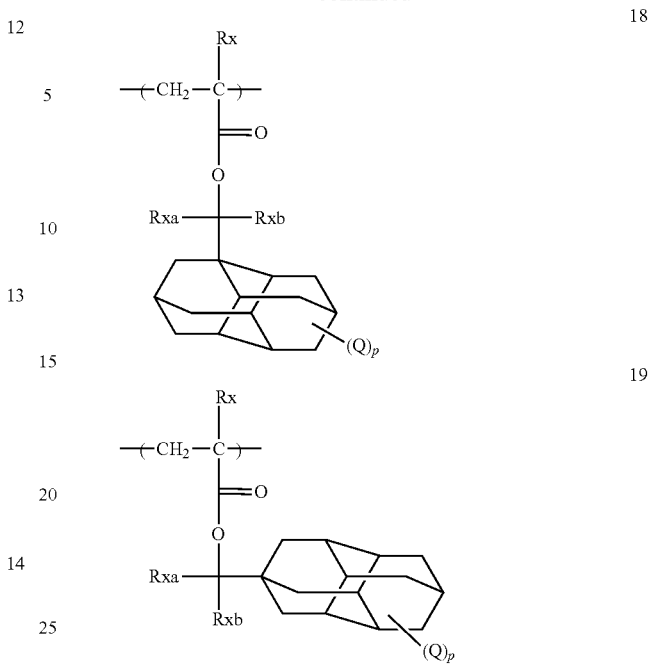

The repeating unit represented by formula (1) is preferably a repeating unit represented by the following formula (1-1):

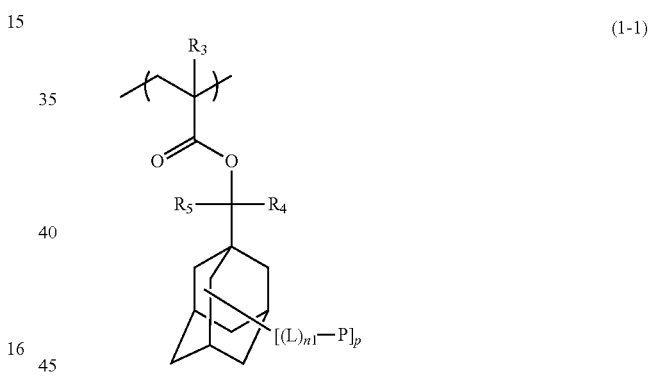

(1-1)

In formula (1-1), $R_3$ has the same meanings as $Xa_1$ in formula (1).

$R_4$ and $R_5$ have the same meanings as $Rx_1$ and $Rx_2$ in formula (1).

The group represented by $-(L)_{n1}-P$ has the same meaning as the group represented by $-(L)_{n1}-P$ regarding formula (1).

p represents an integer of from 1 to 15. p is preferably 1 or 2, more preferably 1.

The resin (A) is a resin capable of increasing the solubility in an alkali developer by the action of an acid (i.e. acid-decomposable resin) and has a group capable of decomposing by the action of an acid to produce an alkali-soluble group (hereinafter sometimes referred to as an "acid-decomposable group"), in the side chain of the resin. The group preferred as the group capable of decomposing by the action of an acid is a group in which a hydrogen atom of an alkali-soluble group such as —COOH group and —OH group is replaced by a group which is caused to separate by the action of an acid.

Examples of the group which is caused to separate by the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In these formulae, each of $R_{36}$ to $R_{39}$ independently represents an alkyl group, a cycloalkyl group, an aryl group, an aralkyl group or an alkenyl group, and $R_{36}$ and $R_{37}$, or $R_{36}$ and $R_{39}$ may combine with each other to form a ring.

Each of $R_{01}$ and $R_{02}$ independently represents a hydrogen atom, an alkyl group, a cycloalkyl group, an aryl group, an aralkyl group or an alkenyl group.

In the present invention, the acid-decomposable group is preferably an acetal group or a tertiary ester group.

The repeating unit represented by formula (1) is a repeating unit having an acid-decomposable group.

The resin (A) may further have an acid-decomposable group-containing repeating unit, in addition to the repeating unit represented by formula (1).

The resin (A) may further have, as the acid-decomposable group-containing repeating unit, a repeating unit having a structure selected from the following formulae (pI) to (pV):

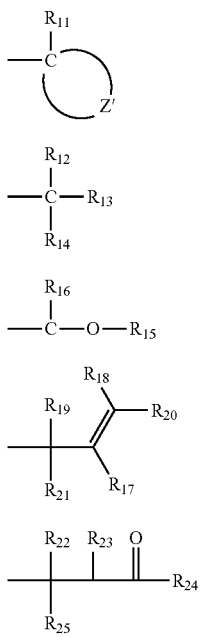

(pI)
(pII)
(pIII)
(pIV)
(pV)

In formulae (pI) to (pV), $R_{11}$ represents an alkyl group or a cycloalkyl group.

Z' represents an atomic group necessary for forming a cycloalkyl group together with the carbon atom.

Each of $R_{12}$ to $R_{14}$ independently represents an alkyl group or a cycloalkyl group, provided that at least one among $R_{12}$ to $R_{14}$ represents a cycloalkyl group.

Each of $R_{15}$ and $R_{16}$ independently represents an alkyl group or a cycloalkyl group, provided that either $R_{15}$ or $R_{16}$ represents a cycloalkyl group.

Each of $R_{17}$ to $R_{21}$ independently represents a hydrogen atom, an alkyl group or a cycloalkyl group, provided that at least one among $R_{17}$ to $R_{21}$ represents a cycloalkyl group and either $R_{19}$ or $R_{21}$ represents an alkyl group or a cycloalkyl group.

Each of $R_{22}$ to $R_{25}$ independently represents a hydrogen atom, an alkyl group or a cycloalkyl group, provided that at least one among $R_{22}$ to $R_{25}$ represents a cycloalkyl group. $R_{23}$ and $R_{24}$ may combine with each other to form a ring.

In formulae (pI) to (pV), the allyl group of $R_{11}$ to $R_{25}$ is preferably a linear or branched alkyl group having from 1 to 8 carbon atoms, and examples thereof include a methyl group, an ethyl group, a propyl group, an n-butyl group, a sec-butyl group and a tert-butyl group.

The cycloalkyl group of $R_{11}$ to $R_{25}$ and the cycloalkyl group formed by Z' together with carbon atoms may be monocyclic or polycyclic. Specific examples thereof include a group having a carbon number of S or more and having a monocyclo, bicyclo, tricyclo or tetracyclo structure. The carbon number thereof is preferably from 4 to 30, more preferably from 5 to 25. These cycloalkyl groups each may have an unsaturated double bond in the ring and may have a substituent.

The cycloalkyl group of $R_{11}$ to $R_{25}$ and the cycloalkyl group formed from Z' together with carbon atoms are preferably monocyclic, and the carbon number of the cycloalkyl group is more preferably from 4 to 10, and most preferably from 5 to 7.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

These alkyl groups and cycloalkyl groups each may further have a substituent. Examples of the substituent which the alkyl group and cycloalkyl group may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). These alkyl groups, alkoxy groups, alkoxycarbonyl groups and the like each may further have a substituent. Examples of the substituent which the alkyl group, alkoxy group, alkoxycarbonyl group and the like may further have include a hydroxyl group, a halogen atom and an alkoxy group.

The groups represented by formulae (pI) to (pV) each can form an acid-decomposable group by being used for the protection of an alkali-soluble group. Examples of the alkali-soluble group include various groups known in this technical field.

Specific examples thereof include a structure where the hydrogen atom of a carboxylic acid group, a sulfonic acid group, a phenol group or a thiol group is replaced by the group represented by any one of formulae (pI) to (pV). A structure where the hydrogen atom of a carboxylic acid group or a sulfonic acid group is replaced by the group represented by any one of formulae (pI) to (pV) is preferred.

The repeating unit having an alkali-soluble group protected by the group represented by any one of formulae (pI) to (pV) is preferably a repeating unit represented by the following formula (pA):

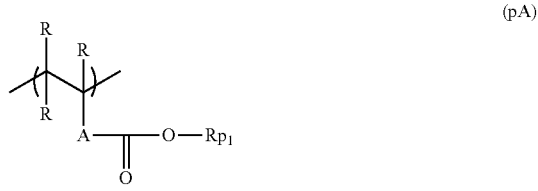

(pA)

In formula (pA), R represents a hydrogen atom, a halogen atom or a linear or branched alkyl group having from 1 to 4 carbon atoms, and each R may be the same as or different from every other R.

A represents a single bond, or a sole group or a combination of two or more groups selected from the group consisting of an alkylene group, an ether group, a thioether group, a carbonyl group, an ester group, an amide group, a sulfonamide group, a urethane group and a ureylene group, and is preferably a single bond.

$Rp_1$ represents any one group of formulae (pI) to (pV).

Specific preferred examples of the repeating unit having an acid-decomposable group are set forth below, but the present invention is not limited thereto.

1
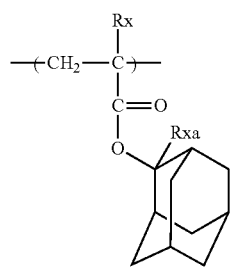

2
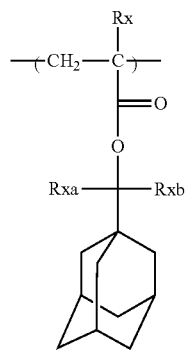

3
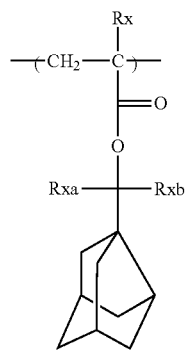

4
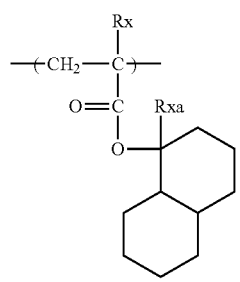

5
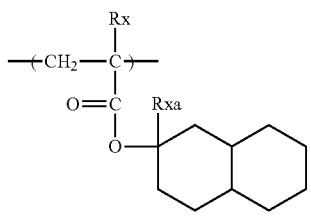

6
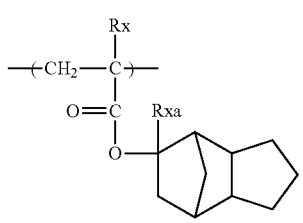

7
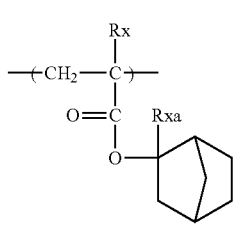

8
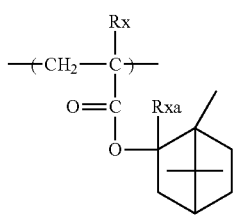

9
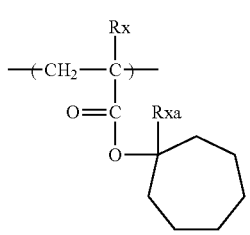

10
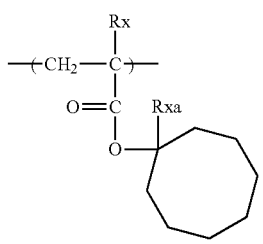

11
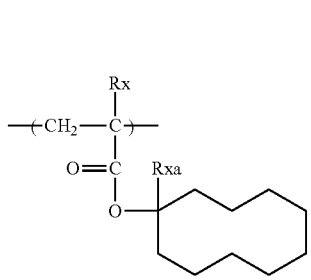

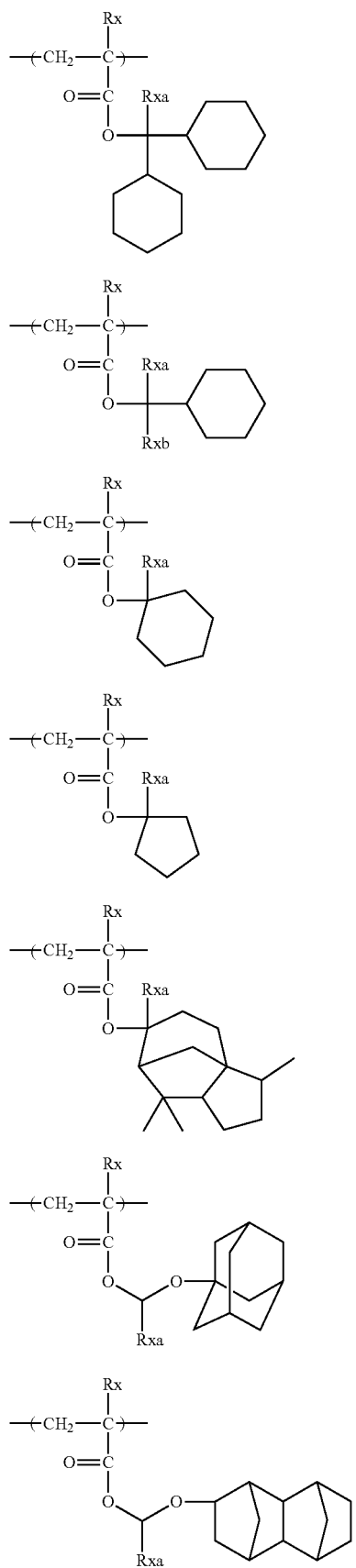
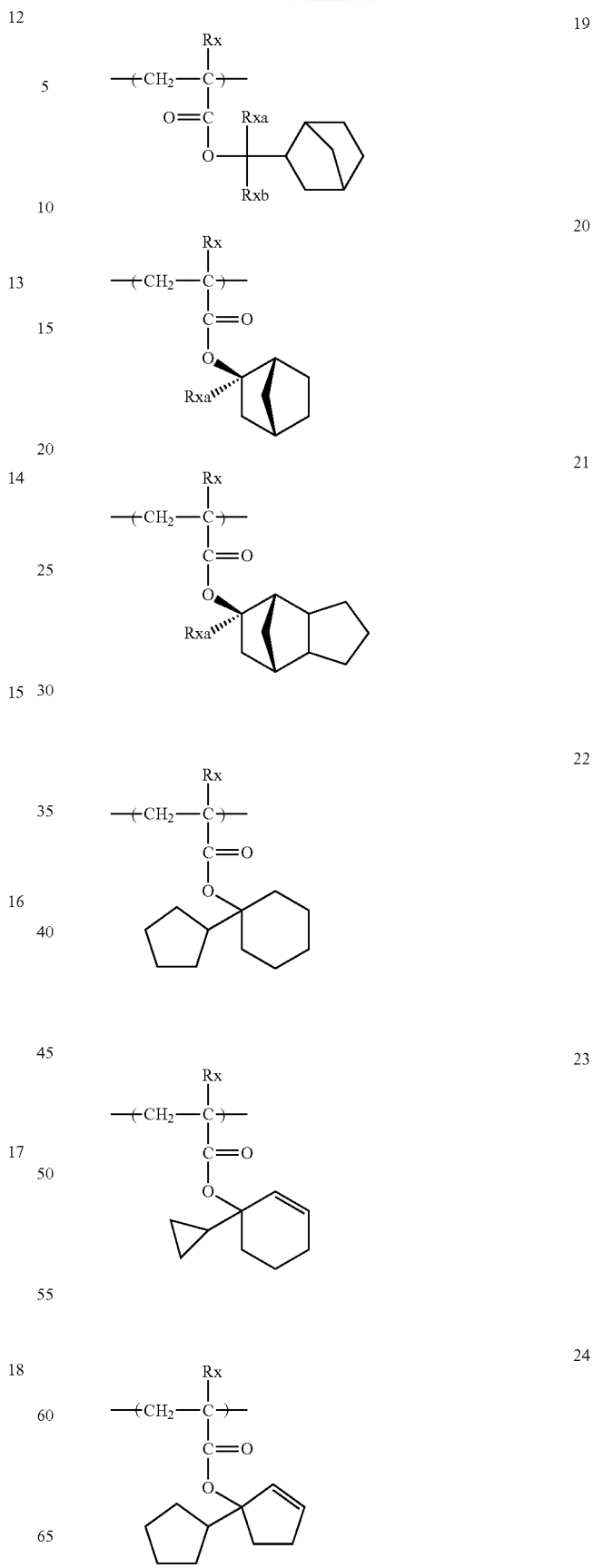

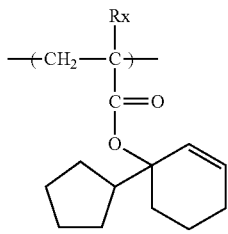

In the formulae above, Rx represents H, $CH_3$, $CF_3$ or $CH_2OH$, and each of Rxa and Rxb independently represents an alkyl group having a carbon number of 1 to 4.

The content of the acid-decomposable group-containing repeating unit other than the repeating unit represented by formula (1), such as acid-decomposable group-containing repeating unit represented by formula (pA), is preferably from 20 to 70 mol %, more preferably from 30 to 50 mol %, of all the repeating units in the resin (A).

The resin may contain two or more kinds of acid-decomposable group-containing repeating units represented by formula (pA). In this case, the molar ratio of these two kinds of acid-decomposable group-containing repeating units represented by formula (pA) is preferably from 90/10 to 10/90, more preferably from 80/20 to 20/80.

The resin (A) preferably further contains a lactone structure-containing repeating unit represented by the following formula (2):

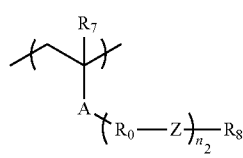

In formula (2), A represents an ester bond (—COO—), or an amide bond (—CONH—).

$R_0$ represents an alkylene group, a cycloalkylene group or a combination thereof, and when a plurality of $R_0$'s are present, these may be the same or different.

Z represents, when a plurality of Z's are present, each Z independently represents, an ether bond, an ester bond, an amido bond, a urethane bond
(a group represented by

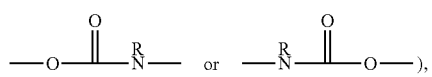

or a urea bond
(a group represented by

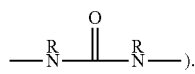

Here, R represents a hydrogen atom, an alkyl group, a cycloalkyl group or an aryl group.

$R_8$ represents a monovalent organic group having a lactone structure.

$n_2$ is the repetition number of the structure represented by —$R_0$—Z— in the repeating unit represented by formula (2) and represents an integer from 1 to 5. $n_2$ is preferably 1.

$R_7$ represents a hydrogen atom, a halogen atom or an alkyl group.

The alkylene group or cycloalkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group. The alkyl group in $R_7$ may be substituted, and examples of the substituent include a halogen atom such as fluorine atom, chlorine atom and bromine atom, a mercapto group, a hydroxy group, an alkoxy group such as methoxy group, ethoxy group, isopropoxy group, tert-butoxy group and benzyloxy group, and an acetoxy group such as acetyloxy group and propionyloxy group. $R_7$ is preferably a hydrogen atom, a methyl group, a trifluoromethyl group or a hydroxymethyl group.

The alkylene group in $R_0$ is preferably a linear or branched alkylene group having a carbon number of 1 to 10, more preferably from 1 to 5, and examples thereof include a methylene group, an ethylene group and a propylene group. The cycloalkylene is preferably a cycloalkylene having a carbon number of 3 to 20, and examples thereof include cyclohexylene, cyclopentylene, norbornylene and adamantylene. For bringing out the effects of the present invention, a chain alkylene group is more preferred, and a methylene group is still more preferred.

The lactone structure-containing monovalent organic group represented by $R_8$ is not limited as long as it has a lactone structure. Specific examples thereof include lactone structures represented by formulae (LC1-1) to (LC1-16) and of these, a structure represented by (LC1-4) is preferred. Structures where na in (LC1-1) to (LC1-16) is an integer of 2 or less are more preferred.

$R_8$ is preferably a monovalent organic group containing an unsubstituted lactone structure or a monovalent organic group containing a lactone structure having a methyl group, a cyano group or an alkoxycarbonyl group as the substituent, more preferably a monovalent organic group containing a lactone structure having a cyano group as the substituent (cyanolactone).

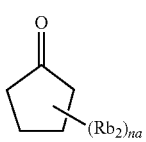

LCl-1

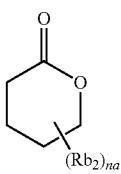

LCl-2

LCl-3 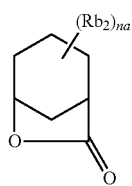

LCl-4 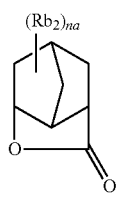

LCl-5 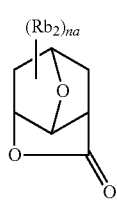

LCl-6 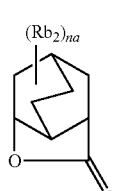

LCl-7 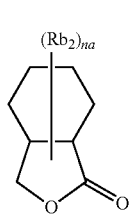

LCl-8 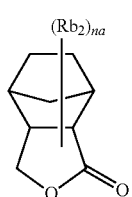

LCl-9 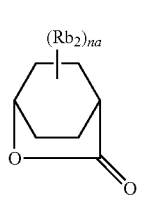

LCl-10 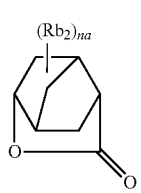

LCl-11 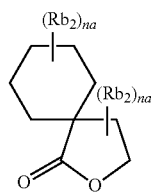

LCl-12 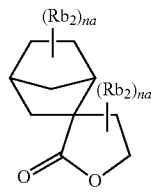

LCl-13 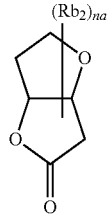

LCl-14 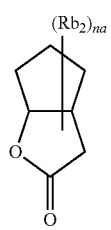

LCl-15 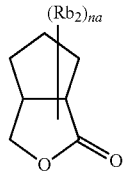

LCl-16 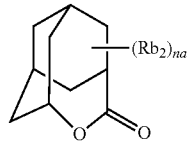

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. Of these, an alkyl group having a carbon number of 1 to 4, a cyano group and an acid-decomposable group are more preferred. $n_a$ represents an integer of 0 to 4. When $n_a$ is an integer of 2 or more, each substituent ($Rb_2$) may be the same as or different from every other $Rb_2$ and also, the plurality of substituents ($Rb_2$) may combine with each other to form a ring.

Specific examples of the repeating unit containing a group having a lactone structure represented by formula (2) are set forth below, but the present invention is not limited thereto.

In the following specific examples, R is a hydrogen atom, an alkyl group which may have a substituent, or a halogen atom, preferably a hydrogen atom, a methyl group, a hydroxymethyl group or an acetoxymethyl group.

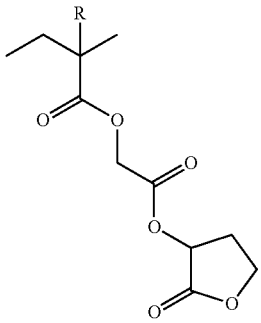

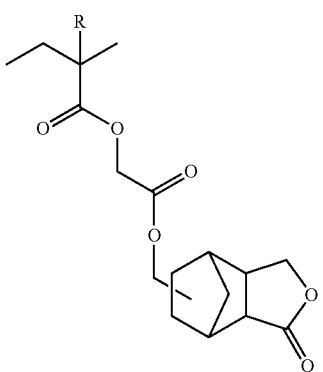

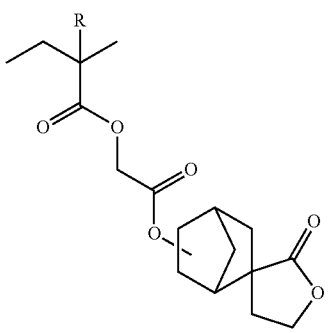

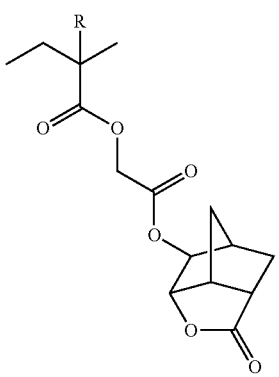

The repeating unit having a lactone structure is more preferably a repeating unit represented by the following formula (2-1):

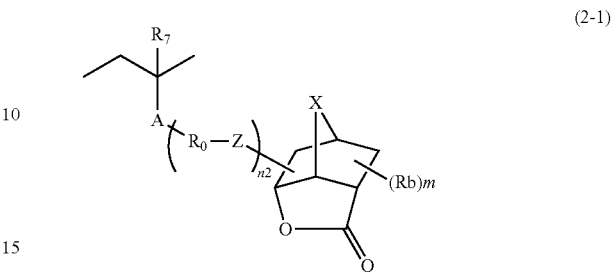

(2-1)

In formula (2-1), $R_7$, A, $R_0$, Z and $n_2$ have the same meanings as $R_7$, A, $R_0$, Z and $n_2$ in formula (2).

Rb represents, when a plurality of Rb's are present, each independently represents, an alkyl group, a cycloalkyl group, an alkoxycarbonyl group, a cyano group, a hydroxyl group or an alkoxy group, and when a plurality of Rb's are present, two members thereof may combine to form a ring.

X represents an alkylene group, an oxygen atom or a sulfur atom.

m is the number of substituents and represents an integer of 0 to 5. m is preferably 0 or 1.

The alkyl group of Rb is preferably an alkyl group having a carbon number of 1 to 4, more preferably a methyl group or an ethyl group, and most preferably a methyl group. The cycloalkyl group may be a cyclopropyl, cyclobutyl, cyclopentyl or cyclohexyl group. Examples of the alkoxycarbonyl group include a methoxycarbonyl group, an ethoxycarbonyl group, an n-butoxycarbonyl group and a tert-butoxycarbonyl group. Examples of the alkoxy group include a methoxy group, an ethoxy group, an n-butoxy group and a tert-butoxy group. Each of the alkyl group, cycloalkyl group, alkoxycarbonyl group and alkoxy group of Rb may have a substituent, and examples of the substituent include a hydroxy group, an alkoxy group such as methoxy group and ethoxy group, a cyano group, and a halogen atom such as fluorine atom. Rb is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is 1 or more, at least one Rb is preferably substituted at the α-position or β-position of the carbonyl group of lactone, more preferably at the α-position.

Specific examples of the repeating unit containing a group having a lactone structure represented by formula (2-1) are set forth below, but the present invention is not limited thereto.

In the following specific examples, R represents a hydrogen atom, an alkyl group which may have a substituent, or a halogen atom, preferably a hydrogen atom, a methyl group, a hydroxymethyl group or an acetoxymethyl group.

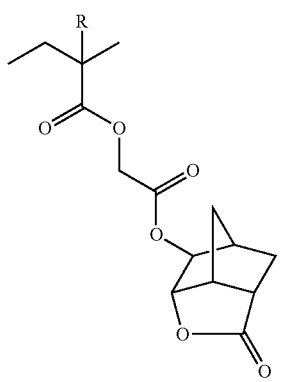
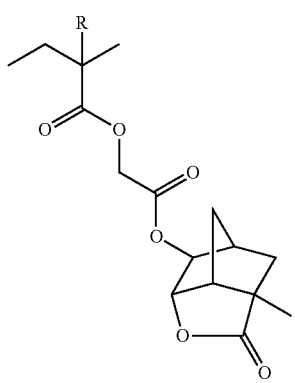
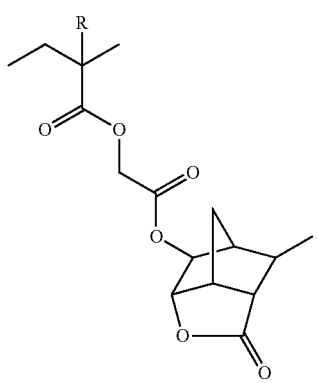
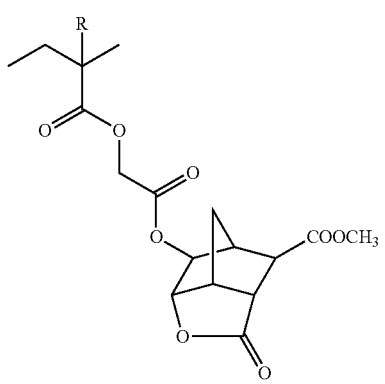
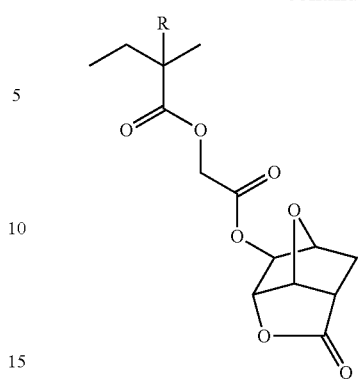
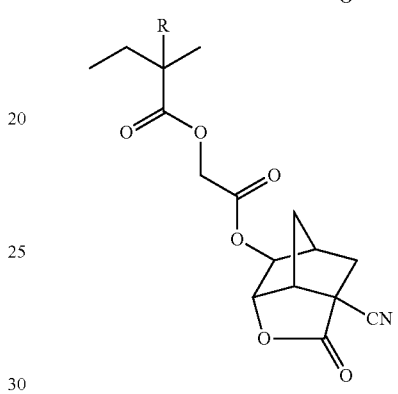
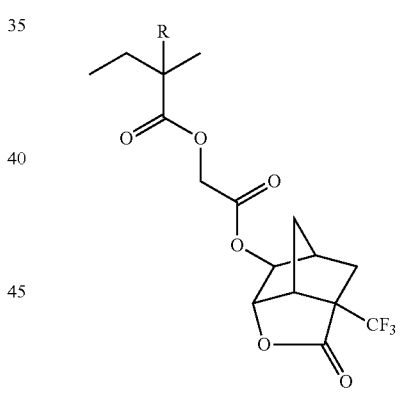
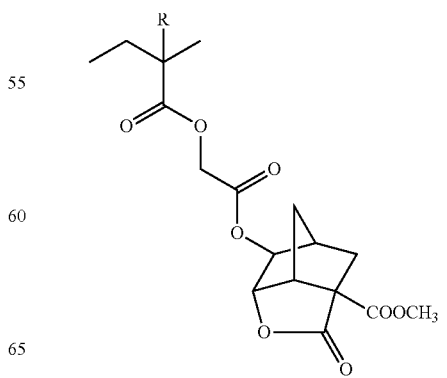

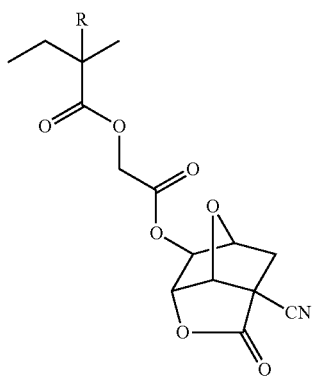
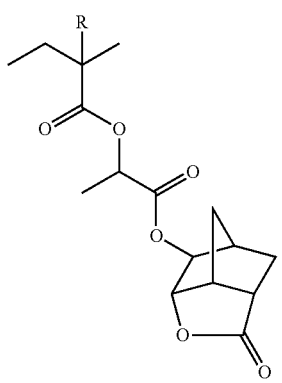
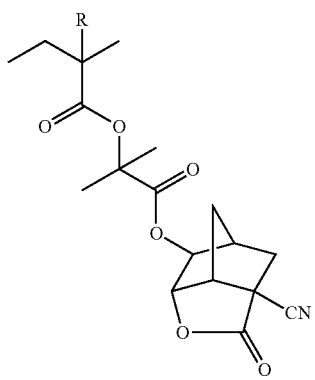
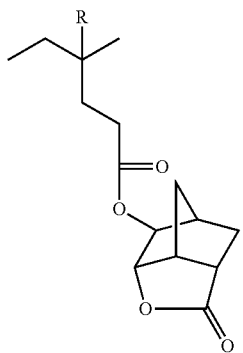
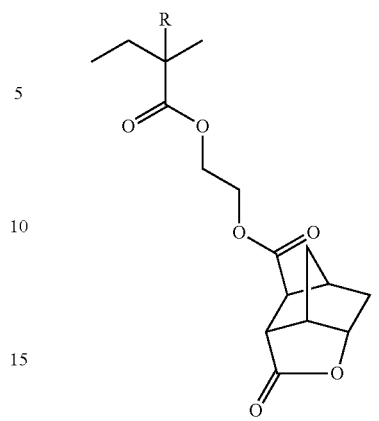
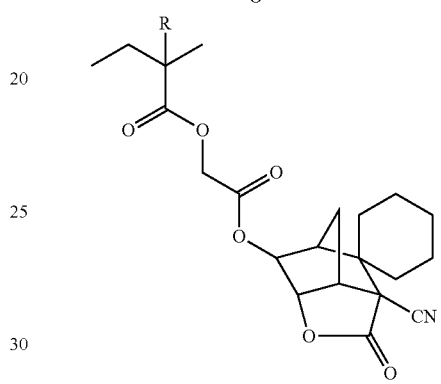
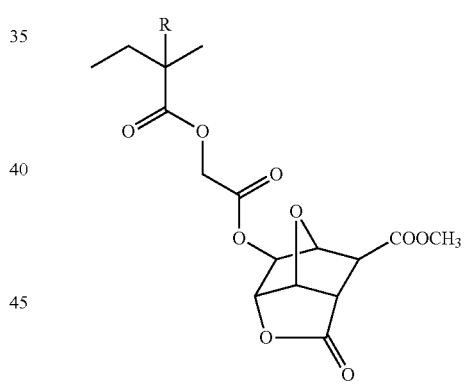
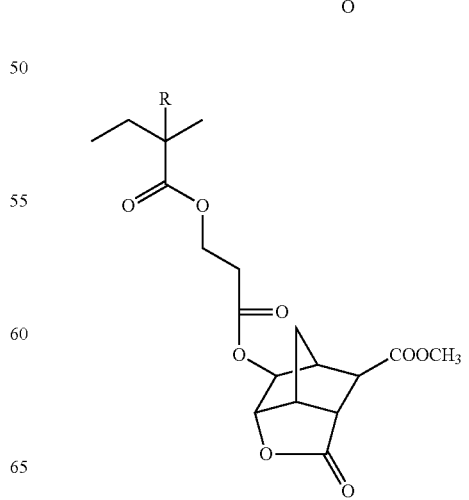

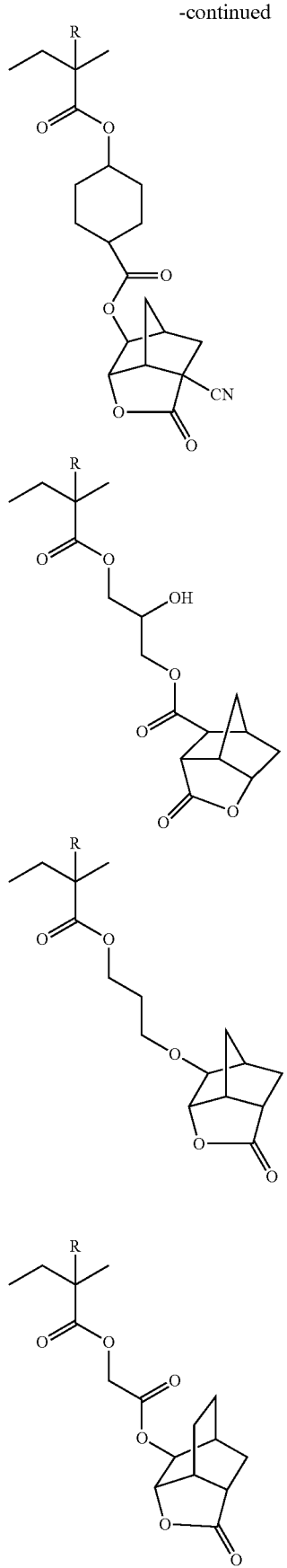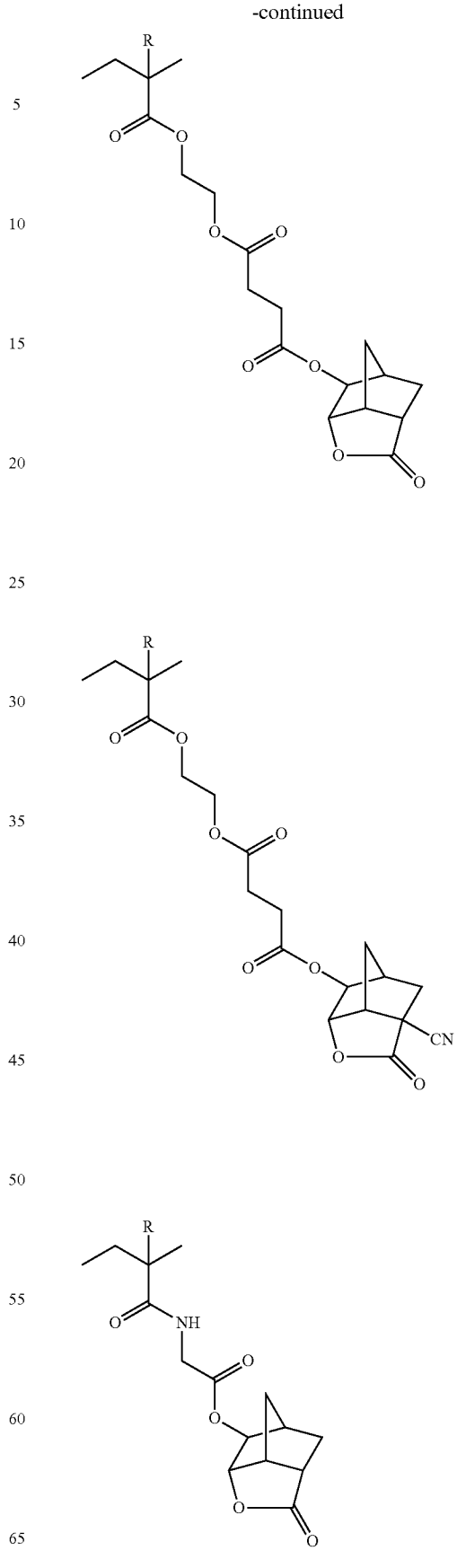

-continued

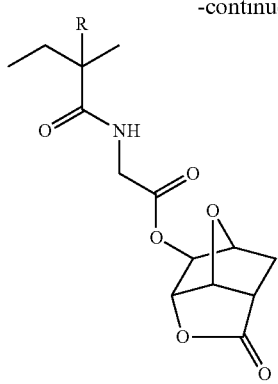

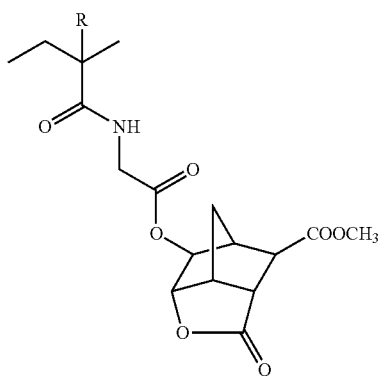

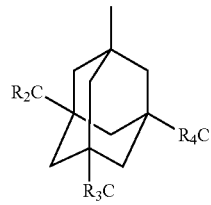
(VIIa)

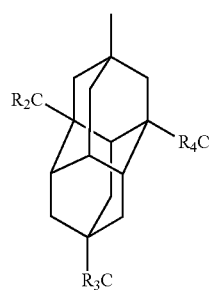
(VIIb)

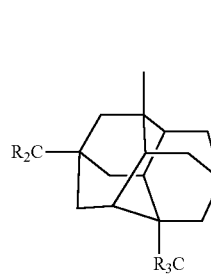
(VIIc)

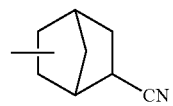
(VIId)

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

The content of the repeating unit having a lactone group is preferably from 15 to 60 mol %, more preferably from 20 to 50 mol %, still more preferably from 30 to 50 mol %, of all the repeating units in the resin (A).

The resin (A) may further contain a lactone structure-containing repeating unit (for example, a repeating unit where in formula (2), $n_2=0$) other than a lactone structure-containing repeating unit represented by formula (2), in an amount of generally 50 mol % or less, preferably 30 mol % or less, of the lactone structure-containing repeating unit represented by formula (2).

The resin (A) preferably contains a repeating unit having a hydroxyl group or a cyano group other than formulae (1) and (2). Thanks to this repeating unit, the adherence to substrate and the affinity for developer are enhanced. The repeating unit having a hydroxyl group or a cyano group is preferably a repeating unit having an alicyclic hydrocarbon structure substituted by a hydroxyl group or a cyano group, and a repeating unit not having an acid-decomposable group is preferred. The alicyclic hydrocarbon structure in the alicyclic hydrocarbon structure substituted by a hydroxyl group or a cyano group is preferably an adamantyl group, a diamantyl group or a norbornane group. The alicyclic hydrocarbon structure substituted by a hydroxyl group or a cyano group is preferably a partial structure represented by any one of the following formulae (VIIa) to (VIId):

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by any one of formulae (VIIa) to (VIId) includes repeating units represented by the following formulae (AIIa) to (AIId):

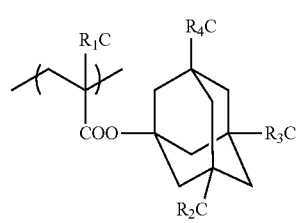
(AIIa)

-continued

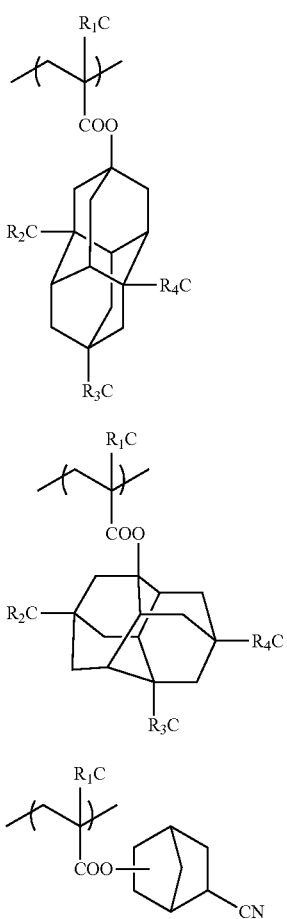

(AIIb)

(AIIc)

(AIId)

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The content of the repeating unit having a hydroxyl group or a cyano group is preferably from 5 to 40 mol %, more preferably from 5 to 30 mol %, still more preferably from 10 to 25 mol %, based on all repeating units in the resin (A).

Specific examples of the repeating unit having a hydroxyl group or a cyano group are set forth below, but the present invention is not limited thereto.

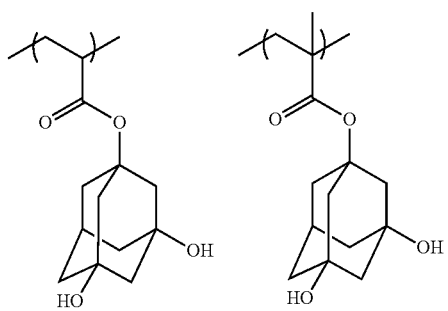

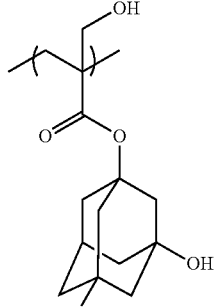

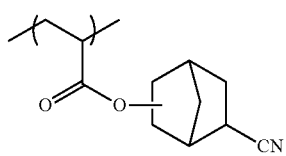

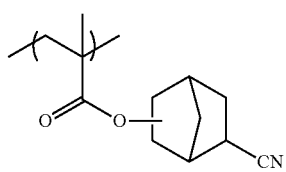

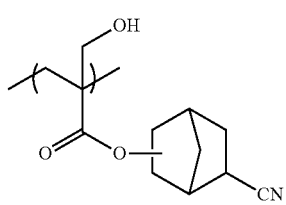

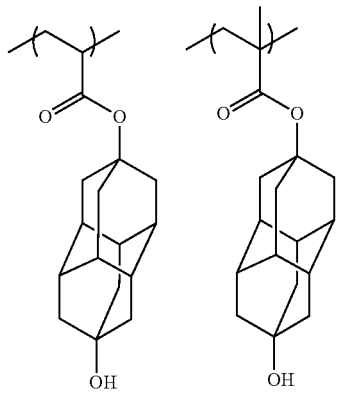

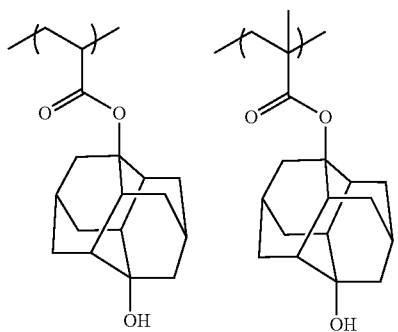

The resin (A) may contain a repeating unit having an alkali-soluble group. The alkali-soluble group includes a carboxyl group, a sulfonamide group, a sulfonylimide group, a bisulfonylimide group, and an aliphatic alcohol with the α-position being substituted by an electron-withdrawing group, such as hexafluoroisopropanol group. A repeating unit having a carboxyl group is more preferred. By virtue of containing the repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The content of the repeating unit having an alkali-soluble group is preferably from 0 to 20 mol %, more preferably from 3 to 15 mol %, still more preferably from 5 to 10 mol %, based on all repeating units in the resin (A).

Specific examples of the repeating unit having an alkali-soluble group are set forth below, but the present invention is not limited thereto.

In specific examples, Rx represents H, $CH_3$, $CH_2OH$ or $CF_3$.

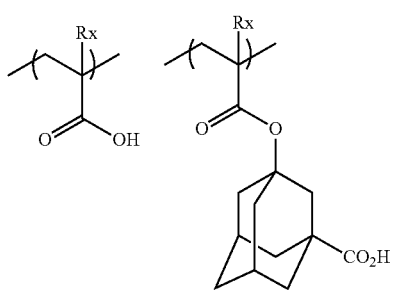

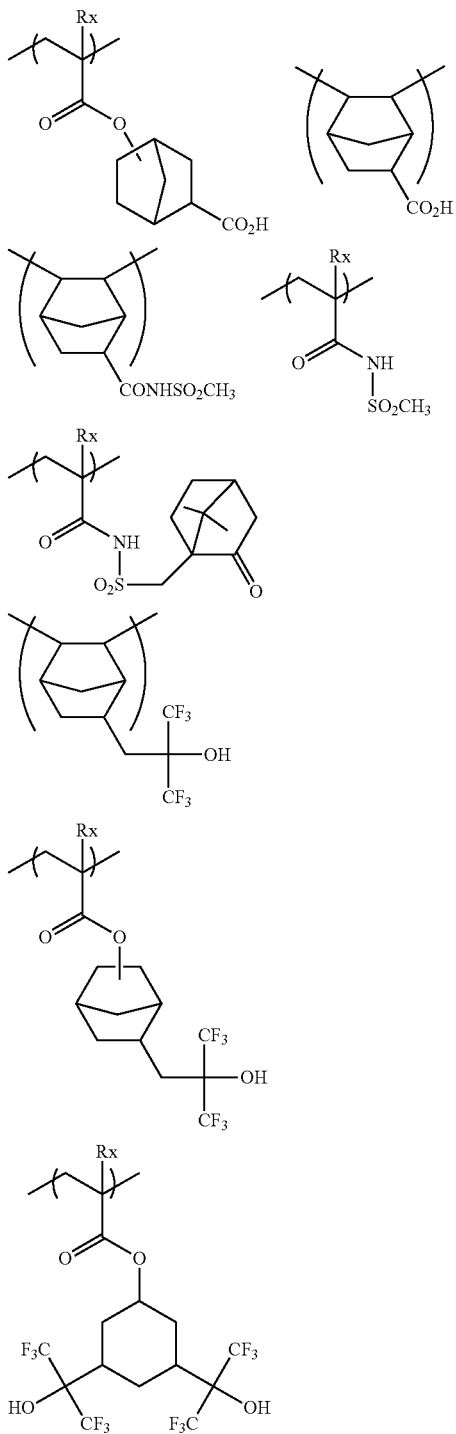

The resin (A) for use in the present invention preferably further contains a repeating unit having a polar group-free alicyclic hydrocarbon structure and not exhibiting acid decomposability. Thanks to this repeating unit, the dissolving out of low molecular components from the resist film to the immersion liquid at the immersion exposure can be reduced. This repeating unit includes a repeating unit represented by the following formula (IIIa):

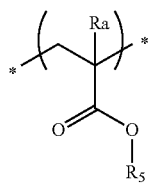

(IIIa)

In formula (IIIa), $R_5$ represents a hydrocarbon group having at least one cyclic structure and having neither a hydroxyl group nor a cyano group.

Ra represents a hydrogen atom, an alkyl group (which may be substituted by a fluorine atom) or a —$CH_2$—O—$Ra_2$ group, wherein $Ra_2$ represents a hydrogen atom, an alkyl group or an acyl group. Ra is preferably a hydrogen atom, a methyl group, a trifluoromethyl group or a hydroxymethyl group.

The cyclic structure possessed by $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring gathered hydrocarbon group and a crosslinked cyclic hydrocarbon group. Examples of the ring gathered hydrocarbon group include a bicyclohexyl group and a perhydronaphthalenyl group. Examples of the crosslinked hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$] undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by condensing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5,2,1,0$^{2,6}$]decanyl group. Of these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and examples of the substituent which the alkyl group may further have include a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4, the substituted methyl group is preferably a methoxymethyl group, a methoxythiomethyl group, a benzyloxymethyl group, a tert-butoxymethyl group or a 2-methoxyethoxymethyl group, the substituted ethyl group is preferably a 1-ethoxyethyl group or a 1-methyl-1-methoxyethyl group, the acyl group is preferably an aliphatic acyl group having a carbon number of 1 to 6, such as formyl group, acetyl group, propionyl group, butyryl group, isobutyryl group, valeryl group and pivaloyl group, and the alkoxycarbonyl group is preferably an alkoxycarbonyl group having a carbon number of 1 to 4.

The content of the repeating unit represented by formula (IIIa) having neither a hydroxyl group nor a cyano group is preferably from 0 to 40 mol %, more preferably from 0 to 20 mol %, based on all repeating units in the resin (A).

Specific examples of the repeating unit represented by formula (IIIa) are set forth below, but the present invention is not limited thereto.

In the formulae, Ra represents H, $CH_3$, $CH_2OH$ or $CF_3$.

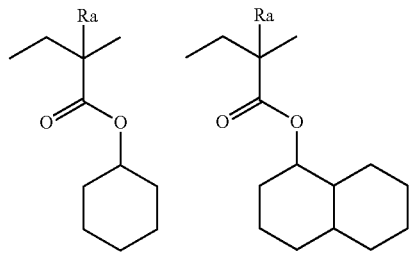

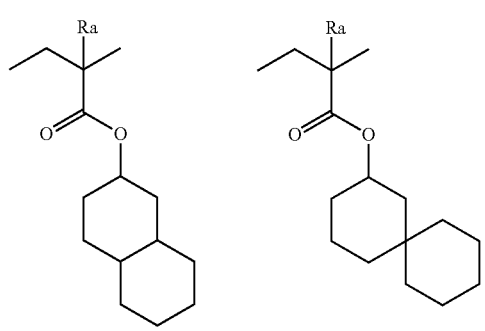

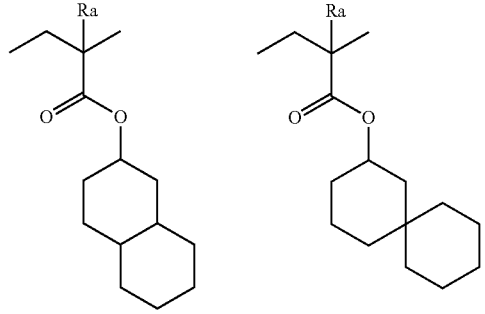

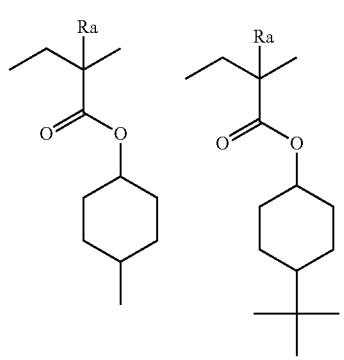

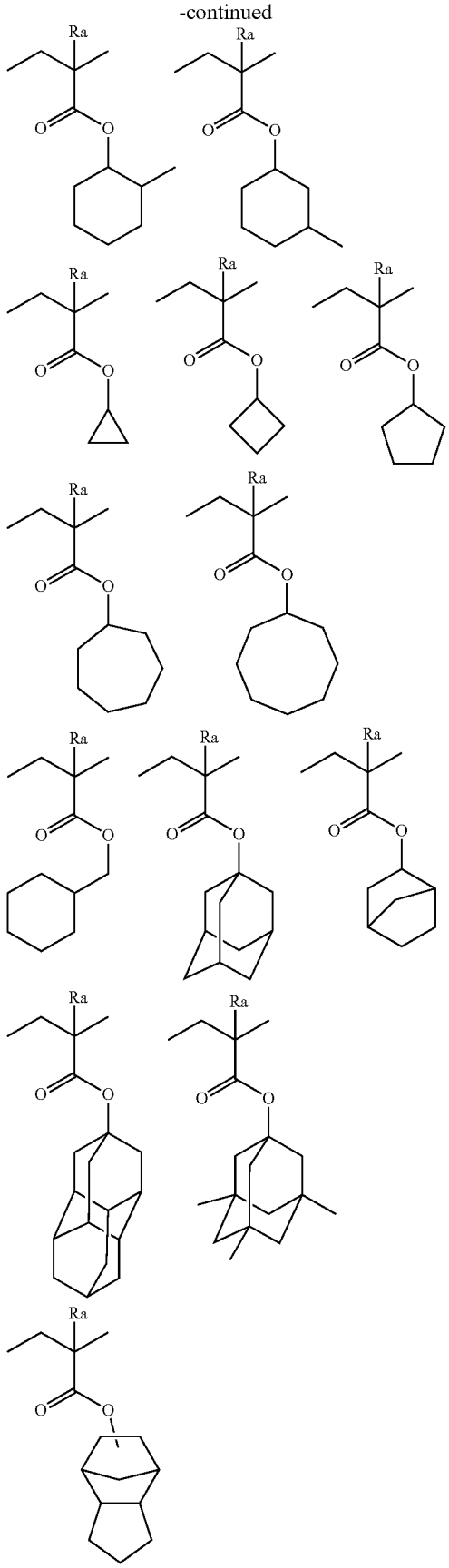

The resin (A) may contain, in addition to the above-described repeating structural units, various repeating structural units for the purpose of controlling the dry etching resistance, suitability for standard developer, adherence to substrate, resist profile and properties generally required of the resist, such as resolution, heat resistance and sensitivity.

Examples of such a repeating structural unit include, but are not limited to, repeating structural units corresponding to the monomers described below.

Thanks to such a repeating structural unit, the performance required of the resin (A), particularly,
(1) solubility in coating solvent,
(2) film-forming property (glass transition point),
(3) alkali developability,
(4) film loss (selection of hydrophilic, hydrophobic or alkali-soluble group),
(5) adherence of unexposed area to substrate,
(6) dry etching resistance
and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A), the molar ratio of respective repeating structural units contained is appropriately determined to control the dry etching resistance of resist, suitability for standard developer, adherence to substrate, resist profile and performances generally required of the resist, such as resolution, heat resistance and sensitivity.

In the case where the positive photosensitive composition of the present invention is used for ArF exposure, the resin (A) for use in the positive photosensitive composition of the present invention preferably has no aromatic group in view of transparency to ArF light.

Also, the resin (A) preferably contains no fluorine atom and no silicon atom in view of compatibility with a hydrophobic resin (HR) described later.

The resin (A) is preferably a resin where all repeating units are composed of a (meth)acrylate-based repeating unit. In this case, all repeating units may be a methacrylate-based repeating unit, all repeating units may be an acrylate-based repeating unit, or all repeating unit may be composed of a methacrylate-based repeating unit and an acrylate-based repeating unit, but the content of the acrylate-based repeating unit is preferably 50 mol % or less based on all repeating units. A copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted by a hydroxyl group or a cyano group, and from 0 to 20 mol % of other (meth)acrylate-based repeating units is also preferred.

In the case where the positive photosensitive composition for use in the present invention is irradiated with KrF excimer laser light, electron beam, X-ray or high-energy beam at a wavelength of 50 nm or less (e.g., EUV), the resin (A) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as tertiary alkyl(meth)acrylate.

Preferred examples of the hydroxystyrene-based repeating unit having an acid-decomposable group include a repeating unit composed of a tert-butoxycarbonyloxystyrene, a 1-alkoxyethoxystyrene or a tertiary alkyl(meth)acrylate. A repeating unit composed of a 2-alkyl-2-adamantyl(meth)acrylate or a dialkyl(1-adamantyl)methyl(meth)acrylate is more preferred.

The resin (A) for use in the present invention can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive photosensitive composition for use in the present invention. By the use of this solvent, production of particles during storage can be suppressed.

The polymerization reaction is preferably performed in an inert gas atmosphere such as nitrogen or argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is recovered, for example, by a powder or solid recovery method. The reaction concentration is from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio.)

The weight average molecular weight of the resin (A) for use in the present invention is preferably from 1,000 to 200,000, more preferably from 2,000 to 20,000, still more preferably from 3,000 to 15,000, yet still more preferably from 3,000 to 10,000, in terms of polystyrene by the GPC method. When the weight average molecular weight is from 1,000 to 200,000, the heat resistance; dry etching resistance and developability can be prevented from deterioration and also, the film-forming property can be prevented from deteriorating due to rise of the viscosity.

The polydispersity (molecular weight distribution) is usually from 1 to 3, preferably from 1 to 2.6, more preferably from 1 to 2, still more preferably from 1.4 to 2.0. As the molecular weight distribution is smaller, the resolution and resist profile are more excellent, the side wall of the resist pattern is smoother, and the property in terms of roughness is more improved.

The amount of the resin (A) blended in the entire positive photosensitive composition is preferably from 50 to 99.9 mass %, more preferably from 60 to 99.0 mass %, based on the entire solid content.

As regards the resin (A) for use in the present invention, one kind may be used or a plurality of kinds may be used in combination.

Incidentally, a resin other than the resin (A) of the present invention may be used in combination within the range not impairing the effects of the present invention. Examples of the resin other than the resin (A) of the present invention include an acid-decomposable resin which may contain either a repeating unit represented by formula (1) or a repeating unit represented by formula (2) and may contain other repeating units that can be contained in the resin (A), and other known acid-decomposable resins.

(B) Compound Capable of Generating an Acid Upon Irradiation with an Actinic Ray or Radiation The positive photosensitive composition for use in the present invention contains a compound capable of generating an acid upon irradiation with an actinic ray or radiation (hereinafter sometimes referred to as an "acid generator").

The acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, and a mixture thereof.

Examples of such an acid generator include a diazonium salt, a phosphonium salt, a sulfonium salt, an iodonium salt, imidosulfonate, oxime sulfonate, diazodisulfone, disulfone and o-nitrobenzyl sulfonate.

Also, a compound where a group or compound capable of generating an acid upon irradiation with an actinic ray or radiation is introduced into the main or side chain of a polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the acid generators, compounds represented by the following formulae (ZI), (ZII) and (ZIII) are preferred.

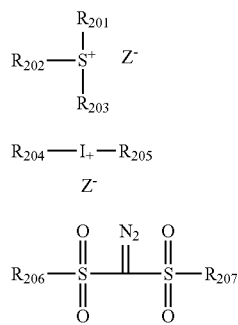

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene). $Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction and this anion can suppress the decomposition with aging due to intramolecular nucleophilic reaction. Thanks to this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

Each of the alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as those in the aliphatic sulfonate anion.

Examples of the aromatic group in the aromatic carboxylate anion include the same aryl group as those in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Each of the alkyl group, cycloalkyl group, aryl group and aralkyl group in the aliphatic carboxylate anion, aromatic carboxylate anion and aralkylcarboxylate anion may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as those in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a fluorine atom-containing group, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

Each of the aryl group, alkyl group and cycloalkyl group of $R_{201}$ to $R_{203}$ may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

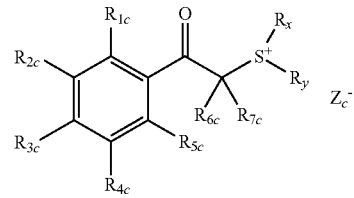

(ZI-3)

In formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine with each other to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

Each of $R_x$ and $R_y$ is preferably an alkyl or cycloalkyl group having a carbon number of 4 or more, more preferably 6 or more, still more preferably 8 or more.

In formulae (ZII) and (ZII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

Each of the aryl group, alkyl group and cycloalkyl group of $R_{204}$ to $R_{207}$ may have a substituent, Examples of the substituent which the aryl group, alkyl group and cycloalkyl group of $R_{204}$ to $R_{207}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

(ZIV)

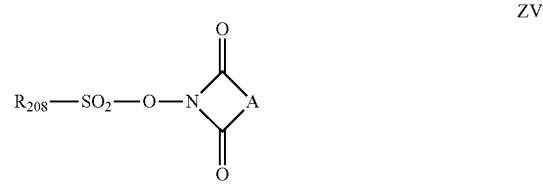
(ZV)

(ZVI)

In formulae (ZIV) to (ZVI), each of $Ar_3$ and $Ar_4$ independently represents an aryl group. Each of $R_{208}$, $R_{209}$ and $R_{210}$ independently represents an alkyl group, a cycloalkyl group or an aryl group.

A represents an alkylene group, an alkenylene group or an arylene group.

Among the acid generators, more preferred are the compounds represented by formulae (ZI) to (ZIII).

The acid generator is preferably a compound that generates an acid having one sulfonic acid group or imide group, more preferably a compound that generates a monovalent perfluoroalkanesulfonic acid, a compound that generates a monovalent aromatic sulfonic acid substituted by a fluorine atom or a fluorine atom-containing group, or a compound that generates a monovalent imide acid substituted by a fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, it is preferred that the acid generated from the acid generator which can be used is a fluoro-substituted alkanesulfonic acid, fluoro-substituted benzenesulfonic acid or fluoro-substituted imide acid having a pKa of −1 or less, and in this case, the sensitivity can be enhanced.

Out of the acid generators, particularly preferred examples are set forth below.

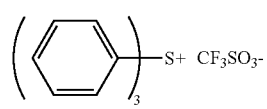
(z1)

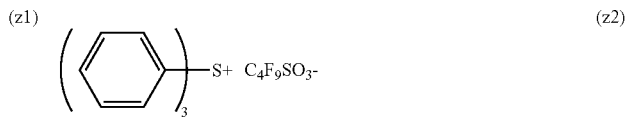
(z2)

-continued
(z3) 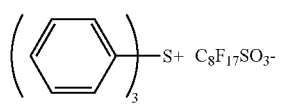
(z4) 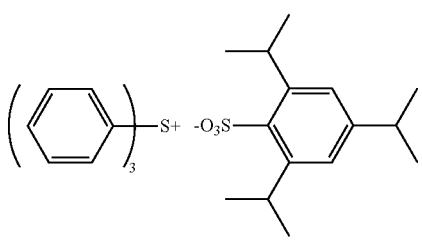
(z5) 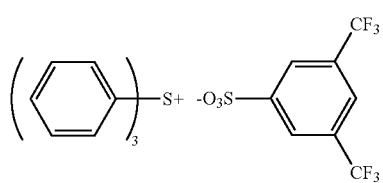
(z6) 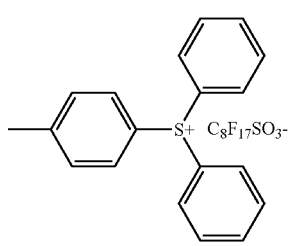
(z7) 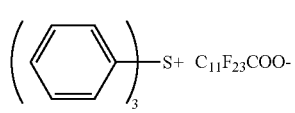
(z8) 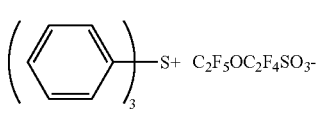
(z9) 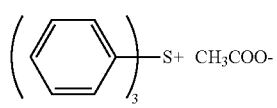
(z10) 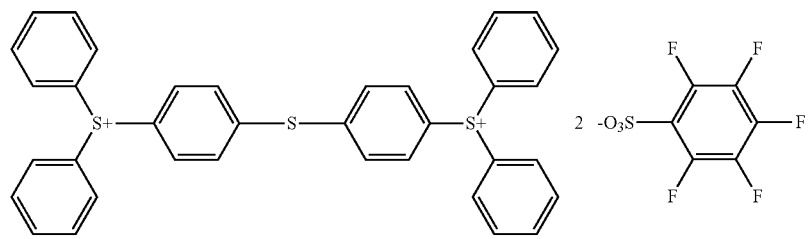
(z11) 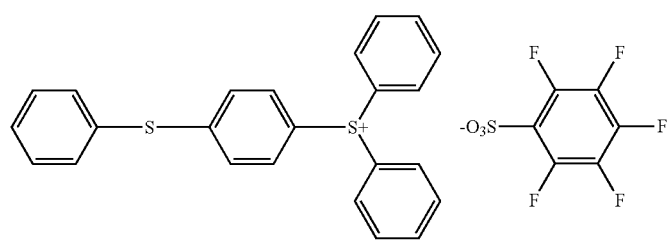
(z12) 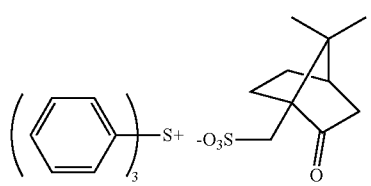
(z13) 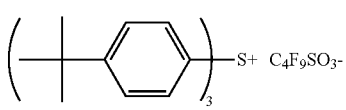
(z14) 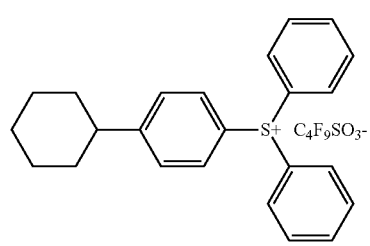
(z15) 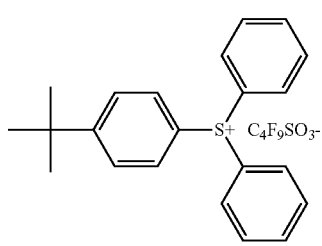

-continued
(z16) 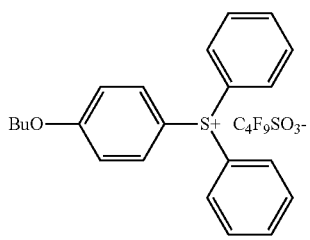
(z17) 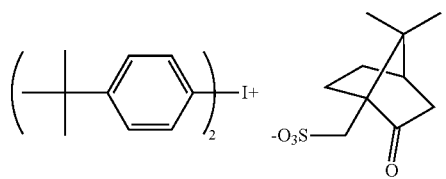
(z18) 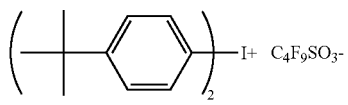
(z19) 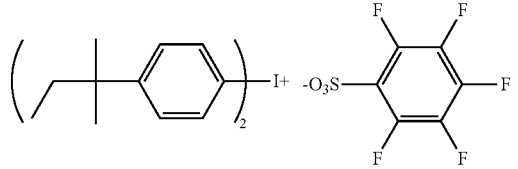
(z20) 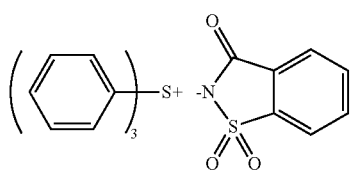
(z21) 
(z22) 
(z23) 
(z24) 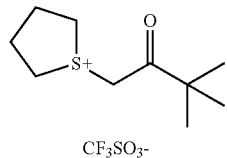
(z25) 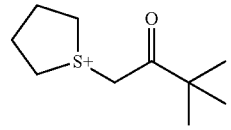
(z26) 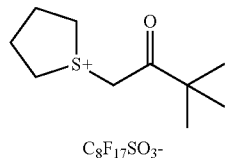
(z27) 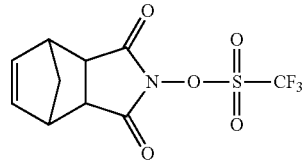
(z28) 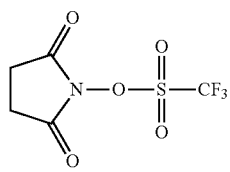
(z29) 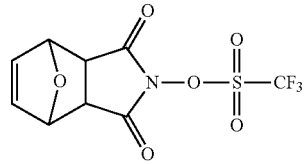
(z30) 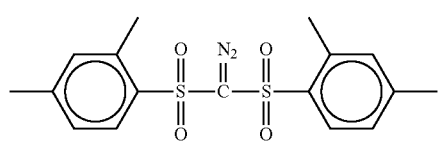
(z31) 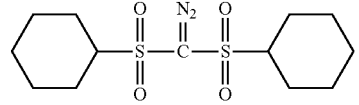
(z32) 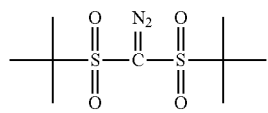
(z33) 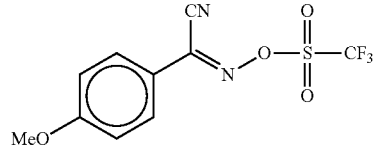

(z34)
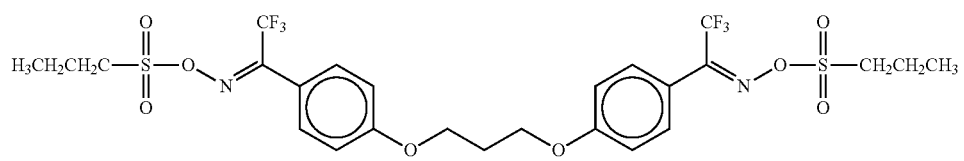
(z35)
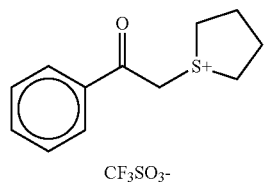
CF₃SO₃-
(z36)
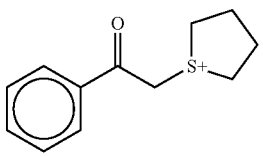
C₄F₉SO₃-
(z37)
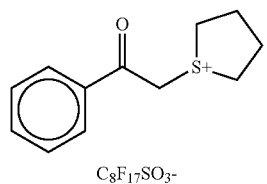
C₈F₁₇SO₃-
(z38)
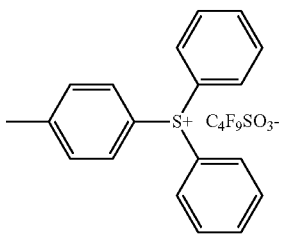
(z39)
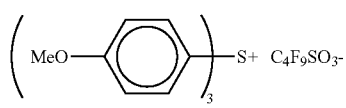
(z40)
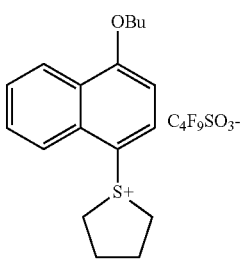
(z41)
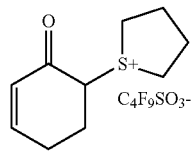
(z42)
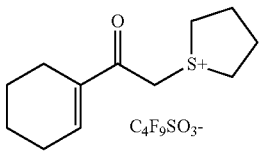
(z43)
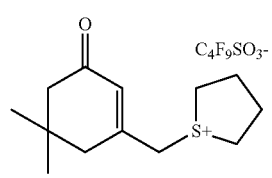
(z44)
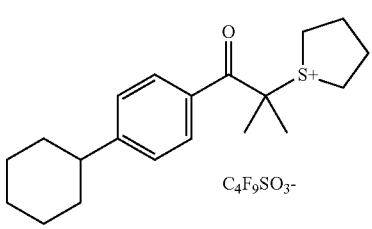
(z45)
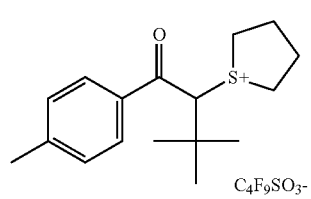
(z46)
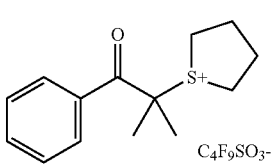

-continued
| | |
|---|---|
| (z47) 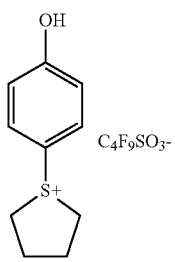 | (z48) 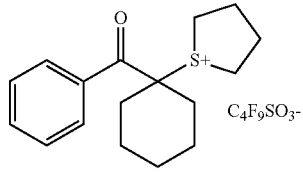 |
| (z49) 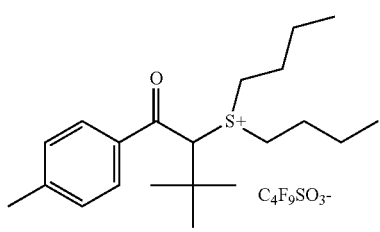 | (z50) 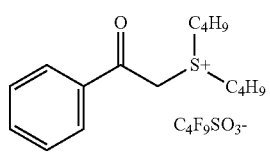 |
| (z51) 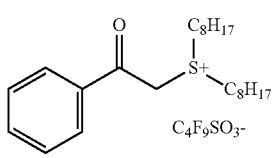 | (z52) 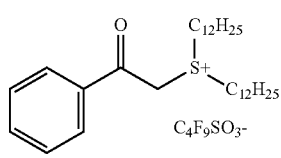 |
| (z53) 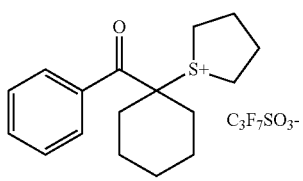 | (z54) 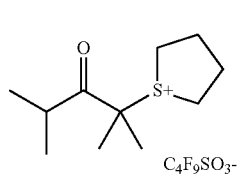 |
| (z55) 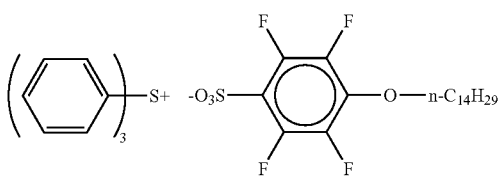 | |
| (z56) 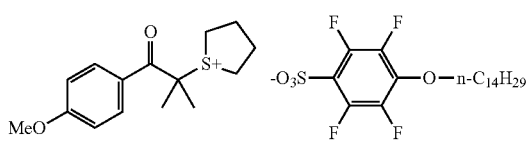 | (z57) 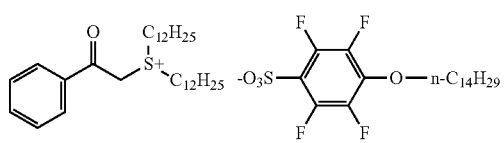 |
| (z58) 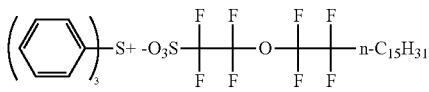 | (z59) 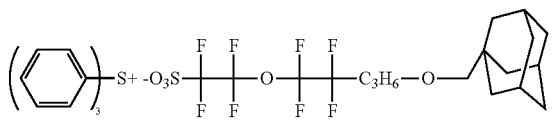 |
| (z60) 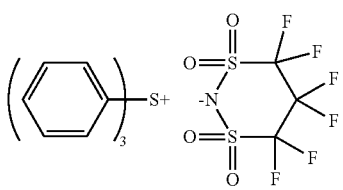 | (z61) 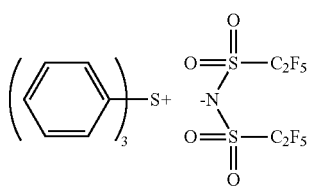 |

-continued
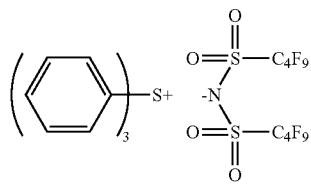 (z62)
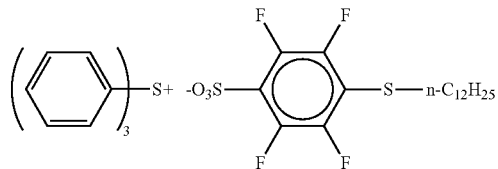 (z63)
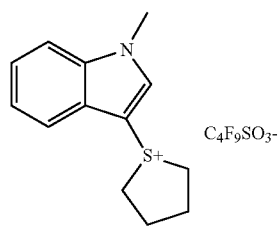 (z64)
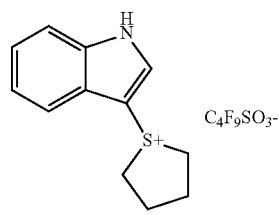 (z65)
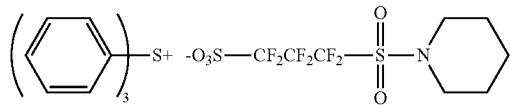 (z66)
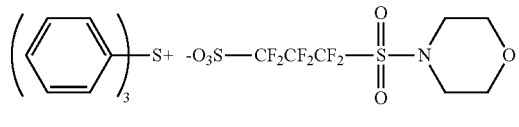 (z67)
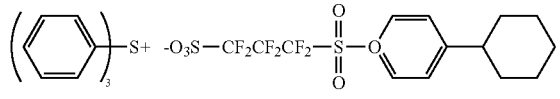 (z68)
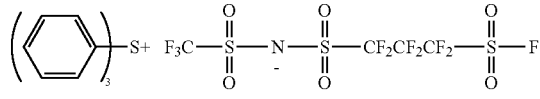 (z69)
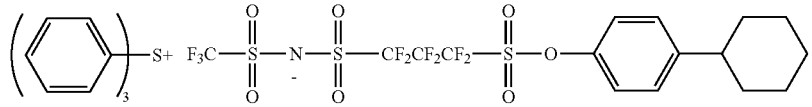 (z70)
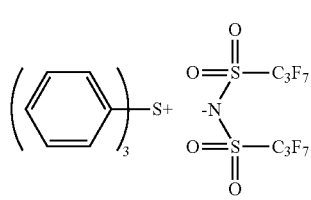 (z71)
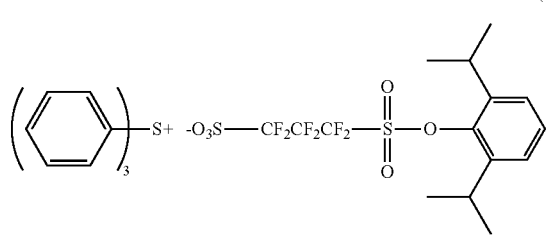 (z72)
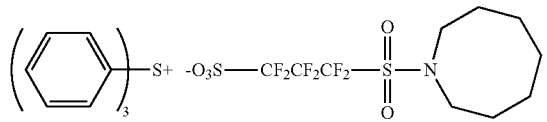 (z73)
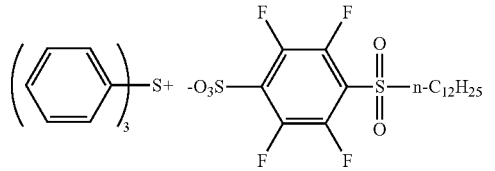 (z74)
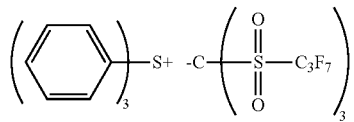 (z75)
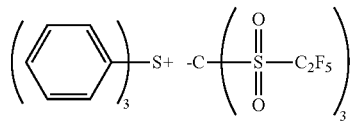 (z76)
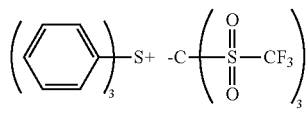 (z77)
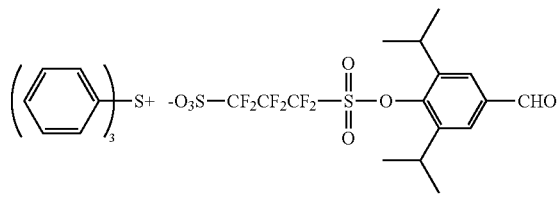 (z78)

-continued
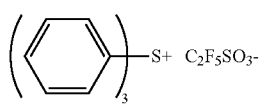 (z79)
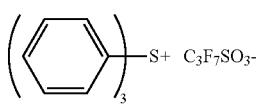 (z80)
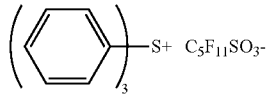 (z81)
(z82)
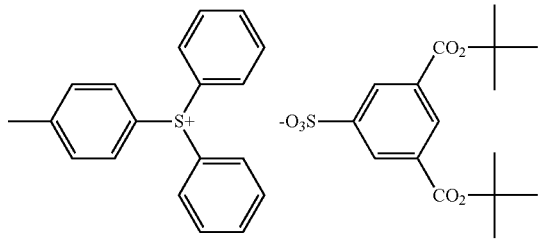
(z83)
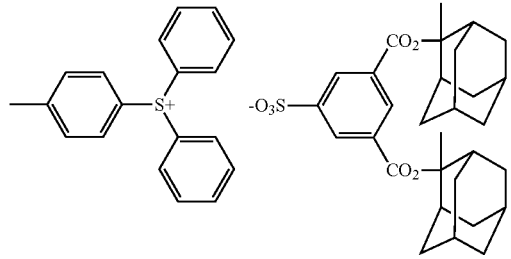
(z84)
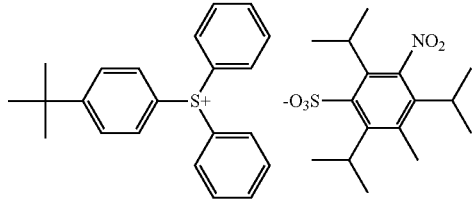
(z85)
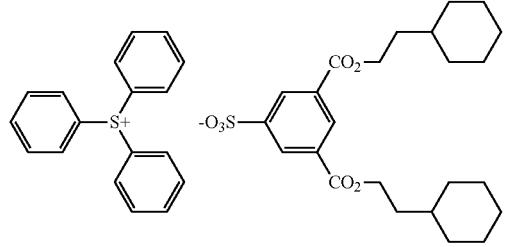
(z86)
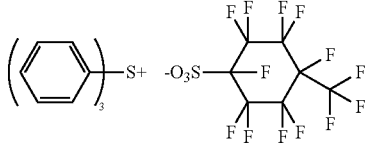
(z87)
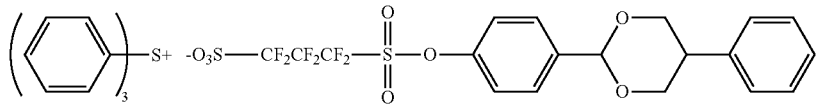
(z88)
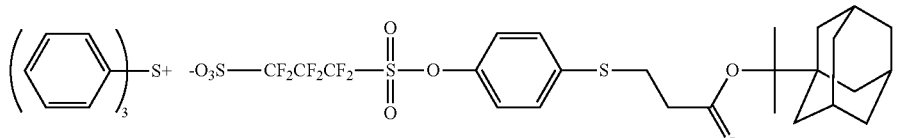
(z89)
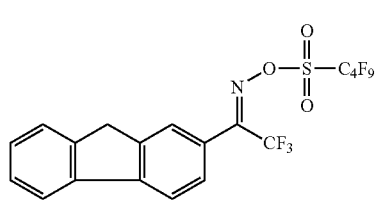
(z90)
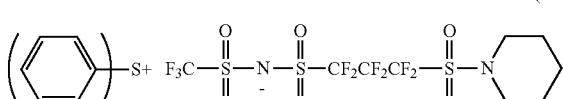
(z91)
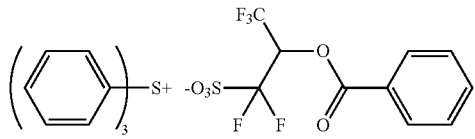
In the positive photosensitive composition for use in the present invention, a compound capable of generating an acid corresponding to the anion moiety in the following formula (Y) can be used as an acid generator.

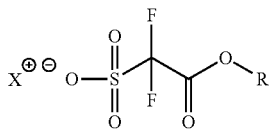 (Y)

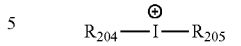 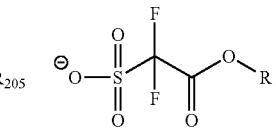 $Z_{IC1}$

In the formula above, X⁺ represents an organic counter ion.

R represents a hydrogen atom or an organic group and is preferably an organic group having a carbon number of 1 to 40, more preferably an organic group having a carbon number of 3 to 20, and most preferably an organic group represented by the following formula (YI).

The organic group of R is sufficient if it has one or more carbon atoms. The organic group is preferably an organic group where the atom bonded to the oxygen atom in the ester bond shown in formula (Y) is a carbon atom, and examples thereof include an alkyl group, a cycloalkyl group, an aryl group, an aralkyl group and a group having a lactone structure. The organic group may contain a heteroatom such as oxygen atom and sulfur atom in the chain. Also, one of these groups may have another as a substituent, or the organic group may have a substituent such as hydroxyl group, acyl group, acyloxy group, oxy group (=O) or halogen atom.

 (Y I)

In formula (YI), Rc represents a monocyclic or polycyclic organic group having a carbon number of 3 to 30, which may contain a cyclic ether, cyclic thioether, cyclic ketone, cyclic carbonate, lactone or lactam structure; Y represents a hydroxyl group, a halogen atom, a cyano group, a carboxyl group, a hydrocarbon group having a carbon number of 1 to 10, a hydroxyalkyl group having a carbon number of 1 to 10, an alkoxy group having a carbon number of 1 to 10, an acyl group having a carbon number of 1 to 10, an alkoxycarbonyl group having a carbon number of 2 to 10, an acyloxy group having a carbon number of 2 to 10, an alkoxyalkyl group having a carbon number of 2 to 10, or an alkyl halide group having a carbon number of 1 to 8; m=from 0 to 6; when a plurality of Y's are present, these may be the same or different; and n=from 0 to 10.

The total number of carbon atoms constituting the R group represented by formula (YI) is preferably 40 or less.

It is preferred that n=from 0 to 3 and Rc is a monocyclic or polycyclic organic group having a carbon number of 7 to 16.

The molecular weight of the compound represented by formula (Y) is generally from 300 to 1,000, preferably from 400 to 800, more preferably from 500 to 700.

Examples of the organic counter ion of X⁺ include sulfonium cation and iodonium cation.

The preferred embodiment of the compound represented by formula (Y) includes a compound represented by formula ($Z_{SC1}$) or ($Z_{IC1}$).

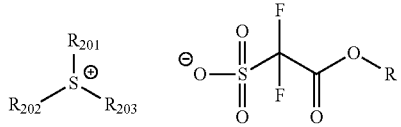 $Z_{SC1}$

In formula ($Z_{SC1}$), the definition and preferred range of R are the same as those defined in formula (Y).

Each of $R_{201}$, $R_{202}$ and $R_{203}$ independently represents an organic group. The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

Examples of the organic group as $R_{201}$, $R_{202}$ and $R_{203}$ include corresponding groups in the compounds ($Z_{SC1}$-1), ($Z_{SC1}$-2) and ($Z_{SC1}$-3) which are described later.

The compound may be a compound having a plurality of structures represented by formula ($Z_{SC1}$). For example, the compound may be a compound having a structure where at least one of $R_{201}$ to $R_{203}$ in the compound represented by formula ($Z_{SC1}$) is bonded to at least one of $R_{201}$ to $R_{203}$ in another compound represented by formula ($Z_{SC1}$).

The component ($Z_{SC1}$) is more preferably a compound ($Z_{SC1}$-1), ($Z_{SC1}$-2) or ($Z_{SC1}$-3) described below.

The compound ($Z_{SC1}$-1) is an arylsulfonium compound where at least one of $R_{201}$ to $R_{203}$ in formula ($Z_{SC1}$) is an aryl group, that is, a compound having arylsulfonium as the cation.

The definition and preferred range of R are the same as those defined in formula (Y).

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene). In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

Each of the aryl group, alkyl group and cycloalkyl group of $R_{201}$ to $R_{203}$ may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound ($Z_{SC1}$-2) is described below.

The definition and preferred range of R are the same as those defined in formula (Y).

The compound ($Z_{SC1}$-2) is a compound where each of $R_{201}$ to $R_{203}$ in formula ($Z_{SC1}$) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, an alkoxy group having a carbon number of 1 to 5), a hydroxyl group, a cyano group or a nitro group.

The compound ($Z_{SC1}$-3) is a compound represented by the following formula ($Z_{SC1}$-3), and this is a compound having a phenacylsulfonium salt structure.

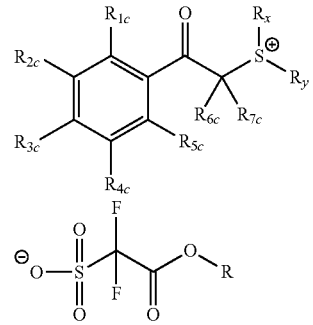

In formula ($Z_{SC1}$-3), the definition and preferred range of R are the same as those defined in formula (Y).

Each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$ or a pair of $R_x$ and $R_y$ may combine together to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

Each of $R_x$ and $R_y$ is preferably an alkyl or cycloalkyl group having a carbon number of 4 or more, more preferably 6 or more, still more preferably 8 or more.

In formula ($Z_{IC1}$), the definition and preferred range of R are the same as those defined in formula (Y).

Each of $R_{204}$ and $R_{205}$ independently represents an aryl group, an alkyl group or a cycloalkyl group.

The aryl group of $R_{204}$ and $R_{205}$ is preferably a phenyl group or a naphthyl group, more preferably a phenyl group. The aryl group of $R_{204}$ and $R_{205}$ may be an aryl group having a heterocyclic structure containing an oxygen atom, a nitrogen atom, a sulfur atom or the like. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran) and a benzothiophene residue (a group formed by removing one hydrogen atom from a benzothiophene).

The alkyl group and cycloalkyl group in $R_{204}$ and $R_{205}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

Each of the aryl group, alkyl group and cycloalkyl group of $R_{204}$ and $R_{205}$ may have a substituent. Examples of the substituent which the aryl group, alkyl group and cycloalkyl group of $R_{204}$ and $R_{205}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

Specific examples of the compound represented by formula (Y) include, but are not limited to, the compounds set forth below.

(Y-1)

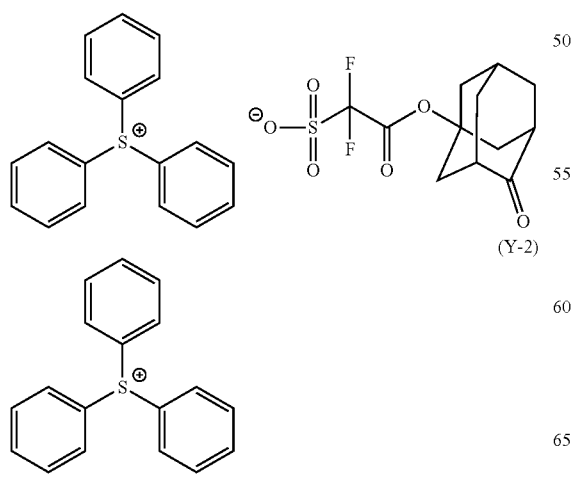

(Y-2)

-continued

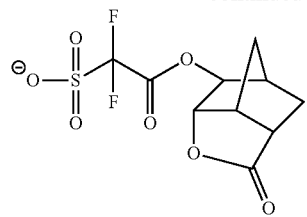

(Y-3)

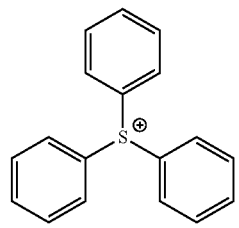

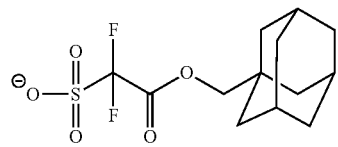

(Y-4)

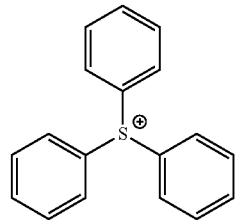

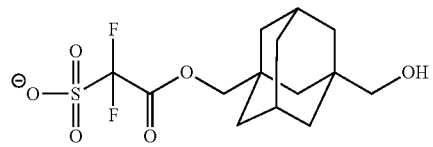

(Y-5)

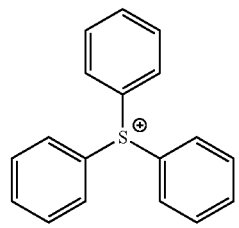 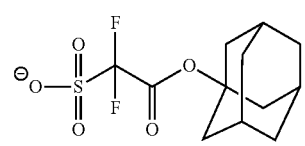

(Y-6)

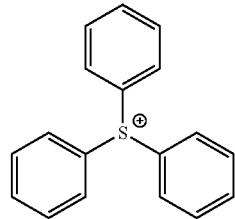

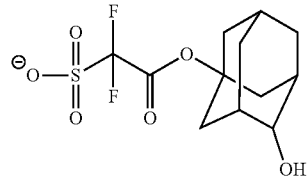

(Y-7)
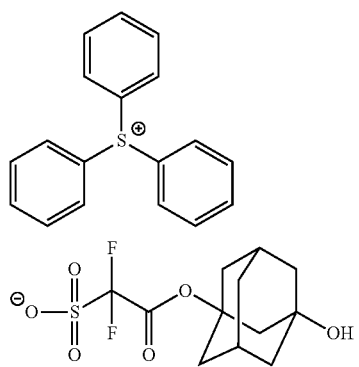
(Y-8)
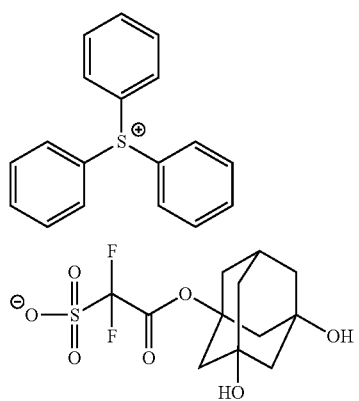
(Y-9)
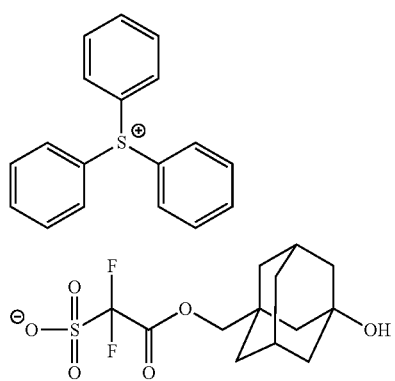
(Y-10)
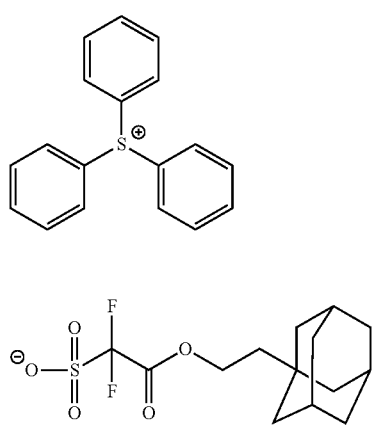
(Y-11)
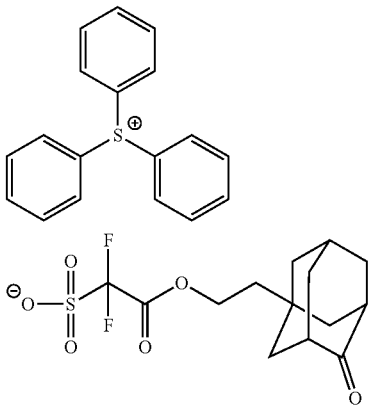
(Y-12)
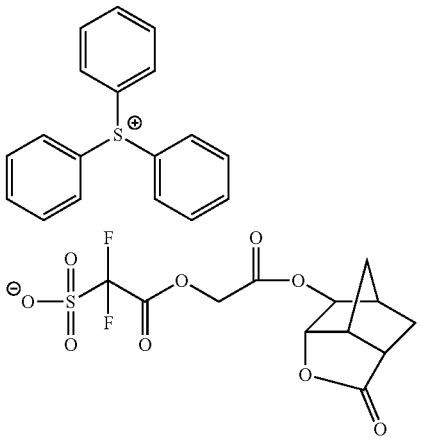
(Y-13)
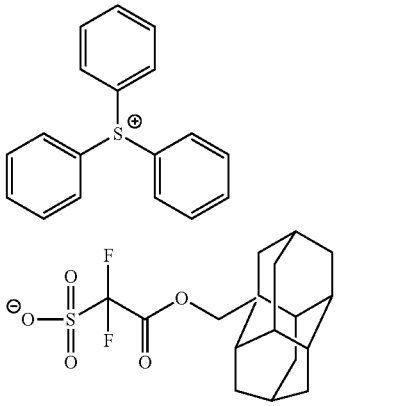
(Y-14)
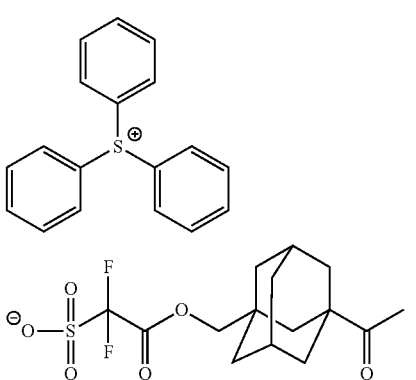

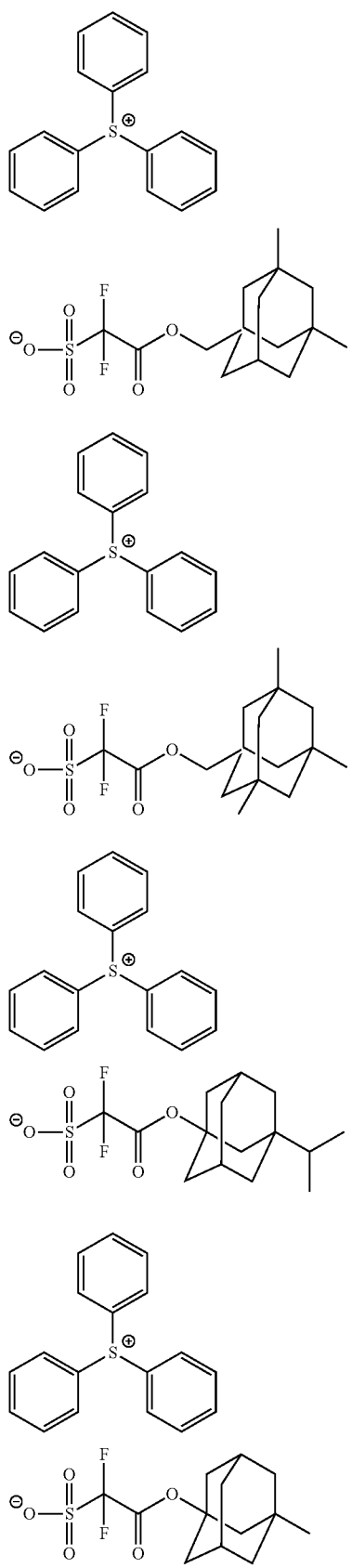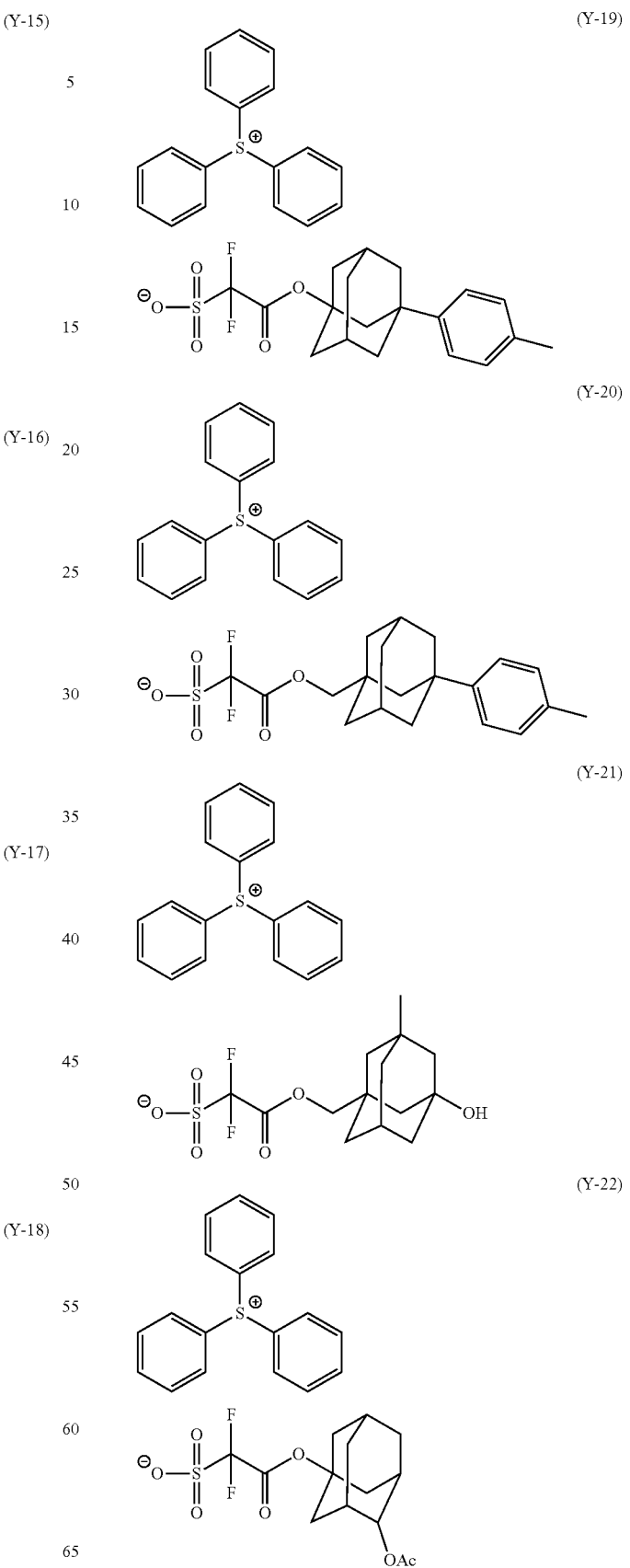

(Y-23) 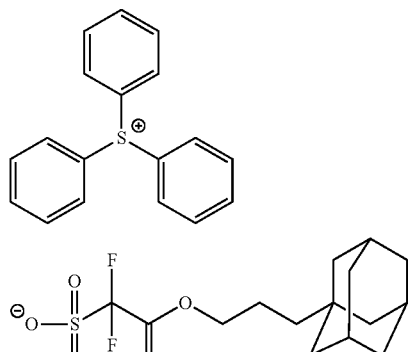
(Y-24) 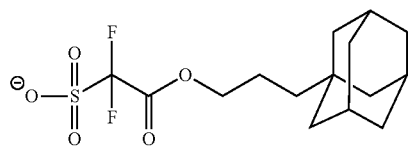
(Y-25) 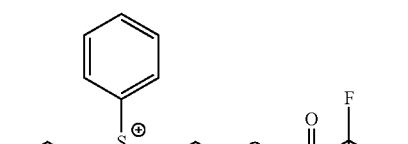
(Y-26) 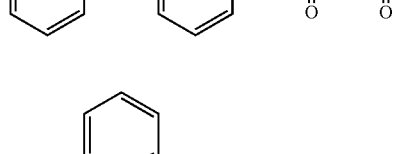
(Y-27) 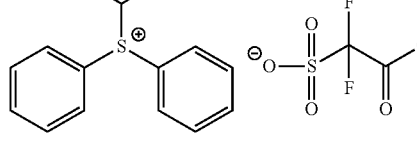
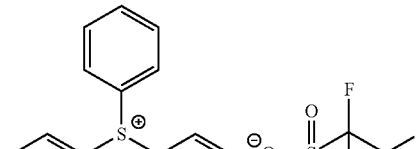
(Y-28) 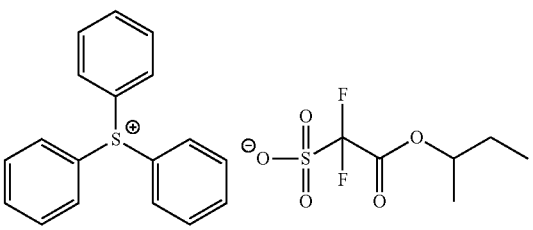
(Y-29) 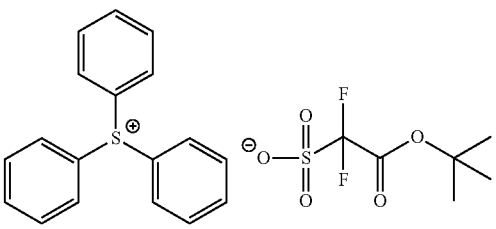
(Y-30) 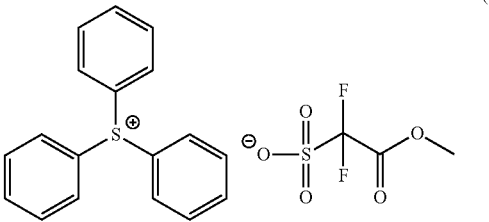
(Y-31) 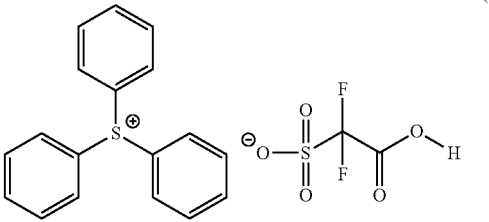
(Y-32) 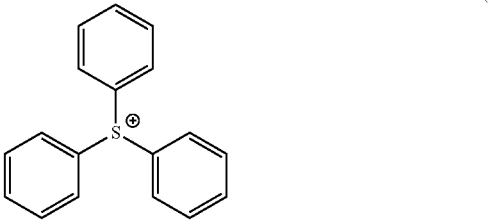
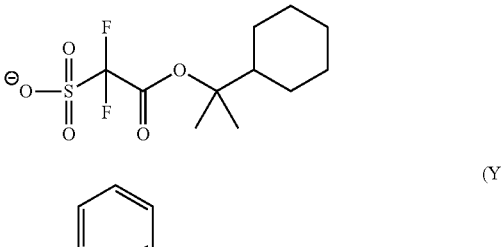
(Y-33) 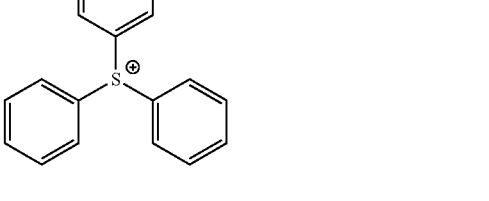

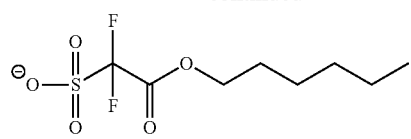
(Y-34)
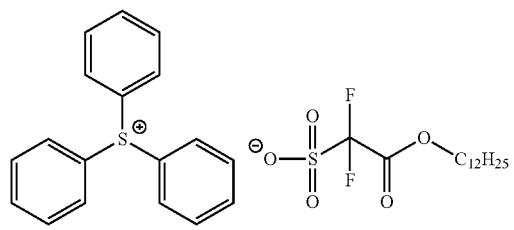
(Y-35)
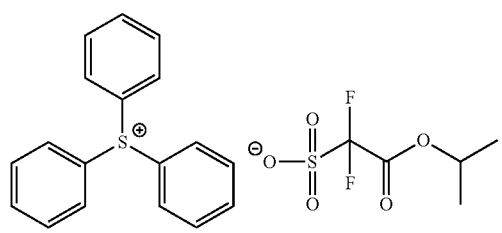
(Y-36)
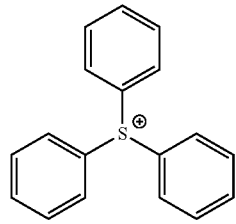
(Y-37)
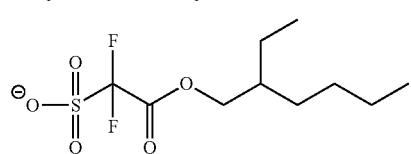
(Y-38)
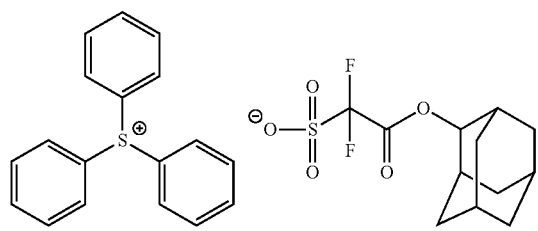
(Y-39)
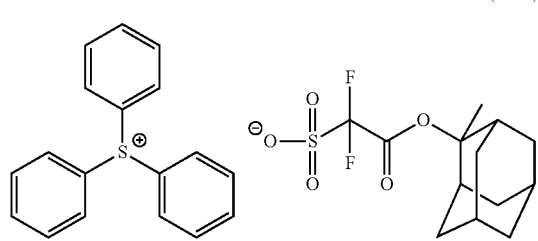
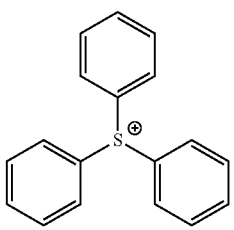 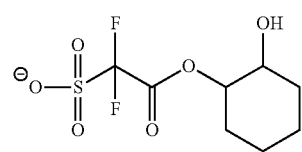
(Y-40)
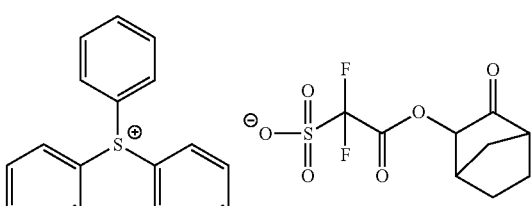
(Y-41)
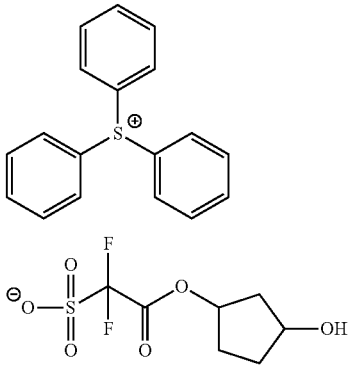
(Y-42)
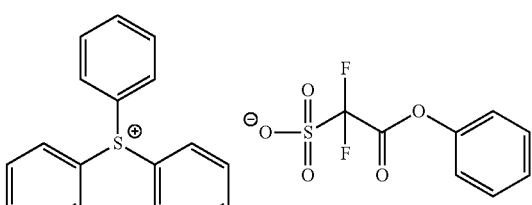
(Y-43)
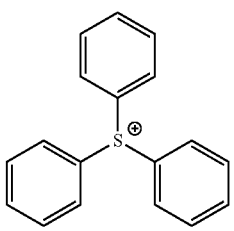
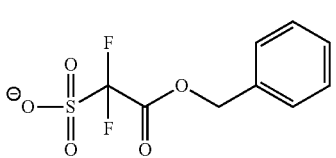

(Y-44)
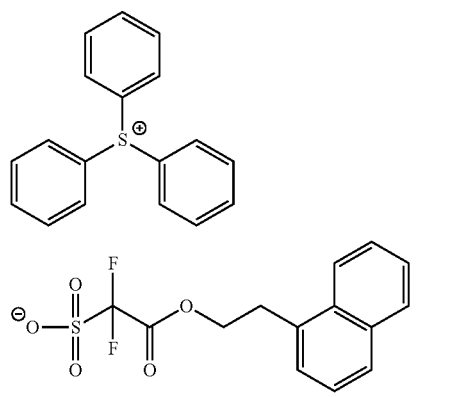
(Y-45)
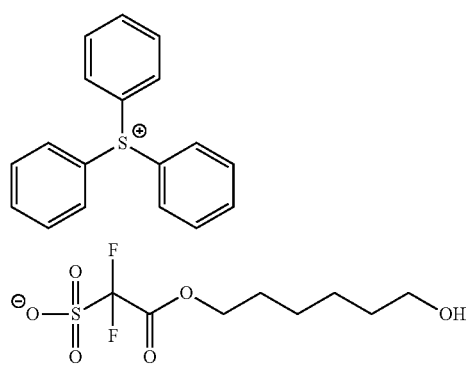
(Y-46)
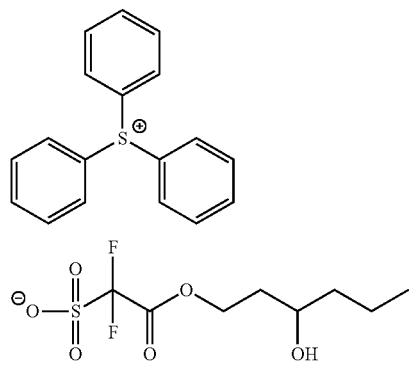
(Y-47)
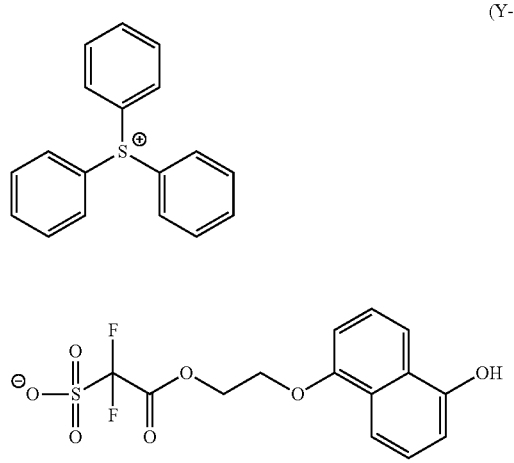
(Y-48)
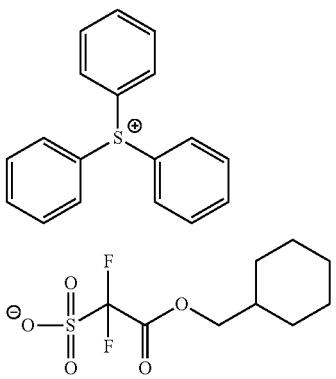
(Y-49)
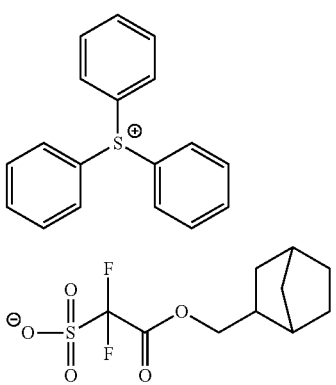
(Y-50)
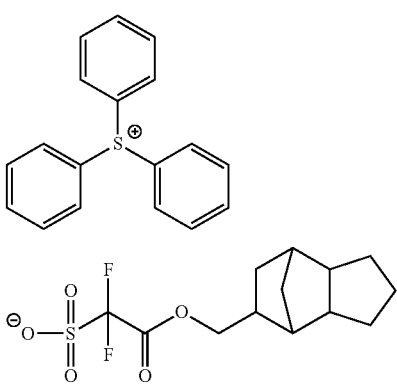
(Y-51)
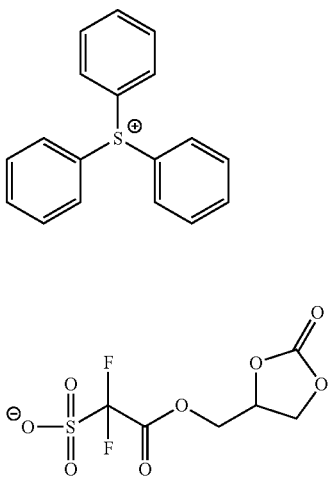

(Y-52)
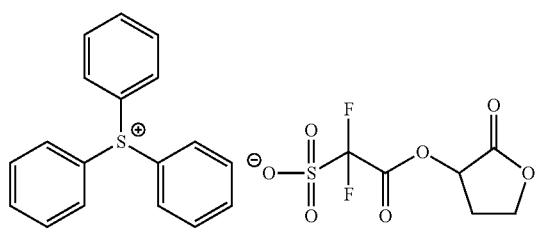
(Y-53)
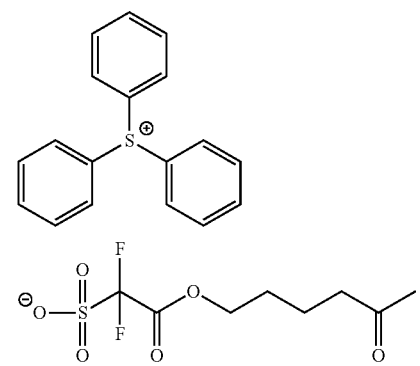
(Y-54)
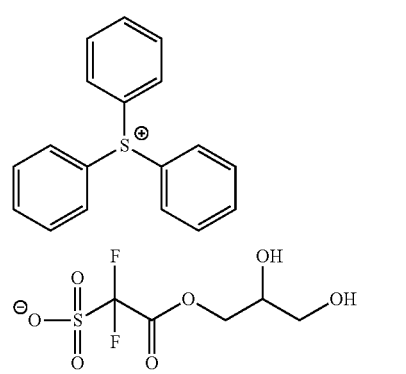
(Y-55)
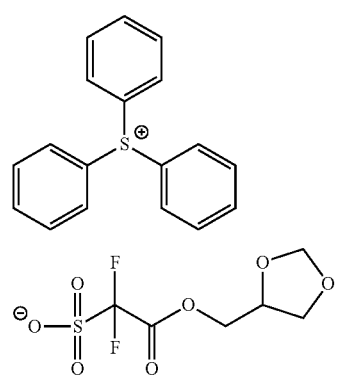
(Y-56)
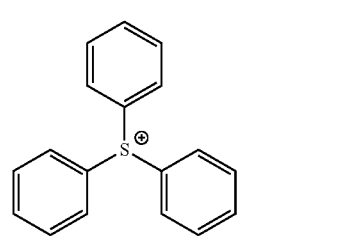
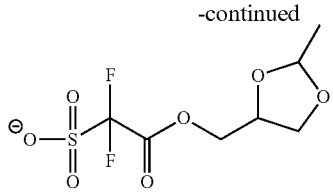
(Y-57)
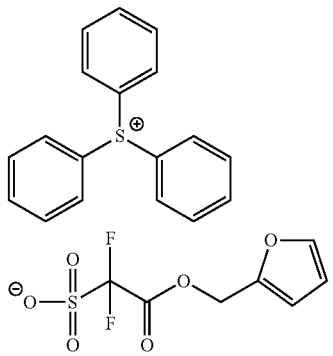
(Y-58)
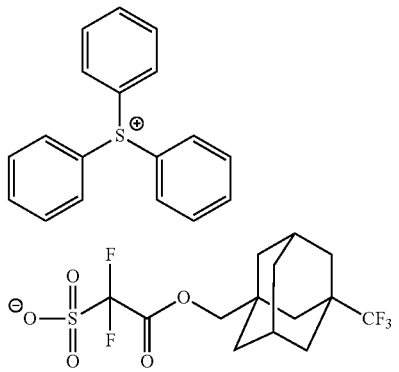
(Y-59)
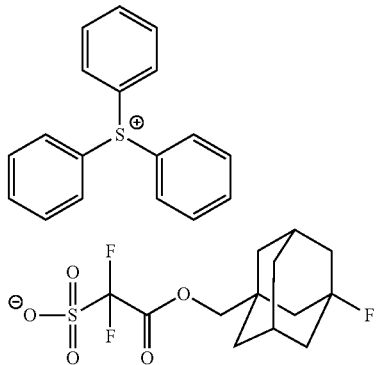
(Y-60)

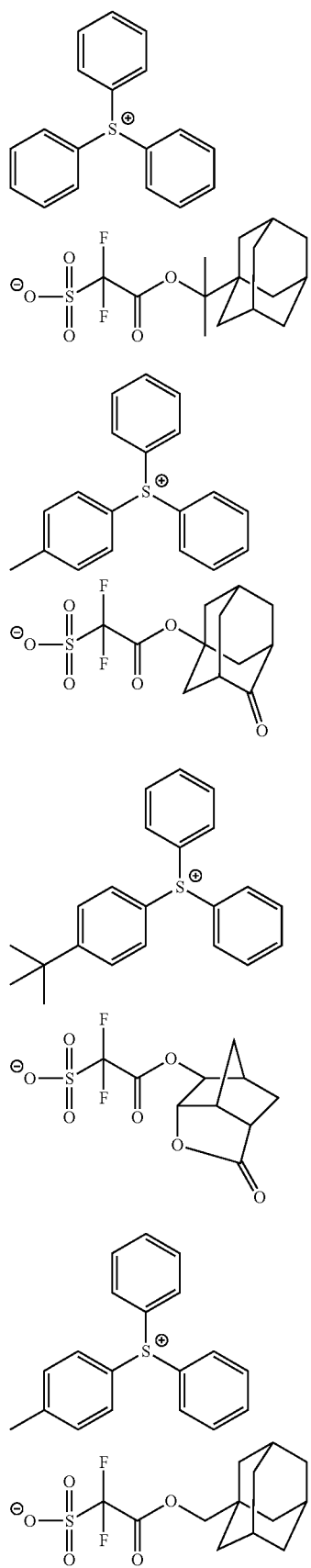
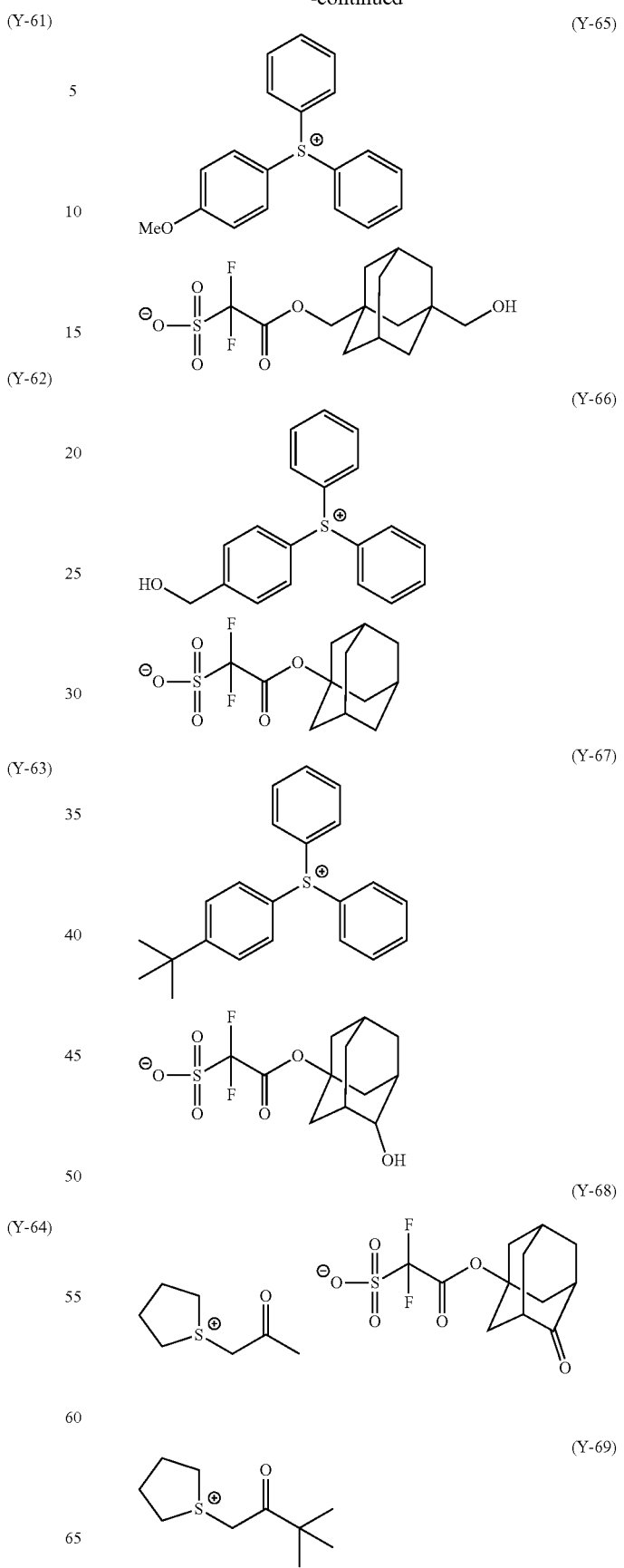

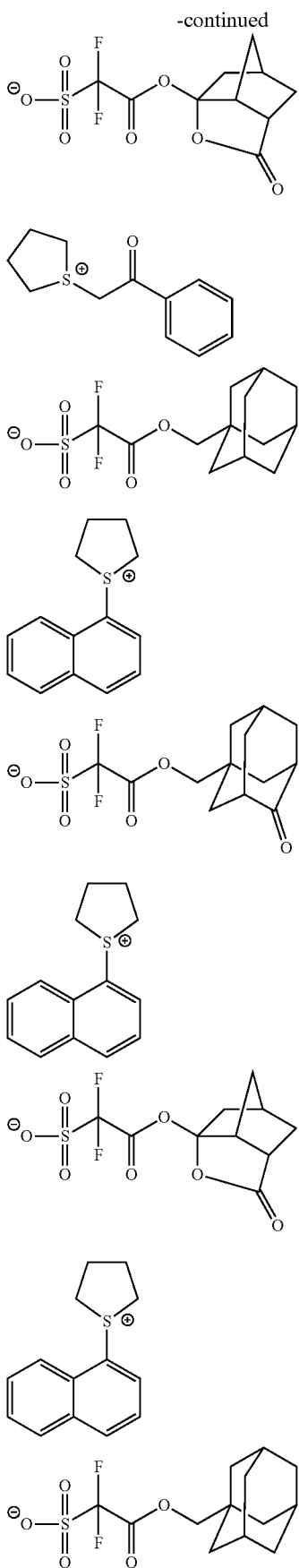

(Y-70)
(Y-71)
(Y-72)
(Y-73)

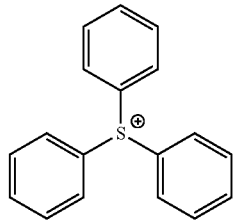

(Y-74)

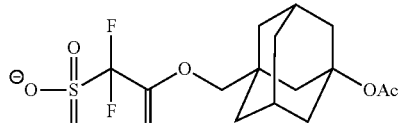

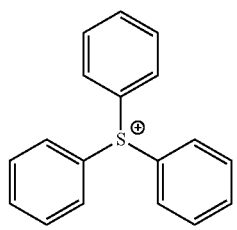

(Y-75)

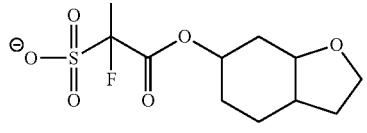

The compound represented by formula (Y) can be synthesized by a known method, for example, can be synthesized in accordance with the method described in JP-A-2007-161707.

As for the compound represented by formula (Y), one kind may be used, or two or more kinds may be used in combination.

As for the acid generator, one kind may be used alone, or two or more kinds may be used in combination.

The content of the acid generator in the positive photosensitive composition is preferably from 0.1 to 20 mass %, more preferably from 0.5 to 10 mass %, still more preferably from 1 to 7 mass %, based on the entire solid content of the positive photosensitive composition.

Solvent:

Examples of the solvent which can be used at the time of preparing the positive photosensitive composition by dissolving the above-described components include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used includes a solvent having a boiling point of 130° C. or more at ordinary temperature under atmospheric pressure, and specific examples thereof include cyclopentanone, γ-butyrolactone, cyclohexanone, ethyl lactate, ethylene glycol monomethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent not containing a hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group to the solvent not containing a hydroxyl group is from 1/99 to 99/1, preferably from 10/90 to 90/10, more preferably from 20/80 to 60/40. A mixed solvent in which the solvent not containing a hydroxyl group is contained in an amount of 50 mass % or more is preferred in view of coating uniformity.

The solvent is preferably a mixed solvent of two or more kinds of solvents containing propylene glycol monomethyl ether acetate.

Basic Compound:

The positive photosensitive composition for use in the present invention preferably contains a basic compound for reducing the change of performance with aging from exposure until heating.

The basic compound is preferably a compound having a structure represented by any one of the following formulae (A) to (E).

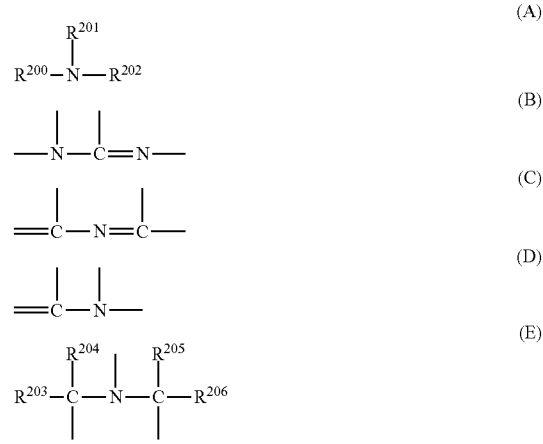

In formulae (A) and (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in these formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include tetrabutylammonium hydroxide, triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom, in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. The organic sulfonate includes an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring each may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The phenoxy group-containing amine compound and the phenoxy group-containing ammonium salt compound are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

The sulfonic acid ester group in the sulfonic acid ester group-containing amine compound and sulfonic acid ester group-containing ammonium salt compound may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

One of these basic compounds may be used alone, or two or more kinds thereof may be used in combination.

The amount of the basic compound used is usually from 0.001 to 10 mass %, preferably from 0.01 to 5 mass %, based on the solid content of the positive photosensitive composition.

The ratio of acid generator and basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

Surfactant:

The positive photosensitive composition for use in the present invention preferably further contains a surfactant, more preferably any one of fluorine-containing and/or silicon-containing surfactants (a fluorine-containing surfactant, a silicon-containing surfactant and a surfactant containing both a fluorine atom and a silicon atom), or two or more kinds thereof.

By incorporating the above-described surfactant into the positive photosensitive composition for use in the present invention, a resist pattern with good performance in terms of sensitivity, resolution and adherence as well as less development defect can be provided when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene))acrylate and/or a (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene))acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene))acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene))acrylate (or methacrylate), and a copolymer of a $C_3F_7$ group-containing acrylate (or methacrylate) with a (poly(oxyethylene)) acrylate (or methacrylate) and a (poly(oxypropylene))acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or some of them may be used in combination.

The amount of the surfactant used is preferably from 0.0001 to 2 mass %, more preferably from 0.001 to 1 mass %, based on the entire amount of the positive photosensitive composition (excluding the solvent).

Onium Carboxylate:

The positive photosensitive composition for use in the present invention may contain an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably the carboxylate anion above with the alkyl group being partially or entirely fluorine-substituted. The alkyl chain may contain an oxygen atom. Thanks to such a construction, the transparency to light at 220 nm or less is ensured, the sensitivity and resolution are enhanced, and the iso/dense bias and exposure margin are improved.

Examples of the fluorine-substituted carboxylate anion include fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

Dissolution inhibiting compound having a molecular weight of 3,000 or less and being capable of decomposing by the action of an acid to increase the solubility in an alkali developer:

The dissolution inhibiting compound having a molecular weight of 3,000 or less and being capable of decomposing by the action of an acid to increase the solubility in an alkali developer (hereinafter, sometimes referred to as a "dissolution inhibiting compound") is preferably an alicyclic or aliphatic compound containing an acid-decomposable group, such as acid-decomposable group-containing cholic acid derivative described in Proceeding of SPIE, 2724, 355 (1996), so as not to reduce the transparency to light at 220 nm or less. Examples of the acid-decomposable group and alicyclic structure are the same as those described above with respect to the resin (A).

In the case where the positive photosensitive composition for use in the present invention is exposed by a KrF excimer laser or irradiated with an electron beam, the composition preferably contains a structure where the phenolic hydroxyl group of a phenol compound is substituted by an acid-decomposable group. The phenol compound is preferably a compound containing from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the positive photosensitive composition.

Specific examples of the dissolution inhibiting compound are set forth below, but the present invention is not limited thereto.

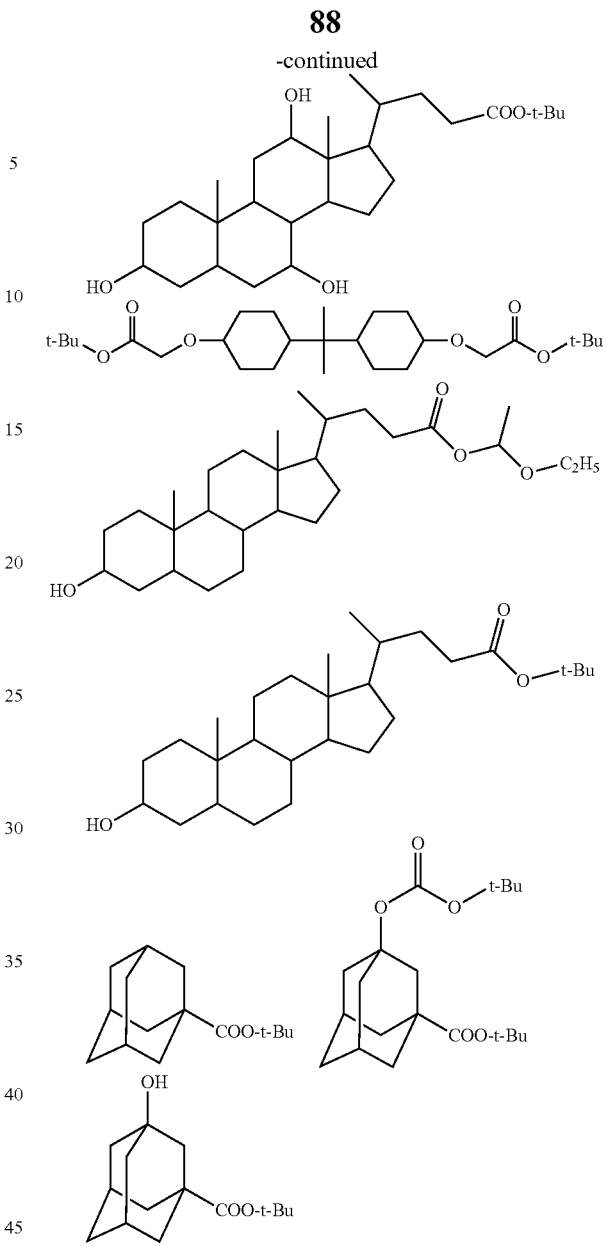

Other Additives:

The positive photosensitive composition for use in the present invention may further contain, for example, a dye, a plasticizer, a photosensitizer, a light absorber and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

Pattern Forming Method:

In the pattern forming method of the present invention, a resist film is formed using a positive photosensitive composition containing the resin (A), and the resist film is subjected to pattern exposure, post-exposure heating (PEB) and development.

The positive photosensitive composition for use in the present invention is preferably used in a film thickness of 30 to 250 nm, more preferably from 30 to 200 nm, from the standpoint of enhancing the resolution. Such a film thickness can be obtained by setting the solid content concentration in the positive photosensitive composition to an appropriate range, thereby imparting an appropriate viscosity and enhancing the coatability and film-forming property.

The entire solid content concentration in the positive photosensitive composition is generally from 1 to 10 mass %, preferably from 1 to 8.0 mass %, more preferably from 1.0 to 6.0 mass %.

The positive photosensitive composition for use in the present invention is used by dissolving the components above in a predetermined organic solvent, preferably in the above-described mixed solvent, filtering the solution, and coating it on a predetermined support as follows. The filter used for filtration is preferably a polytetrafluoroethylene-, polyethylene- or nylon-made filter having a pore size of 0.1 μm or less, more preferably 0.05 μm or less, still more preferably 0.03 μm or less.

For example, the positive photosensitive composition is coated on a type of substrate (e.g., silicon/silicon dioxide-coated substrate) which is used in the production of a precision integrated circuit device, by an appropriate coating method such as spinner or coater and dried to form a resist film.

The resist film is exposed by irradiation with actinic rays or radiation thereon through a predetermined mask (pattern exposure) and then subjected to post-exposure heating (PEB), development and rinsing, whereby a good pattern can be obtained.

Examples of the actinic ray or radiation include infrared light, visible light, ultraviolet light, far ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser light (248 nm), ArF excimer laser light (193 nm), $F_2$ excimer laser light (157 nm), X-ray and electron beam, with ArF excimer laser light, $F_2$ excimer laser light, EUV (13 nm) and electron beam being preferred.

Before forming the resist film, an antireflection film may be previously provided by coating on the substrate.

The antireflection film used may be either an inorganic film type such as titanium, titanium dioxide, titanium nitride, chromium oxide, carbon and amorphous silicon, or an organic film type composed of a light absorber and a polymer material. Also, the organic antireflection film may be a commercially available organic antireflection film such as DUV30 Series and DUV-40 Series produced by Brewer Science, Inc. and AR-2, AR-3 and AR-5 produced by Shipley Co., Ltd.

The post-exposure heating (PEB) can be performed, for example, by heating the substrate on a hot plate.

The post-exposure heating temperature is preferably from 80 to 130° C., more preferably from 85 to 110° C.

The post-exposure heating time is preferably from 30 to 180 seconds, more preferably from 60 to 90 seconds.

In the development step, an alkali developer is used as follows. The alkali developer which can be used for the positive photosensitive composition is an alkaline aqueous solution of, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and the pure water may be used after adding thereto a surfactant in an appropriate amount.

After the development or rinsing, the developer or rinsing solution adhering on the pattern may removed by a supercritical fluid.

The exposure may also be performed by filling a liquid (immersion medium) having a refractive index higher than that of air between the resist film and a lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is intermixed, this incurs distortion of the optical image projected on the resist film. Therefore, the water used is preferably distilled water. Pure water obtained by further filtering the distilled water through an ion exchange filter or the like may also be used.

The electrical resistance of water is preferably 18.3 MΩcm or more, and TOC (total organic carbon) is preferably 20 ppb or less. Also, the water is preferably subjected to a deaeration treatment.

The lithography performance can be enhanced by increasing the refractive index of the immersion liquid. From such a standpoint, an additive for increasing the refractive index may be added to water, or deuterium water ($D_2O$) may be used in place of water.

In the case where the resist film formed of the positive photosensitive composition for use in the present invention is exposed through an immersion medium, a hydrophobic resin (HR) may be further added, if desired. The hydrophobic resin (HR) when added is unevenly distributed to the surface layer of the resist film and in the case of using water as the immersion medium, the resist film formed can be enhanced in the receding contact angle on the resist film surface for water as well as in the followability of the immersion liquid. The hydrophobic resin (HR) may be any resin as long as the receding contact angle on the surface is enhanced by its addition, but a resin having at least either one of a fluorine atom and a silicon atom is preferred. The receding contact angle of the resist film is preferably from 60 to 90°, more preferably 70° or more. The amount of the hydrophobic resin added may be appropriately adjusted to give a resist film having a receding contact angle in the range above but is preferably from 0.1 to 10 mass %, more preferably from 0.1 to 5 mass %, based on the entire solid content of the positive photosensitive composition. The hydrophobic resin (HR) is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and this is generally known to be useful in simulating the mobility of a liquid droplet in the dynamic state. In a simple manner, the receding contact angle can be defined as a contact angle at the time of the liquid droplet interface receding when a liquid droplet ejected from a needle tip is landed on a substrate and then the liquid droplet is again sucked into the needle. In general, the receding contact angle can be measured by a contact angle measuring method called an expansion/contraction method.

In the immersion exposure step, the immersion liquid needs to move on a wafer following the movement of an exposure head that is scanning the wafer at a high speed and forming an exposure pattern. Therefore, the contact angle of the immersion liquid with the resist film in a dynamic state is important and the resist is required to have a performance of allowing a liquid droplet to follow the high-speed scanning of an exposure head with no remaining.

The fluorine atom or silicon atom in the hydrophobic resin (HR) may be present in the main chain of the resin or may be substituted on the side chain.

The hydrophobic resin (HR) is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably from 1 to 4) is a linear or branched alkyl group with at least one hydrogen atom being substituted by a fluorine atom and may further have other substituents.

The fluorine atom-containing cycloalkyl group is a monocyclic or polycyclic cycloalkyl group with at least one hydrogen atom being substituted by a fluorine atom and may further have other substituents.

The fluorine atom-containing aryl group is an aryl group (e.g., phenyl, naphthyl) with at least one hydrogen atom being substituted by a fluorine atom and may further have other substituents.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

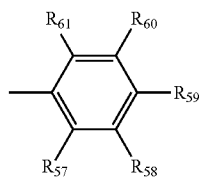

(F2)

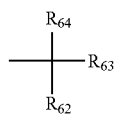

(F3)

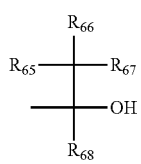

(F4)

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted by a fluorine atom. It is preferred that $R_{57}$ to $R_{61}$ and $R_{65}$ to $R_{67}$ all are a fluorine atom. Each of $R_{62}$, $R_{63}$ and $R_{68}$ is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Specific examples of the repeating unit having a fluorine atom are set forth below, but the present invention is not limited thereto.

In specific examples, X$_1$ represents a hydrogen atom, —CH$_3$, —F or —CF$_3$.

X$_2$ represents —F or —CF$_3$.

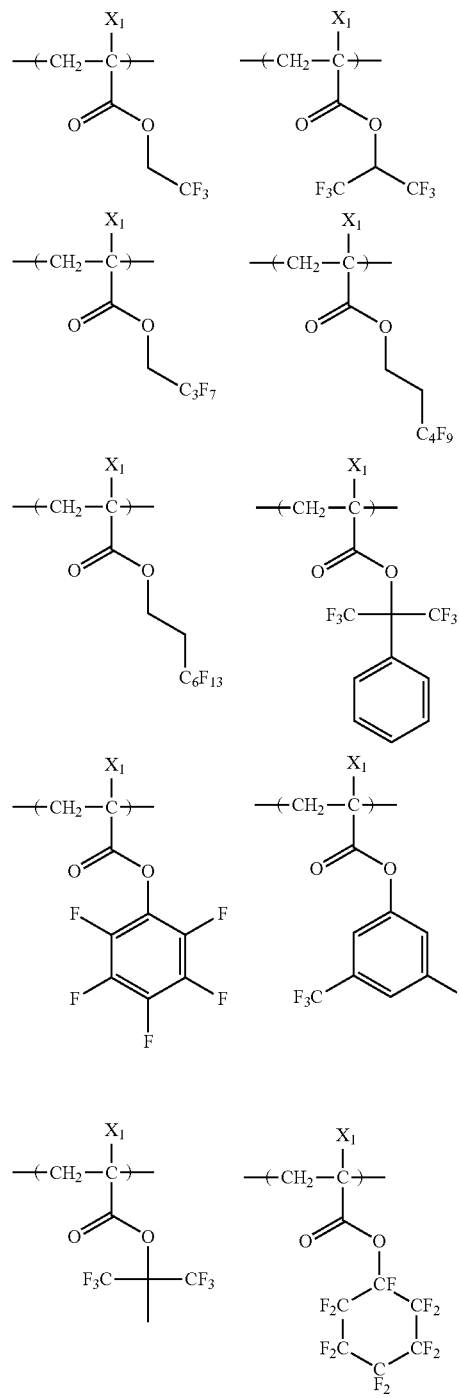

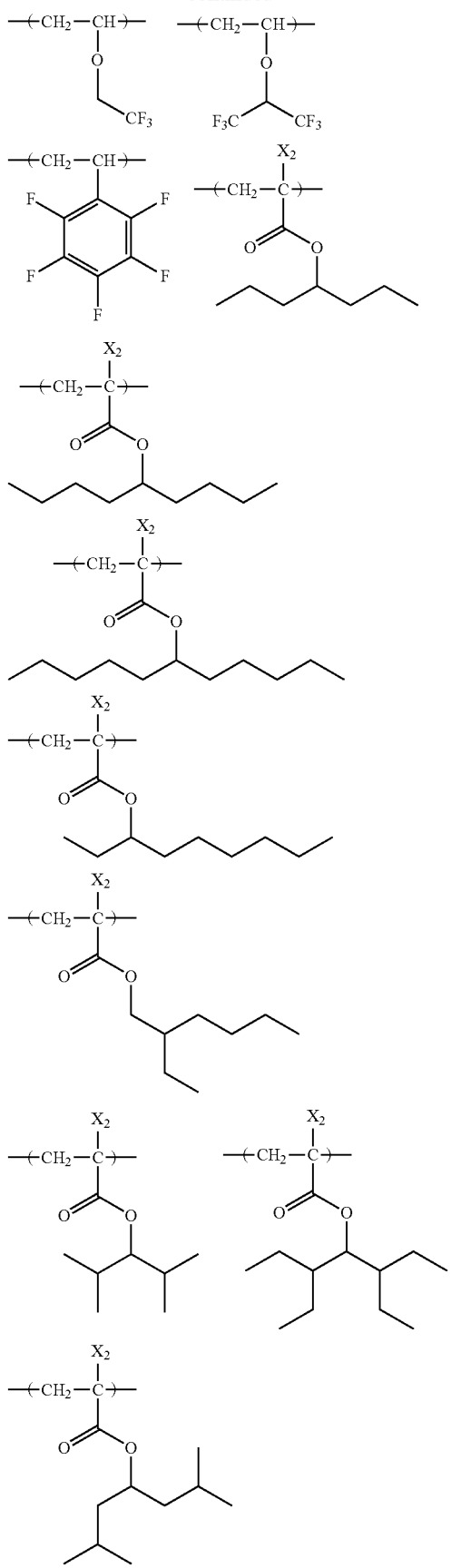

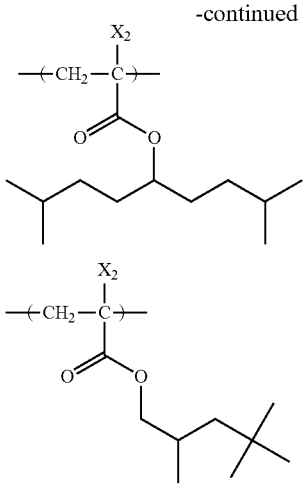

The hydrophobic resin (HR) may contain a silicon atom. The hydrophobic resin (HR) is preferably a resin having an alkylsilyl structure (preferably a trialkylsilyl group) or a cyclic siloxane structure, as a silicon atom-containing partial structure.

Specific examples of the alkylsilyl structure and cyclic siloxane structure include the groups represented by the following formulae (CS-1) to (CS-3):

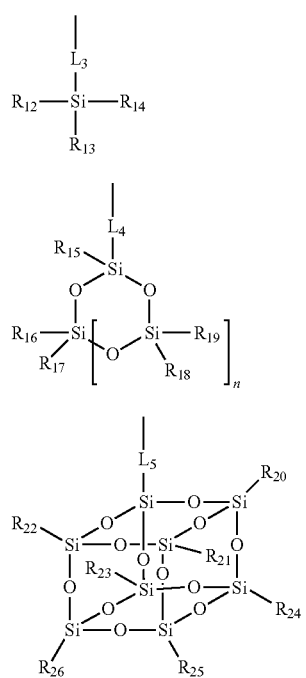

(CS-1)

(CS-2)

(CS-3)

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole group or a combination of two or more groups, selected from the group consisting of an alkylene group, a phenylene group, an ether group, a thioether group, a carbonyl group, an ester group, an amide group, a urethane group and a ureylene group.

n represents an integer of 1 to 5. n is preferably an integer of 2 to 4.

Specific examples of the repeating unit having a group represented by formula (CS-1) to (CS-3) are set forth below, but the present invention is not limited thereto. In specific examples, $X_1$ represents a hydrogen atom, —$CH_3$, —F or —$CF_3$.

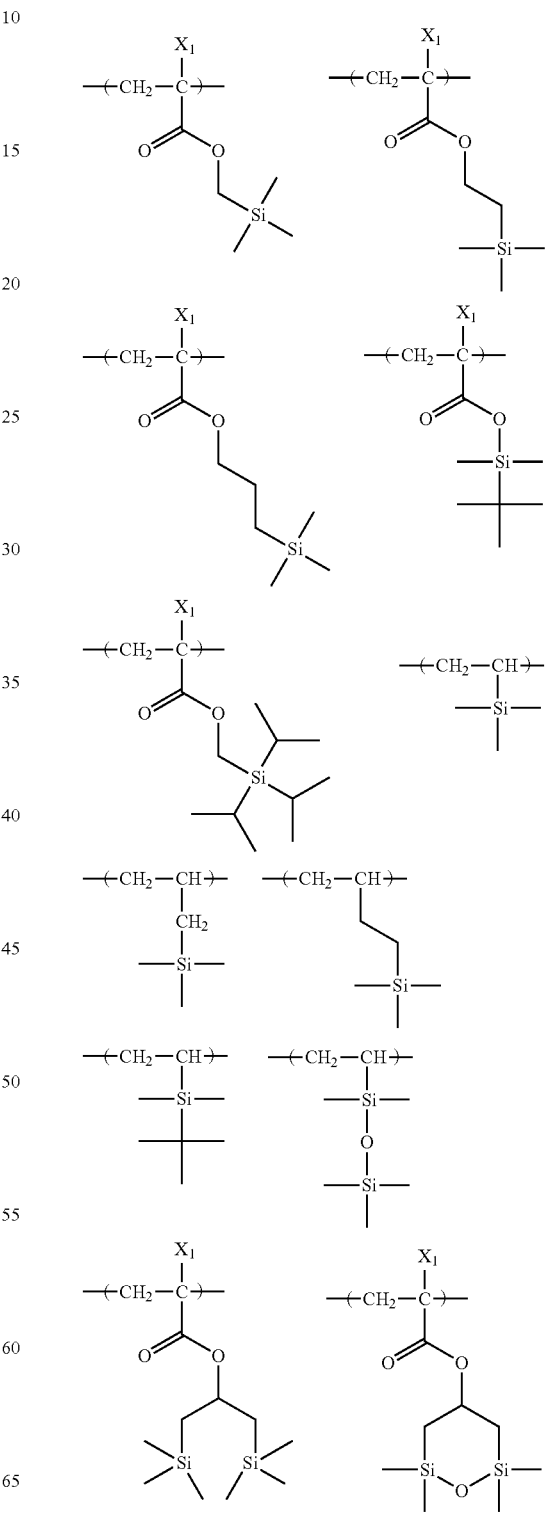

-continued

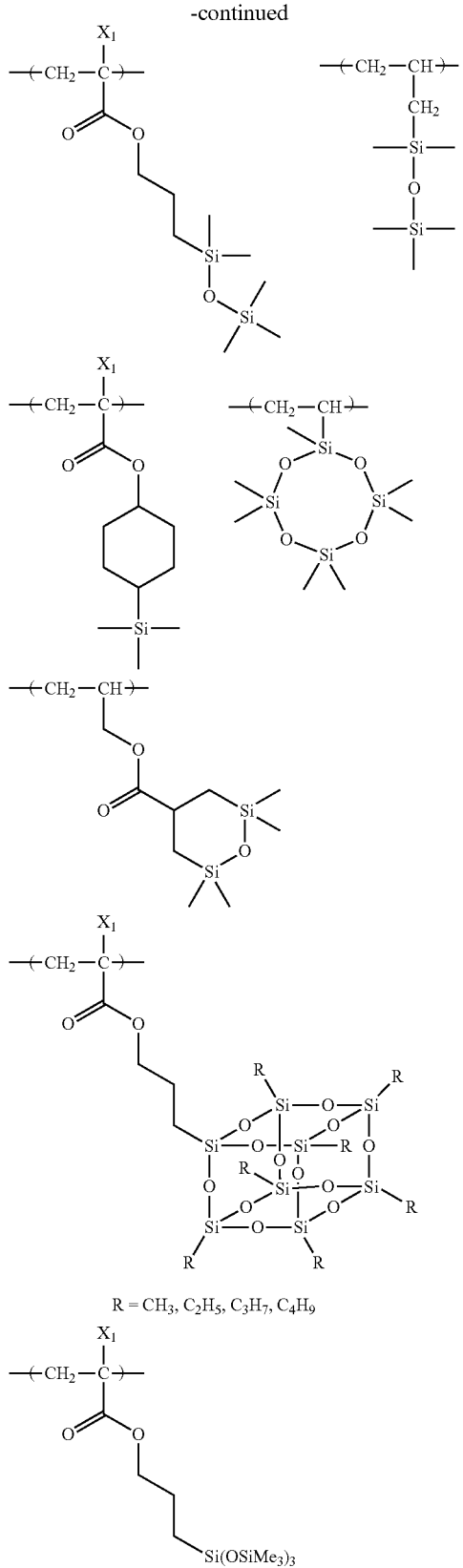

R = CH₃, C₂H₅, C₃H₇, C₄H₉

Furthermore, the hydrophobic resin (HR) may contain at least one group selected from the group consisting of the following (x) to (z):

(x) an alkali-soluble group, (y) a group capable of decomposing by the action of an alkali developer to increase the solubility in an alkali developer, and (z) a group capable of decomposing by the action of an acid.

Examples of the (x) alkali-soluble group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(allylsulfonyl)imide group, a tris(alkylcarbonyl)methylene group and a tris(alkylsulfonyl)methylene group.

Preferred alkali-soluble groups include a fluorinated alcohol group (preferably hexafluoroisopropanol), a sulfonimide group and a bis(carbonyl)methylene group.

The repeating unit having (x) an alkali-soluble group includes a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, and these repeating units all are preferred.

The content of the repeating unit having (x) an alkali-soluble group is preferably from 1 to 50 mol %, more preferably from 3 to 35 mol %, still more preferably from 5 to 20 mol %, based on all repeating units in the polymer.

Specific examples of the repeating unit having (x) an alkali-soluble group are set forth below, but the present invention is not limited thereto.

In the formulae, Rx represents H, CH₃, CF₃ or CH₂OH.

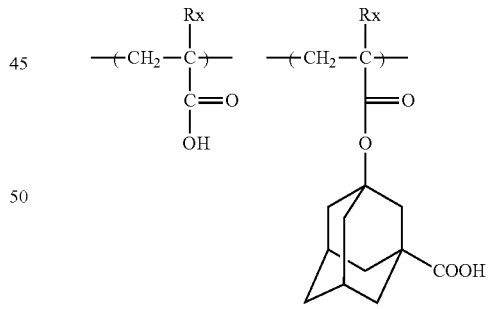

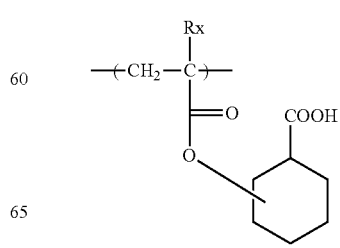

99
-continued
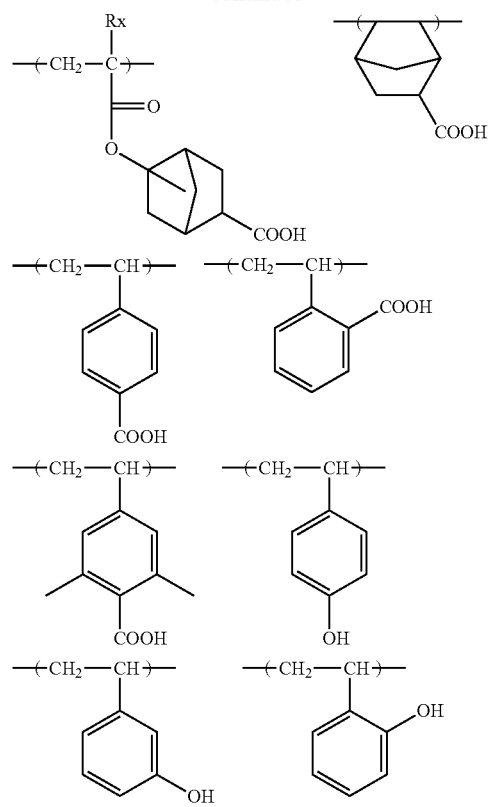
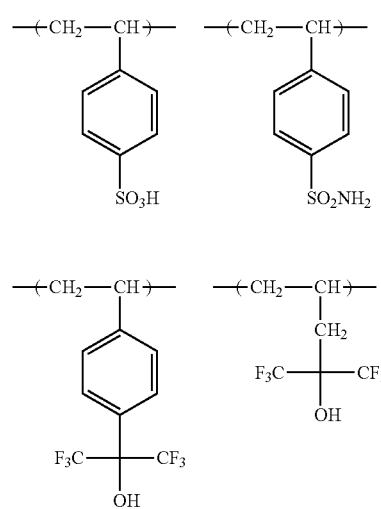
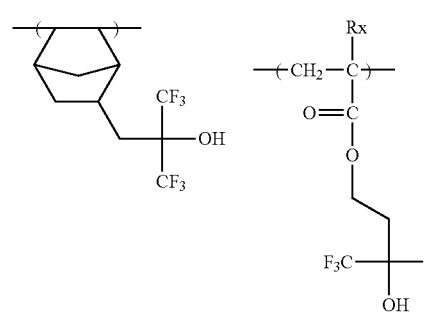
100
-continued
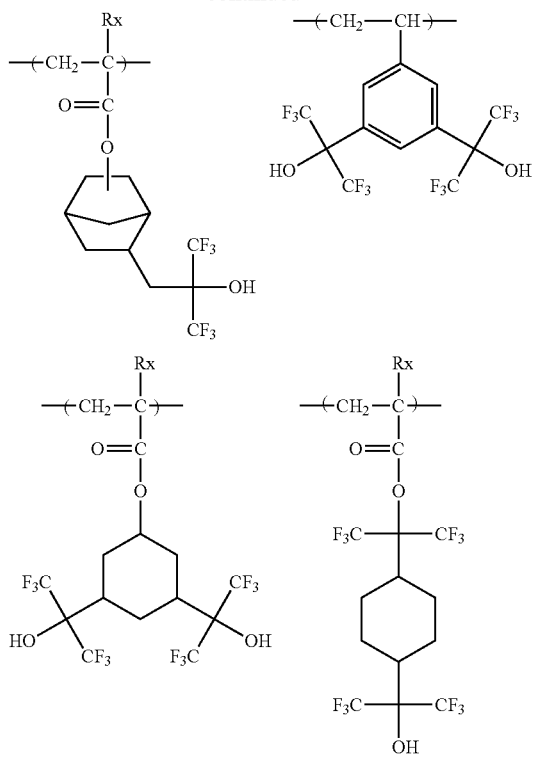
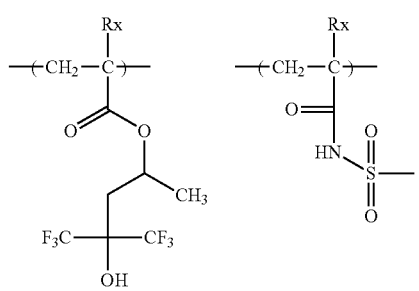
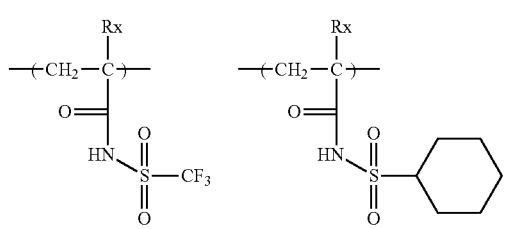
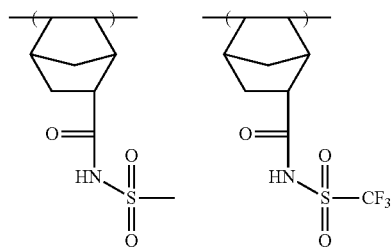

-continued

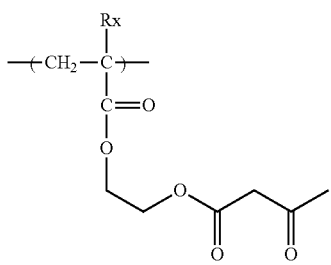
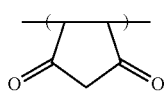

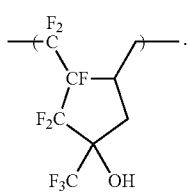

Examples of the (y) group capable of decomposing by the action of an alkali developer to increase the solubility in an alkali developer include a lactone structure-containing group, an acid anhydride group and an acid imide group, with a lactone structure-containing group being preferred.

As for the repeating unit having (y) a group capable of decomposing by the action of an alkali developer to increase the solubility in an alkali developer, both a repeating unit where (y) a group capable of decomposing by the action of an alkali developer to increase the solubility in an alkali developer is bonded to the main chain of the resin, such as repeating unit by an acrylic acid ester or a methacrylic acid ester, and a repeating unit where (y) a group capable of increasing the solubility in an alkali developer is introduced into the polymer chain terminal by using a polymerization initiator or chain transfer agent containing that group at the polymerization are preferred.

The content of the repeating unit having (y) a group capable of increasing the solubility in an alkali developer is preferably from 1 to 40 mol %, more preferably from 3 to 30 mol %, still more preferably from 5 to 15 mol %, based on all repeating units in the polymer.

Specific examples of the repeating unit having (y) a group capable of increasing the solubility in an alkali developer are the same as those of the repeating unit having a lactone structure described for the resin as the component (B).

Examples of the repeating unit having (z) a group capable of decomposing by the action of an acid, contained in the hydrophobic resin (HR), are the same as those of the repeating unit having an acid-decomposable group described for the resin as the component (B). In the hydrophobic resin (HR), the content of the repeating unit having (z) a group capable of decomposing by the action of an acid is preferably from 1 to 80 mol %, more preferably from 10 to 80 mol %, still more preferably from 20 to 60 mol %, based on all repeating units in the polymer.

The hydrophobic resin (HR) may further contain a repeating unit represented by the following formula (III):

In formula (III), $R_{c31}$ represents a hydrogen atom, an alkyl group, an alkyl group which may be substituted by fluorine, a cyano group or a —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group or a cycloalkenyl group. Such a group may be substituted by a fluorine atom or a silicon atom.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

$R_{c32}$ is preferably an unsubstituted alkyl group or an alkyl group substituted by a fluorine atom.

The divalent linking group of $L_{c3}$ is preferably an ester group, an alkylene group (preferably having a carbon number of 1 to 5), an oxy group, a phenylene group or an ester bond (a group represented by —COO—).

It is also preferred that the hydrophobic resin (HR) further contains a repeating unit represented by the following formula (CII-AB).

In formula (CII-AB), each of $R_{c11}'$ and $R_{c12}'$ independently represents a hydrogen atom, a cyano group, a halogen atom or an alkyl group.

$Zc'$ represents an atomic group for forming an alicyclic structure containing the two bonded carbon atoms (C—C).

Specific examples of the repeating units represented by formulae (III) and (CII-AB) are set forth below, but the present invention is not limited thereto. In the formulae, Ra represents H, $CH_3$, $CH_2OH$, $CF_3$ or CN.

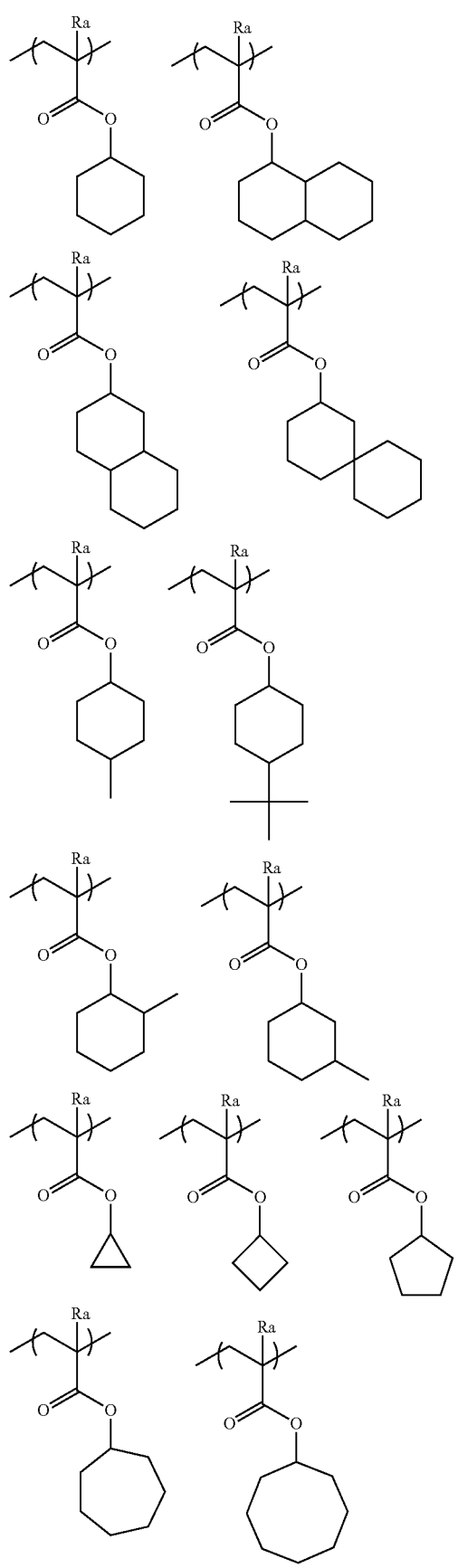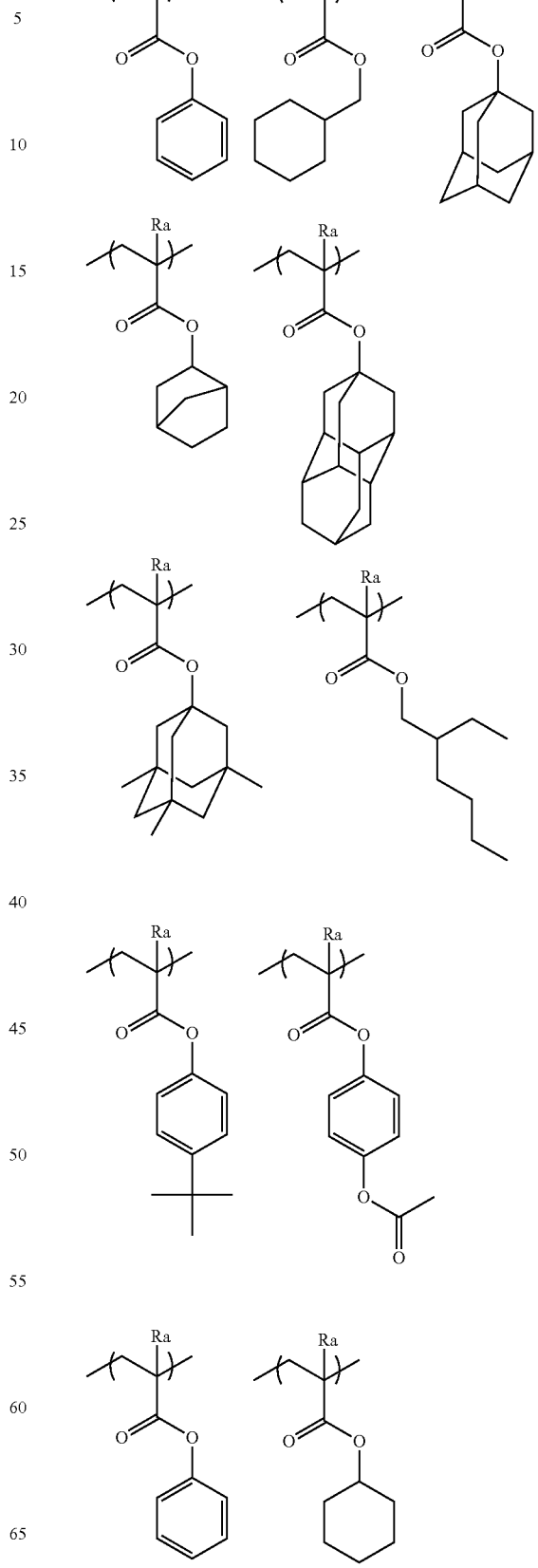

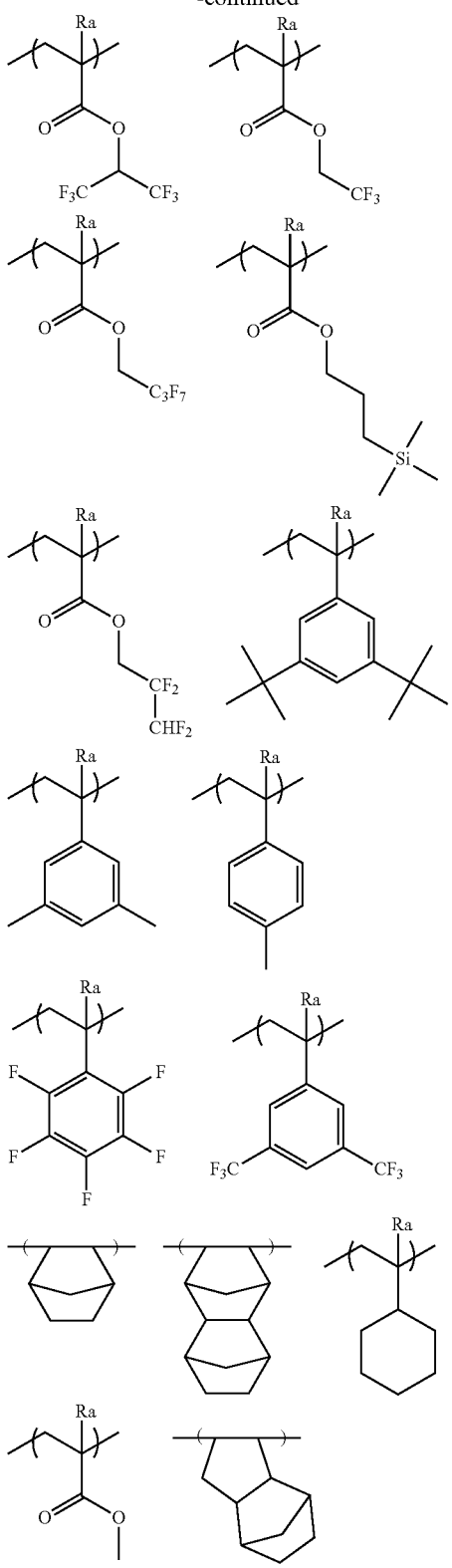

In the case where the hydrophobic resin (HR) contains a fluorine atom, the fluorine atom content is preferably from 5 to 80 mass %, more preferably from 10 to 80 mass %, based on the molecular weight of the hydrophobic resin (HR). Also, the fluorine atom-containing repeating unit preferably occupies from 10 to 100 mass %, more preferably from 30 to 100 mass %, in the hydrophobic resin (HR).

In the case where the hydrophobic resin (HR) contains a silicon atom, the silicon atom content is preferably from 2 to 50 mass %, more preferably from 2 to 30 mass %, based on the molecular weight of the hydrophobic resin (HR). Also, the silicon atom-containing repeating unit preferably occupies from 10 to 100 mass %, more preferably from 20 to 100 mass %, in the hydrophobic resin (HR).

The standard polystyrene-reduced weight average molecular of the hydrophobic resin (HR) is preferably from 1,000 to 100,000, more preferably from 1,000 to 50,000, still more preferably from 2,000 to 15,000.

Similarly to the resin as the component (B), in the hydrophobic resin (HR), it is of course preferred that the content of impurities such as metal is small, but also, the content of the residual monomers or oligomer components is preferably from 0 to 10 mass %, more preferably from 0 to 5 mass %, still more preferably from 0 to 1 mass %. When these conditions are satisfied, a resist free of extraneous substances in the liquid or change with aging of sensitivity can be obtained. Also, in view of resolution, resist profile, side wall of resist pattern, roughness and the like, the molecular weight distribution (Mw/Mn, also called polydispersity) is preferably from 1 to 5, more preferably from 1 to 3, still more preferably from 1 to 2.

As for the hydrophobic resin (HR), various commercially available products may be used or the resin may be synthesized by an ordinary method (for example, radical polymerization). Examples of the synthesis method in general include a batch polymerization method of dissolving monomer species and an initiator in a solvent and heating the solution, thereby effecting polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition for use in the present invention, which is described above, such as propylene glycol monomethyl ether acetate, propylene glycol monomethyl ether and cyclohexanone. The polymerization is more preferably performed using the same solvent as the solvent used in the positive photosensitive composition for use in the present invention. By the use of the same solvent, production of particles during storage can be suppressed.

The polymerization reaction is preferably performed in an inert gas atmosphere such as nitrogen or argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The reaction concentration is from 5 to 50 mass %, preferably from 30 to 50 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of extracting and removing only those having a molecular weight not more than a specific value; a reprecipitation method of adding dropwise the resin solution in a poor solvent to solidify the resin in the poor solvent and thereby remove residual monomers and the like; and a purification method in a solid state, such as a method of subjecting a resin slurry separated by filtration to washing with a poor solvent. For example, the resin is precipitated as a solid by contacting the reaction solution with a solvent in which the resin is sparingly soluble or insoluble (poor solvent) and which is in a volumetric amount of 10 times or less, preferably from 10 to 5 times.

The solvent used at the operation of precipitation or reprecipitation from the polymer solution (precipitation or reprecipitation solvent) may be sufficient if it is a poor solvent to the polymer, and the solvent may be appropriately selected, for example, from a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tan, by a known method such as batch system or continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

Specific examples of the hydrophobic resin (HR) are set forth below. Also, the molar ratio of repeating units (corresponding to repeating units starting from the left), weight average molecular weight and polydispersity of each resin are shown in Table 1 below.

TABLE 1

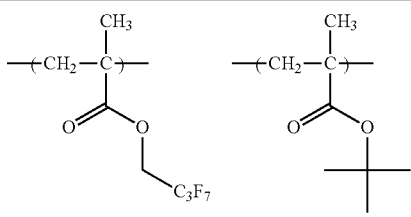

(HR-1)

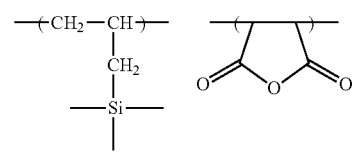

(HR-2)

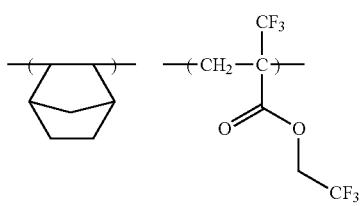

(HR-3)

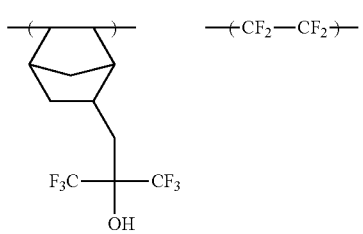

(HR-4)

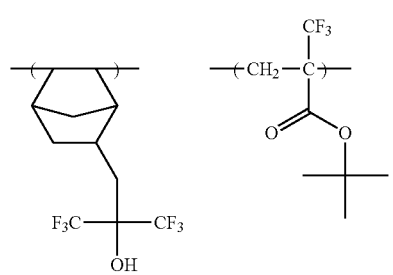

(HR-5)

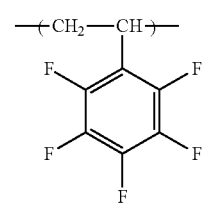

(HR-6)

TABLE 1-continued
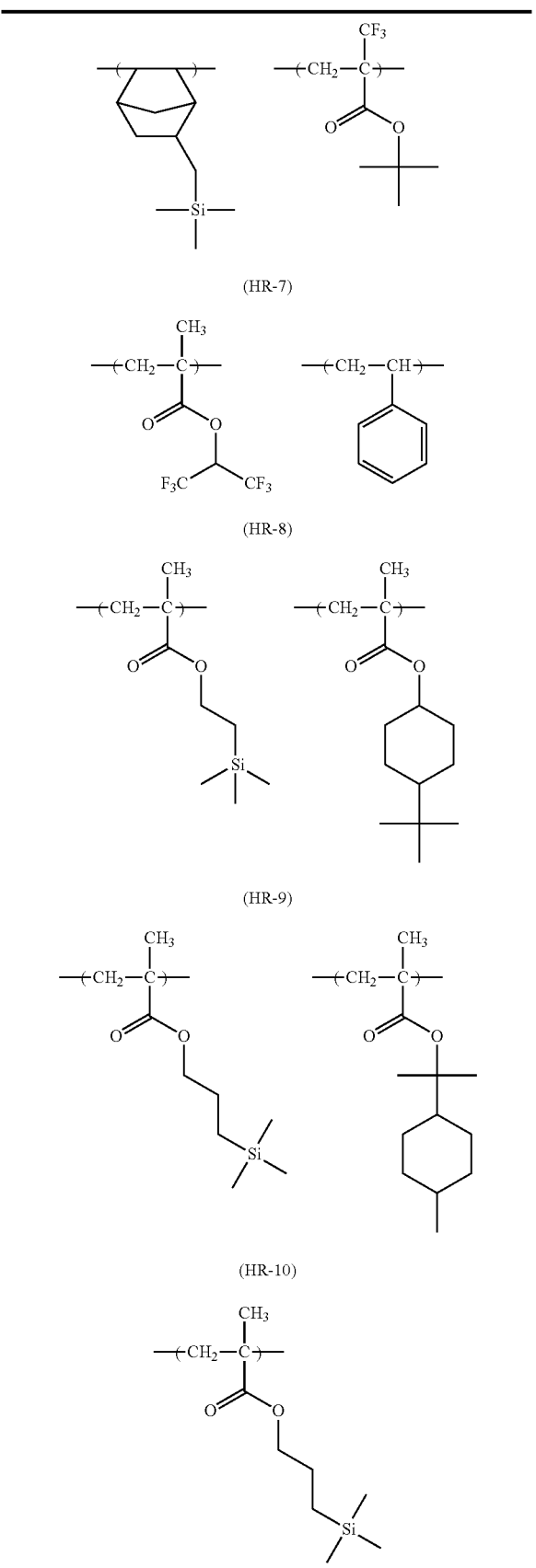
(HR-7)
(HR-8)
(HR-9)
(HR-10)
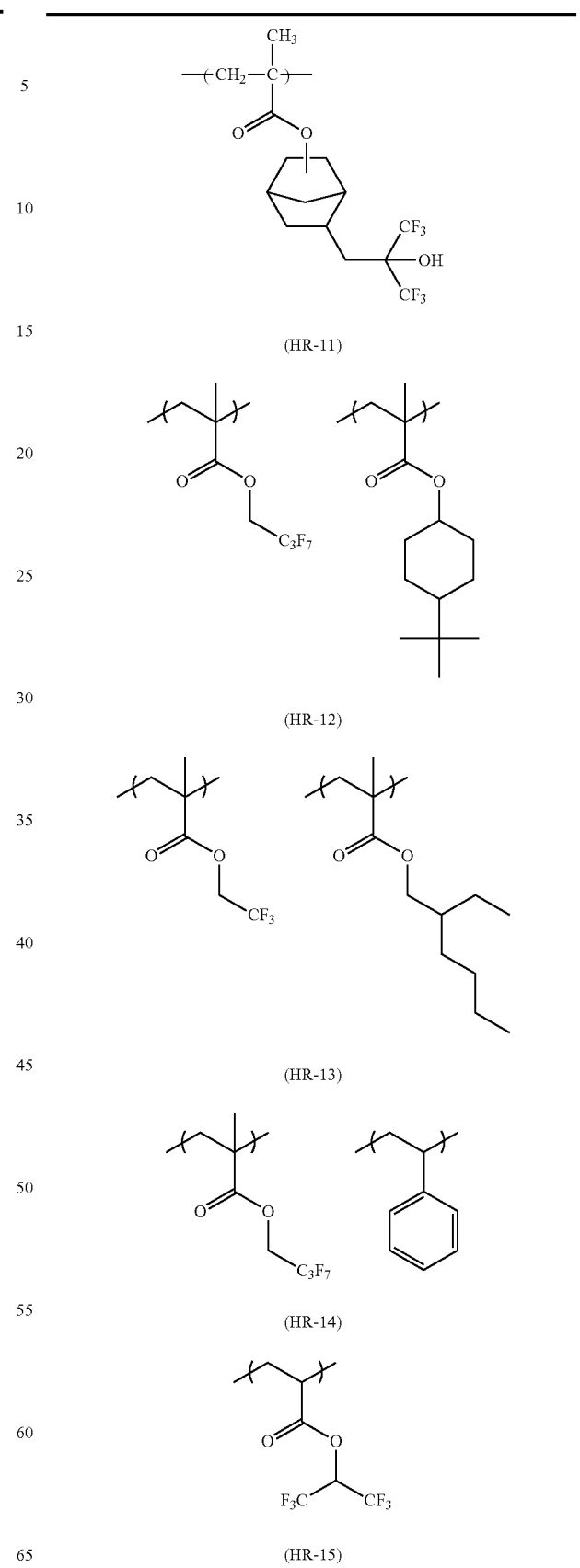
(HR-11)
(HR-12)
(HR-13)
(HR-14)
(HR-15)

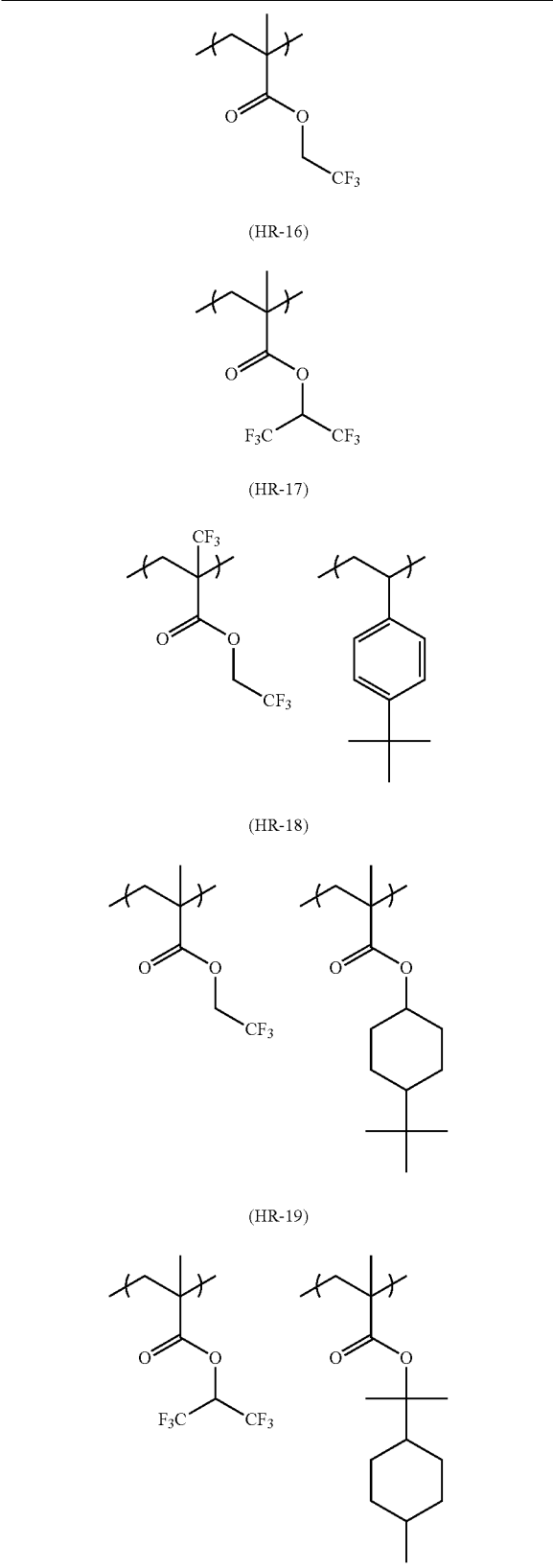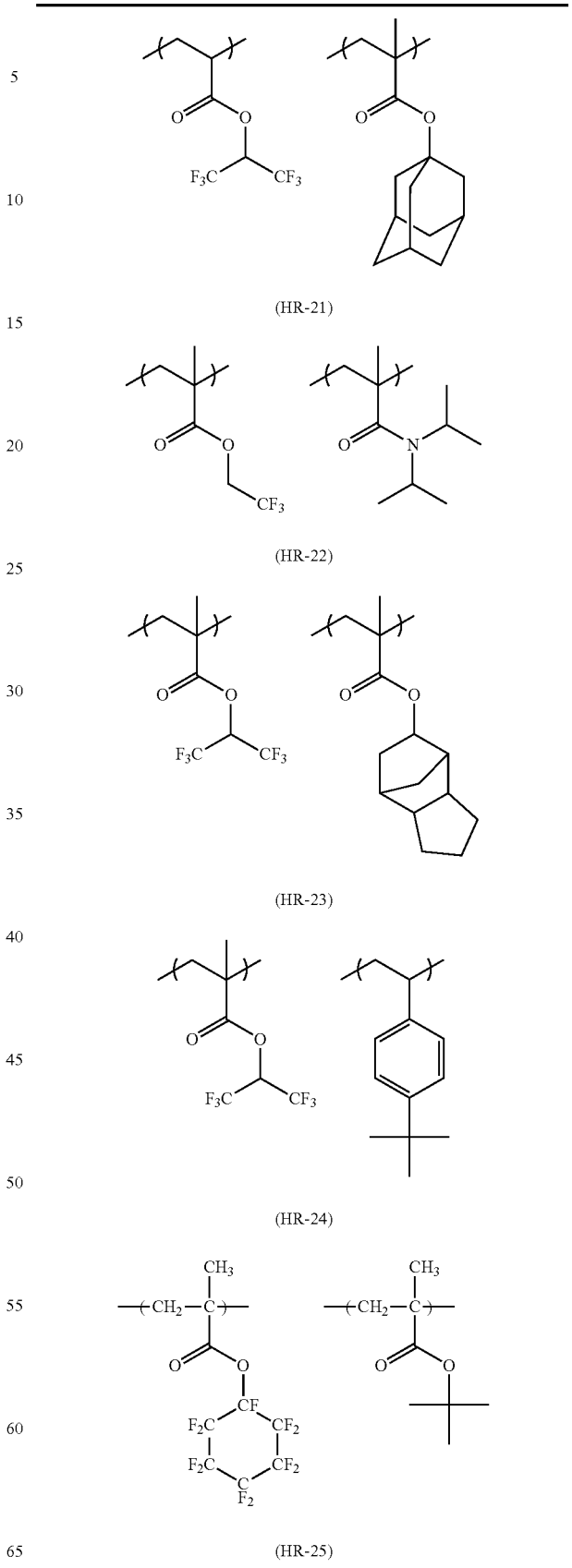

TABLE 1-continued
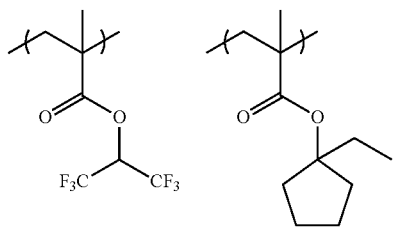
(HR-26)
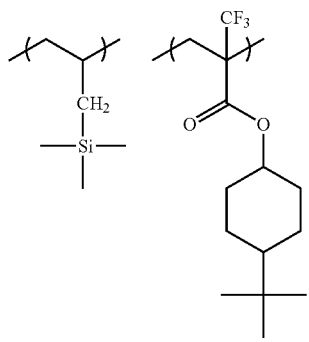
(HR-27)
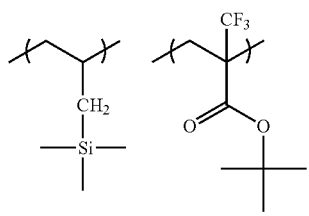
(HR-28)
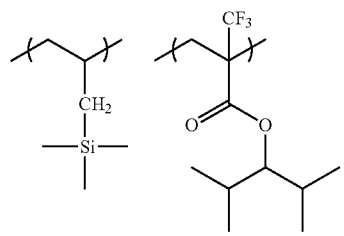
(HR-29)
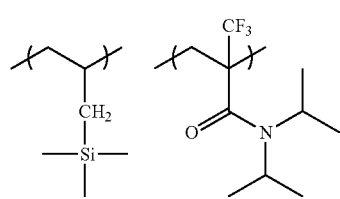
(HR-30)
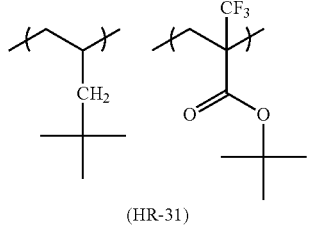
(HR-31)
TABLE 1-continued
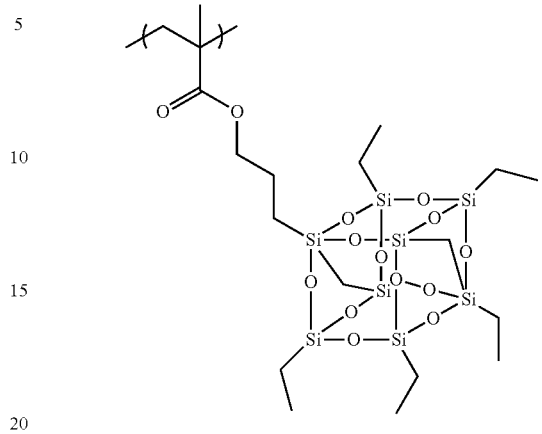
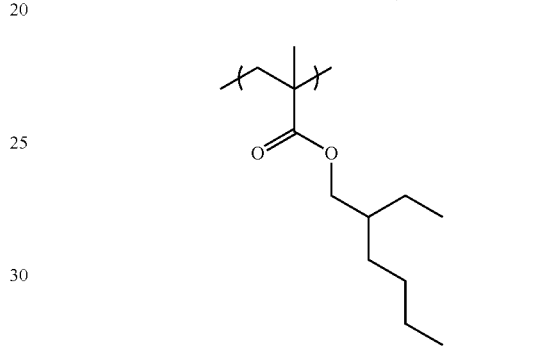
(HR-32)
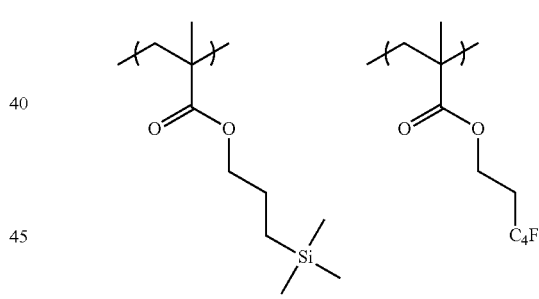
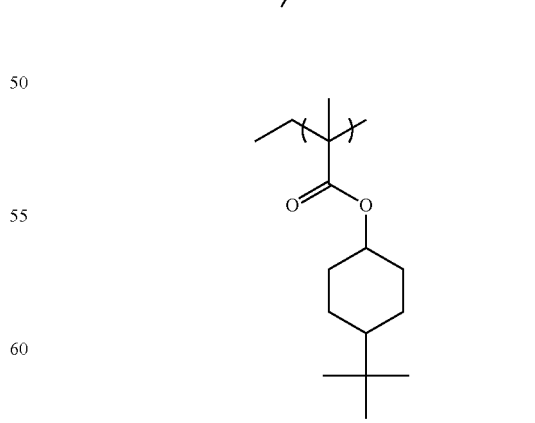
(HR-33)

TABLE 1-continued
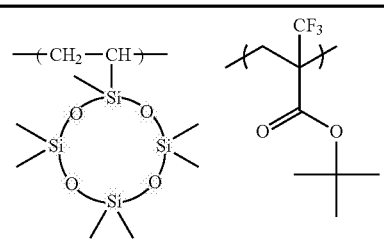
(HR-34)
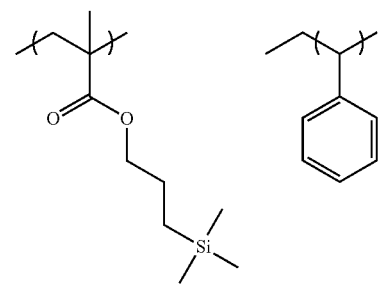
(HR-35)
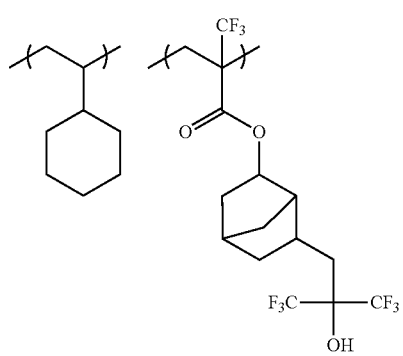
(HR-36)
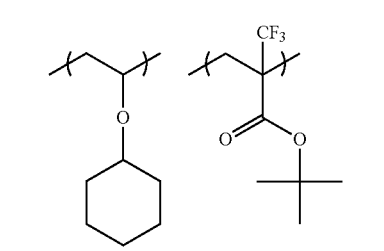
(HR-37)
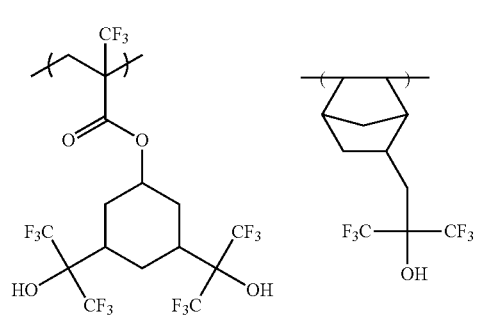
(HR-38)
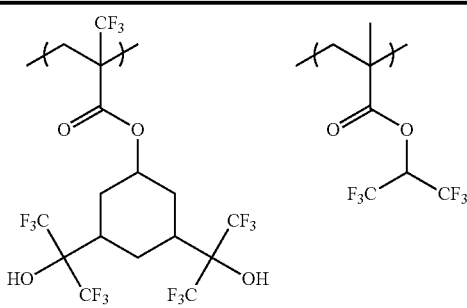
(HR-39)
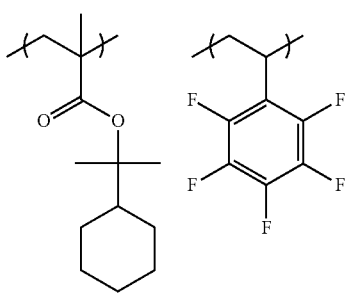
(HR-40)
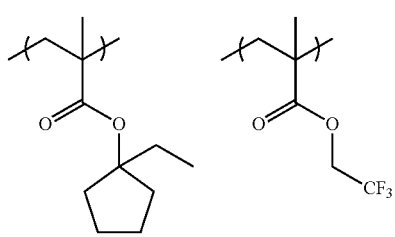
(HR-41)
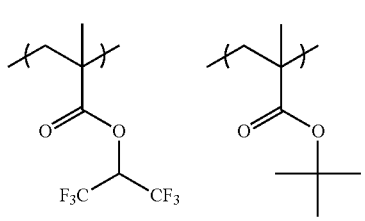
(HR-42)
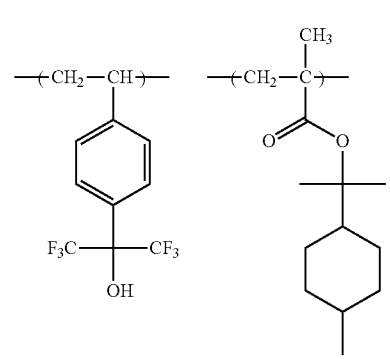
(HR-43)

TABLE 1-continued
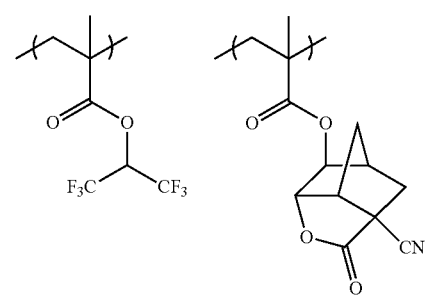
(HR-44)
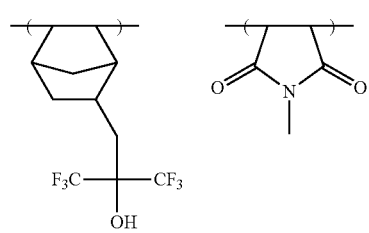
(HR-45)
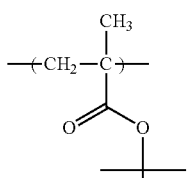
(HR-45)
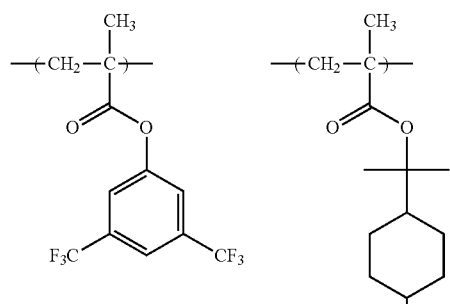
(HR-46)
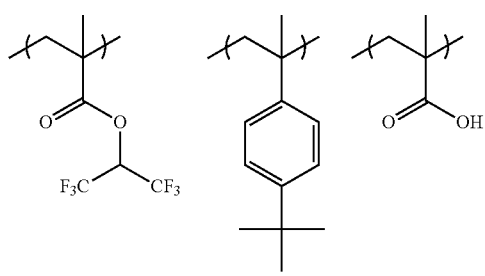
(HR-47)
TABLE 1-continued
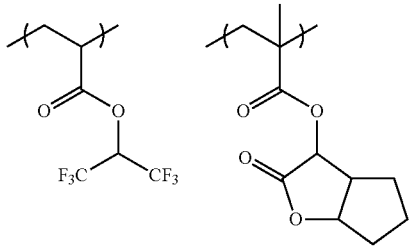
(HR-48)
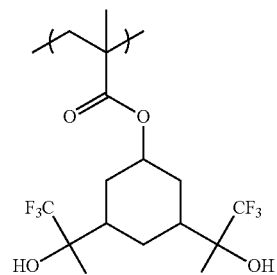
(HR-49)
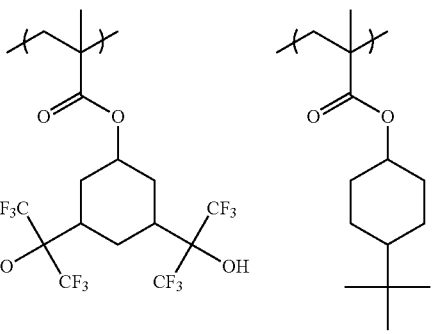
(HR-50)
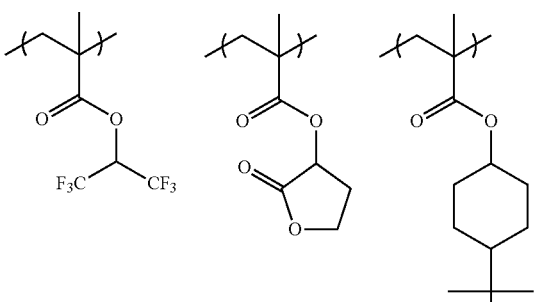
(HR-51)
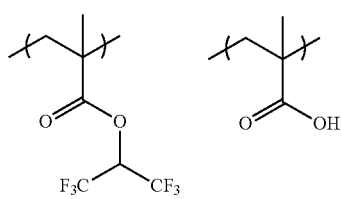
(HR-52)

TABLE 1-continued
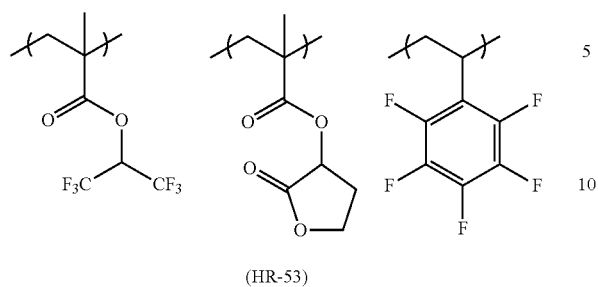
(HR-53)
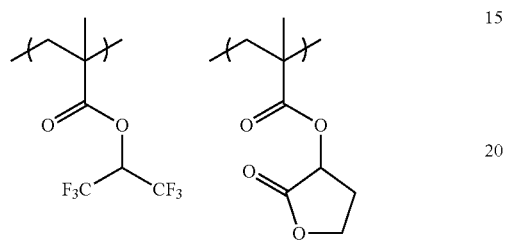
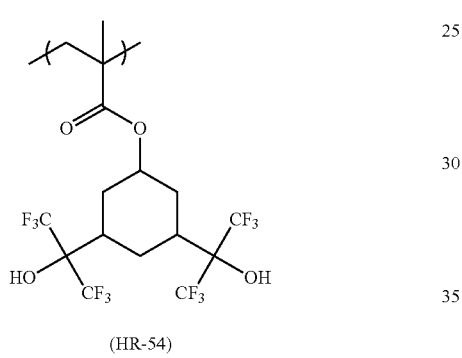
(HR-54)
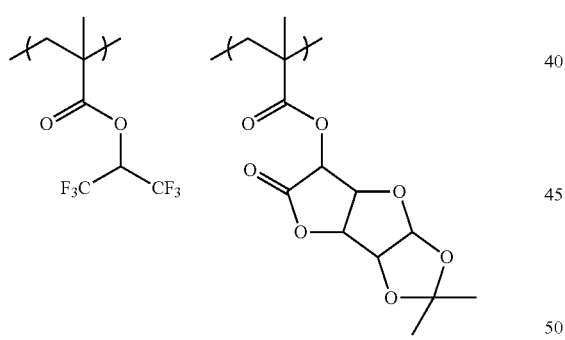
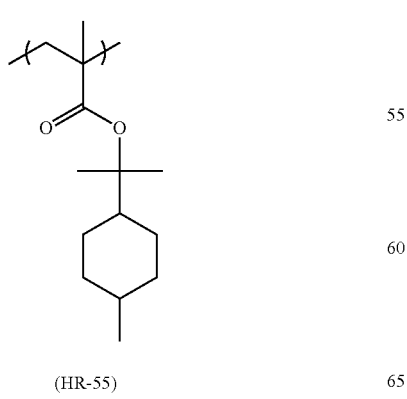
(HR-55)
TABLE 1-continued
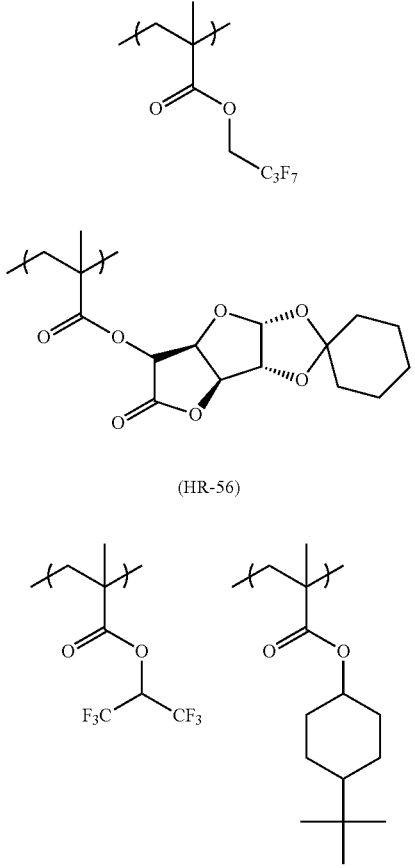
(HR-56)
(HR-57)
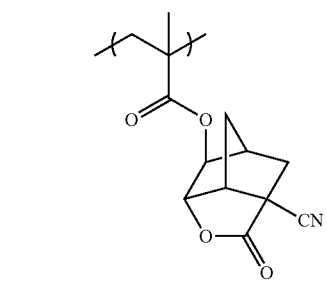
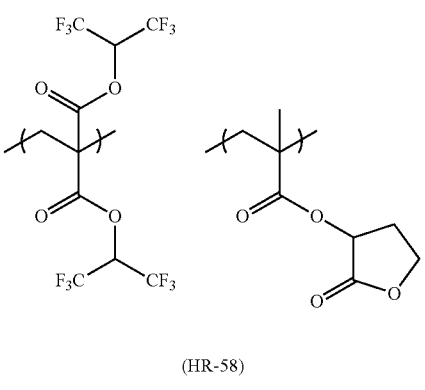
(HR-58)

TABLE 1-continued
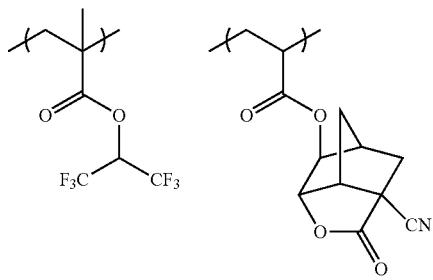
(HR-59)
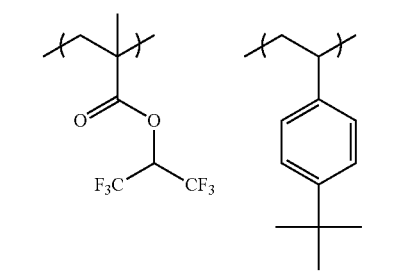
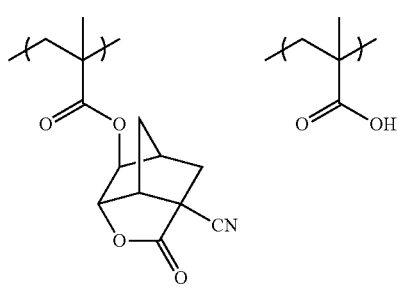
(HR-60)
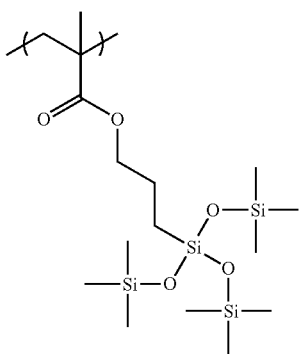
(HR-61)
TABLE 1-continued
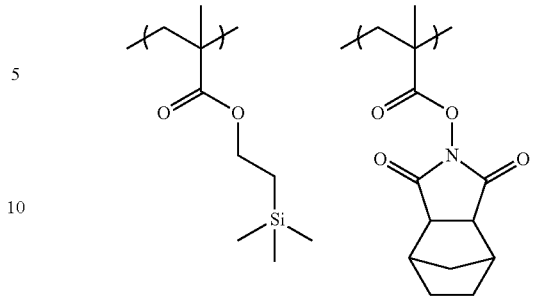
(HR-62)
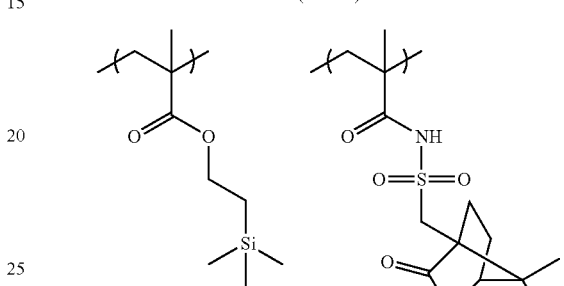
(HR-63)
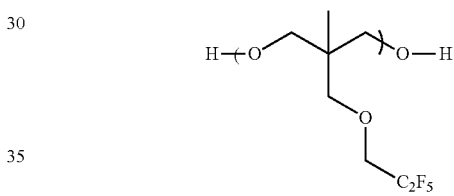
(HR-64)
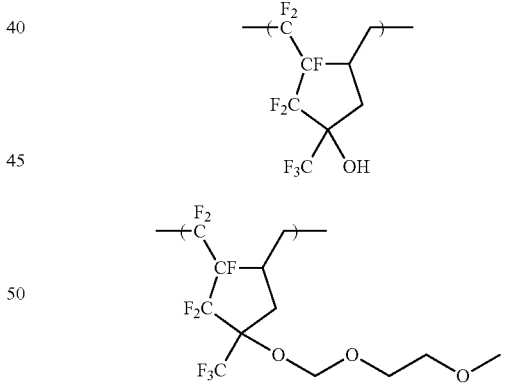
(HR-65)
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |

TABLE 1-continued

| | | | |
|---|---|---|---|
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

In order to prevent the resist film from directly contacting with the immersion liquid, a film (hereinafter, sometimes referred to as a "topcoat") sparingly soluble in an immersion liquid may be provided between the immersion liquid and the resist film formed of the positive photosensitive composition for use in the present invention. The functions required of the topcoat are suitability for coating as an overlayer of the resist, transparency to radiation particularly at 193 nm, and scarce solubility in the immersion liquid. The topcoat is preferably unmixable with the resist and capable of being uniformly coated as an overlayer of the resist.

In view of transparency to light at 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (HR) is also suitable as the topcoat. If impurities are dissolved out into the immersion liquid from the topcoat, the optical lens is contaminated. In this viewpoint, the amount of residual monomer components of the polymer contained in the topcoat is preferably smaller.

On peeling off the topcoat, a developer may be used or a releasing agent may be separately used. The releasing agent is preferably a solvent less permeating the resist film. From the standpoint that the peeling step can be performed simultaneously with the development step of the resist film, the topcoat is preferably peelable with an alkali developer and for enabling the peeling with an alkali developer, the topcoat is preferably acidic, but in view of non-intermixing with the resist film, the topcoat may be neutral or alkaline.

With no difference in the refractive index between the topcoat and the immersion liquid, the resolution is enhanced. In the case of using water as the immersion liquid at the exposure with an ArF excimer laser (wavelength: 193 nm), the topcoat for ArF immersion exposure preferably has a refractive index close to the refractive index of the immersion liquid. From the standpoint of making the refractive index close to that of the immersion liquid, the topcoat preferably contains a fluorine atom. Also, in view of transparency and refractive index, the topcoat is preferably a thin film.

The topcoat is preferably unmixable with the resist film and further unmixable with the immersion liquid. From this standpoint, when the immersion liquid is water, a solvent used for the topcoat is preferably a medium that is sparingly soluble in the solvent used for the positive photosensitive composition and insoluble in water. Furthermore, when the immersion liquid is an organic solvent, the topcoat may be either water-soluble or water-insoluble.

EXAMPLES

The present invention is described in greater detail below by referring to Examples, but the present invention should not be construed as being limited to these Examples.

Repeating units derived from monomers employed in the synthesis of the resin (A) used in Examples are shown below.

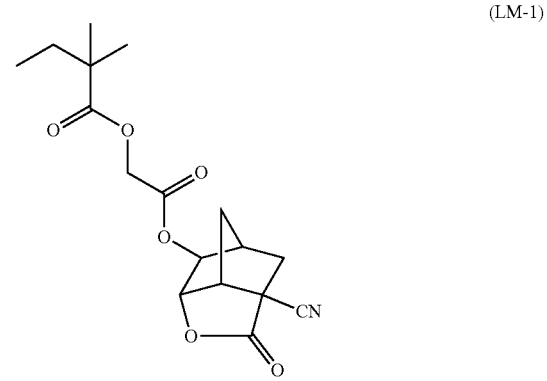

(LM-1)

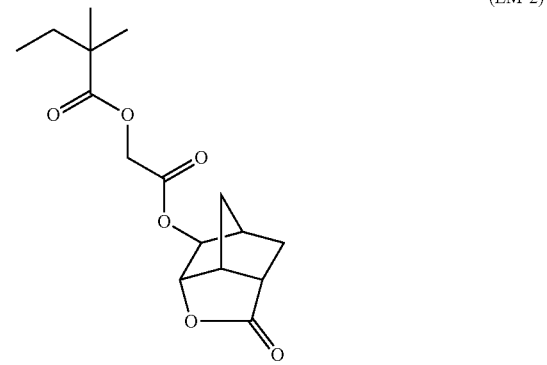

(LM-2)

(LM-3)
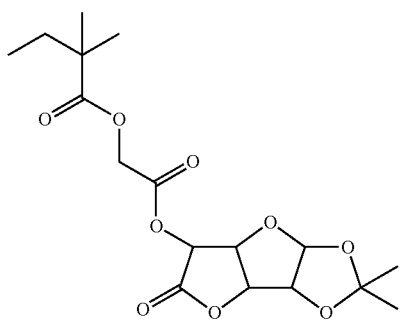
(LM-4)
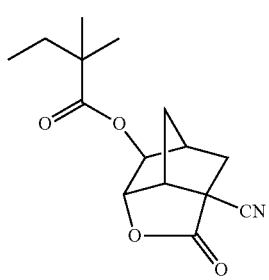
(IM-1)
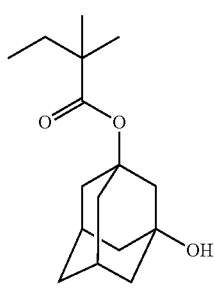
(IM-2)
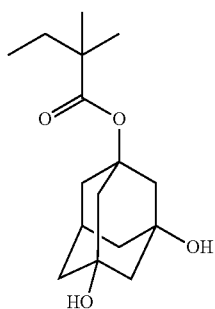
(AM-1)
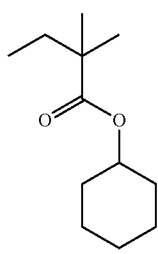
(AM-2)
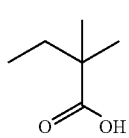
(PM-1)
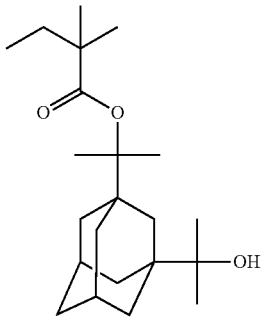
(PM-2)
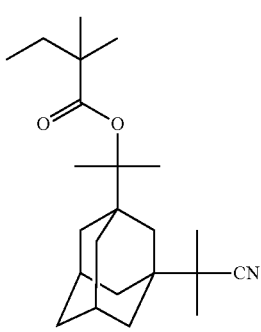
(PM-3)
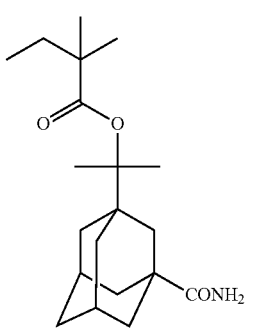
(PM-4)
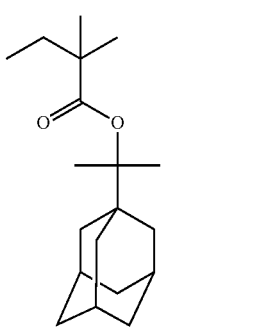
(PM-5)
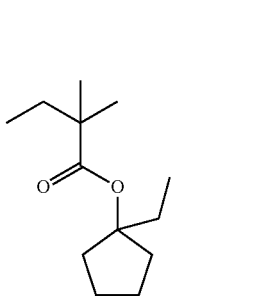

(PM-6)
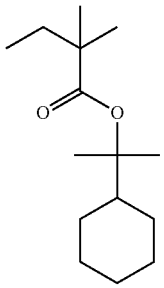

(PM-7)
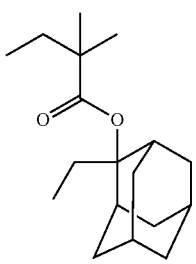

(PM-8)
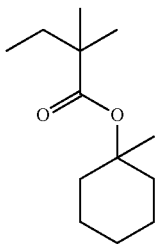

(PM-9)
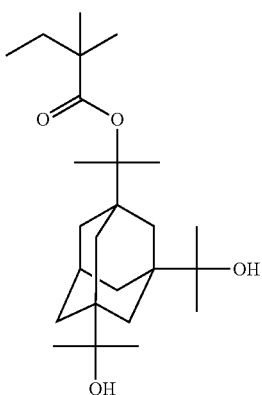

(PM-10)
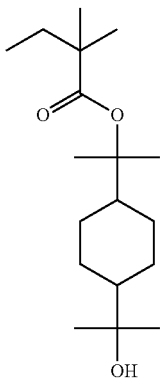

Synthesis Example 1

Synthesis of Resin (A-1)

Under nitrogen flow, 8.8 g of cyclohexanone was charged into a three-neck flask and heated at 80° C. Thereto, a solution obtained by dissolving 8.5 g of Monomer (LM-1), 8.8 g of Monomer (IM-2), 4.7 g of Monomer (PM-1) and a polymerization initiator V-60 (produced by Wako Pure Chemical Industries, Ltd.) in a concentration of 13 mol % based on the monomers, in 79 g of cyclohexanone was added dropwise over 6 hours. After the completion of dropwise addition, the reaction was further allowed to proceed at 80° C. for 2 hours. The resulting reaction solution was left standing to cool and then added dropwise to a mixed solution of 900 ml of methanol/100 ml of water over 20 minutes, and the powder which precipitated was collected by filtration and dried, as a result, 18 g of Resin (A-1) was obtained. The compositional ratio (molar ratio of repeating units starting from the repeating unit on the left side) of the obtained resin was 49/11/40, the weight average molecular weight was 8,200 in terms of standard polystyrene and the polydispersity (Mw/Mn) was 1.53.

Resins (A-2) to (A-13) were synthesized by the same operation as in Synthesis Example 1.

Structures of the resins are shown below.

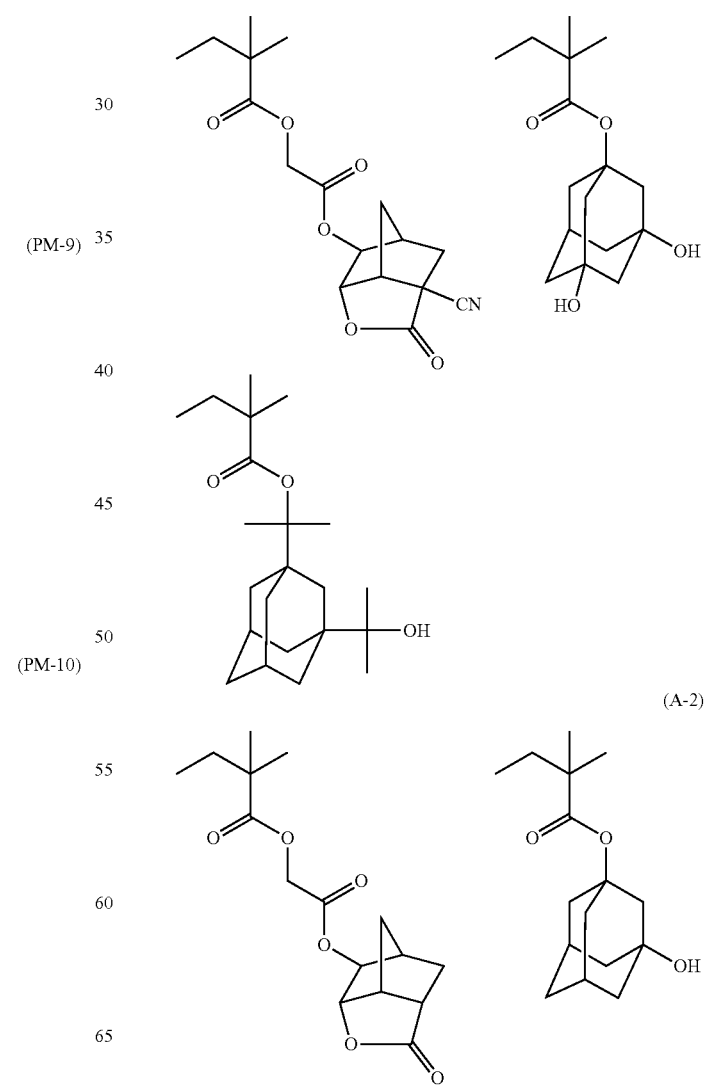

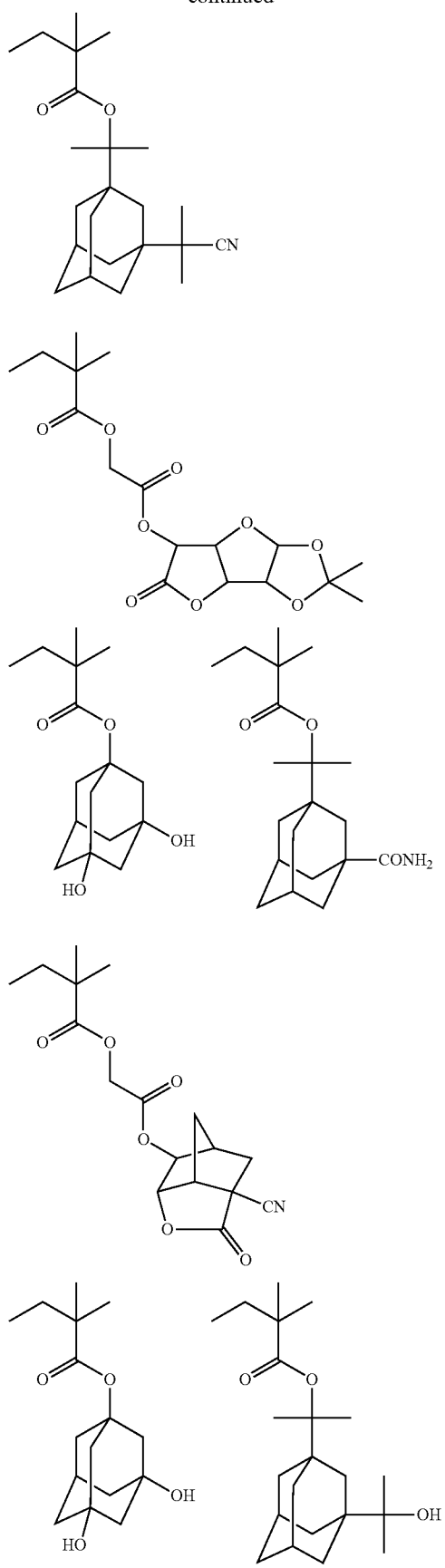
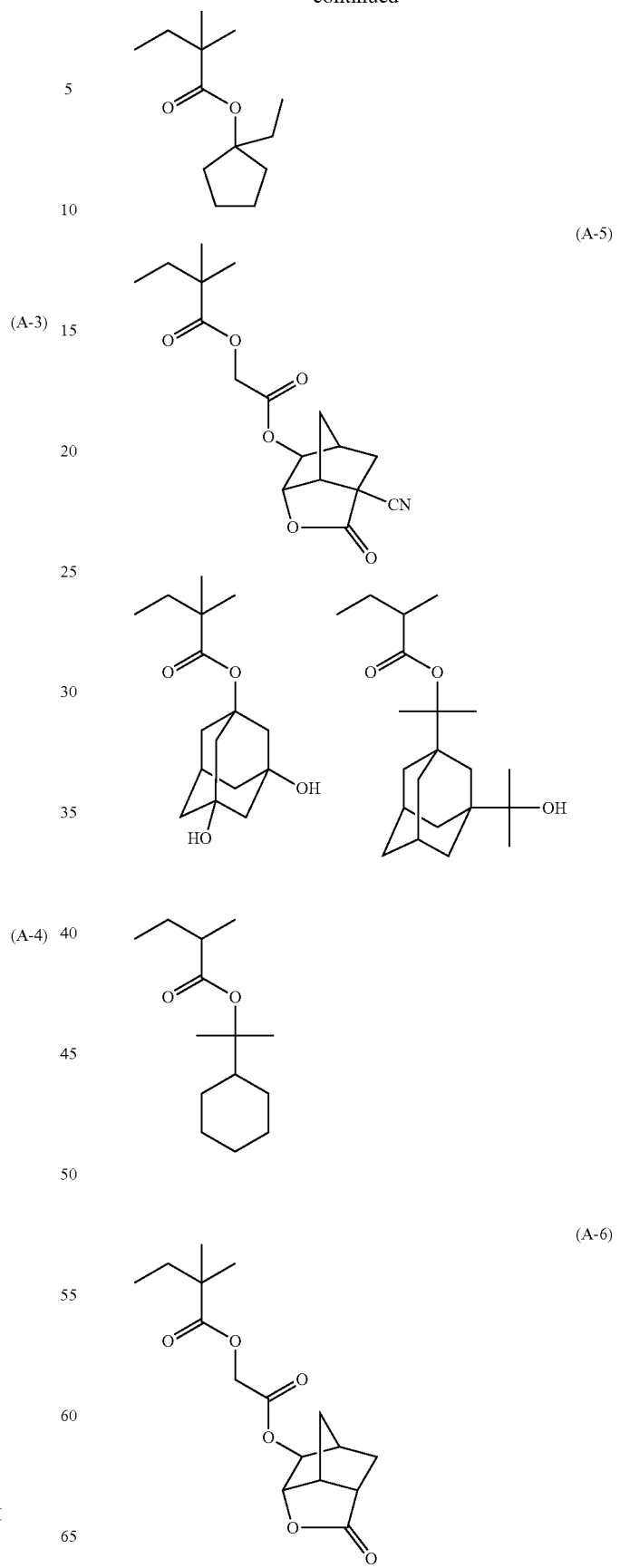

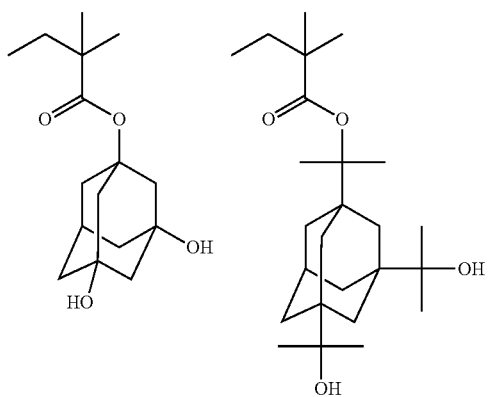
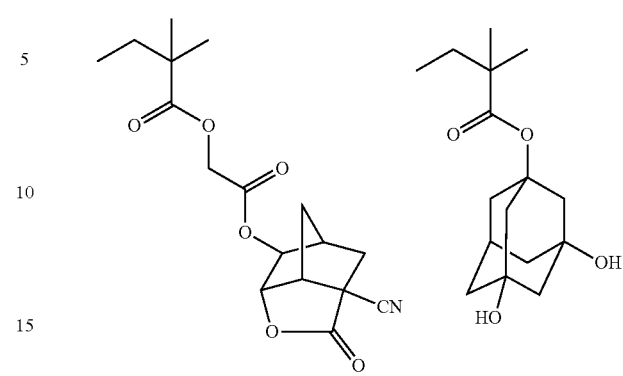
(A-8)
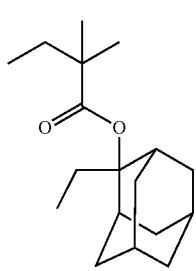
(A-7)
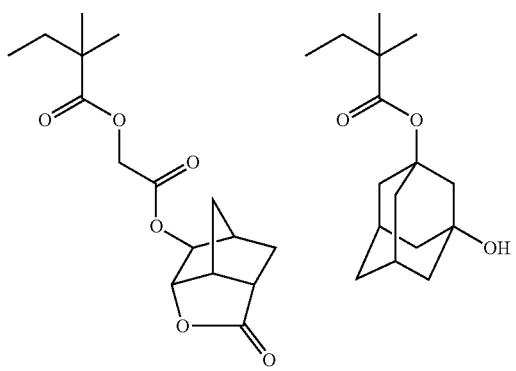
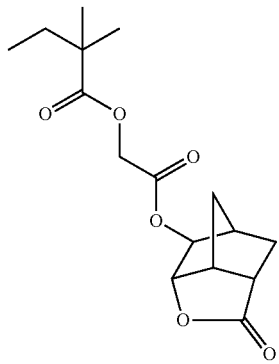
(A-9)
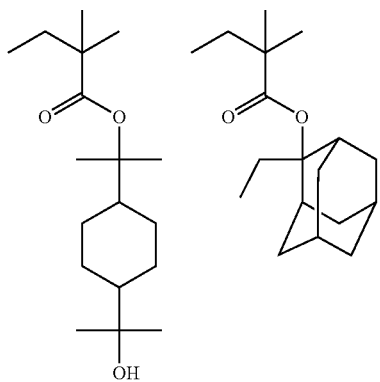
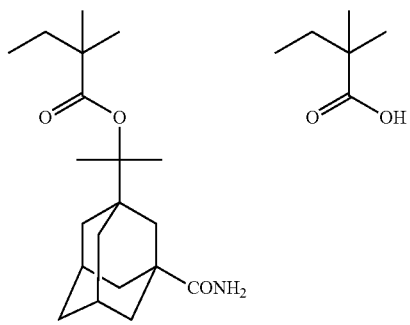

-continued
(A-10)
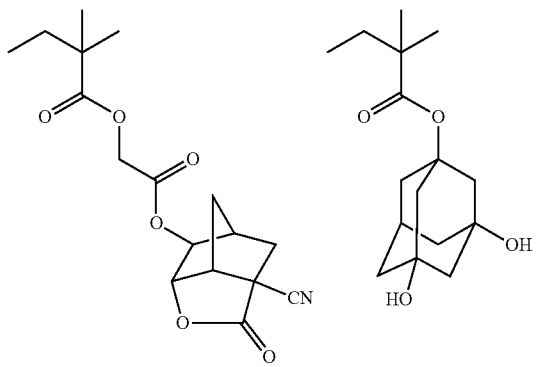
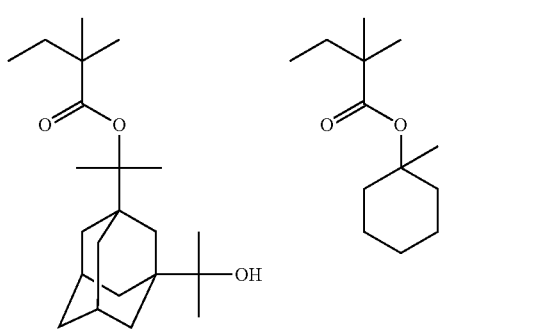
(A-11)
-continued
(A-12)
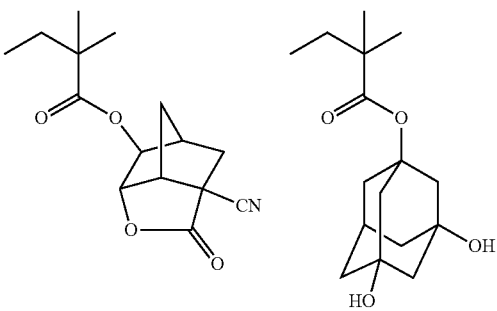
(A-13)
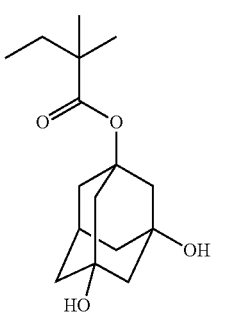
With respect to Resins (A-1) to (A-13), monomers used in the synthesis, molar ratio of monomers, weight average molecular weight and polydispersity are shown in Table 2 below. The molar ratio of monomers is the molar ratio of respective monomers starting from the left.

TABLE 2

| Resin | LM | IM | PM | AM | Compositional Ratio | Mw*[)] | Polydispersity |
|---|---|---|---|---|---|---|---|
| A-1 | LM-1 | IM-2 | PM-1 | — | — | 49/11/40 | 8200 | 1.53 |
| A-2 | LM-2 | IM-1 | PM-2 | — | — | 42/18/40 | 7500 | 1.54 |
| A-3 | LM-3 | IM-2 | PM-3 | — | — | 51/11/38 | 7900 | 1.52 |
| A-4 | LM-1 | IM-2 | PM-1 | PM-5 | — | 41/10/31/18 | 8400 | 1.49 |
| A-5 | LM-1 | IM-2 | PM-1 | PM-6 | — | 42/9/30/19 | 8000 | 1.56 |
| A-6 | LM-2 | IM-2 | PM-9 | PM-7 | — | 50/12/19/19 | 7200 | 1.51 |
| A-7 | LM-2 | IM-1 | PM-10 | PM-7 | — | 41/11/9/39 | 8900 | 1.53 |
| A-8 | LM-1 | IM-2 | PM-1 | PM-5 | AM-1 | 40/10/19/21/10 | 7600 | 1.60 |
| A-9 | LM-2 | IM-1 | PM-3 | — | AM-2 | 51/12/27/10 | 6900 | 1.52 |
| A-10 | LM-1 | IM-2 | PM-1 | PM-8 | — | 40/10/27/23 | 7400 | 1.55 |
| A-11 | LM-1 | IM-2 | PM-4 | — | — | 49/11/40 | 8100 | 1.57 |
| A-12 | LM-4 | IM-2 | PM-1 | — | — | 49/11/40 | 7900 | 1.50 |
| A-13 | LM-4 | IM-2 | PM-4 | — | — | 49/11/40 | 7800 | 1.60 |

*[)]Weight average molecular weight

Examples 1 to 10 and Comparative Examples 1 to 3

Preparation of Resist

The components shown in Table 3 below were dissolved in a solvent to prepare a solution, and the obtained solution was filtered through a polyethylene filter having a pore size of 0.1 μm to prepare a positive resist composition. The prepared positive resist composition was evaluated by the following methods, and the results are shown in Table 4. As for each component in Table 3, when a plurality of kinds were used, the ratio is a ratio by mass.

<Image Performance Test>

An organic antireflection film, ARC29A (produced by Nissan Chemical Industries, Ltd.), was coated on a silicon wafer and baked at 205° C. for 60 seconds to form a 78 nm-thick antireflection film, and the positive resist composition prepared above was coated thereon and baked at 130° C. for 60 seconds to form a 120 nm-thick resist film. The obtained wafer was exposed through a 6% halftone mask having a 1:1 line-and-space pattern of 75 nm by using an ArF excimer laser scanner (PAS5500/1100, manufactured by ASML, NA: 0.75). Thereafter, the wafer was heated on a hot plate at the PEB temperature shown in Table 4 for 60 seconds, developed with an aqueous tetramethylammonium hydroxide solution (2.38 mass %) for 30 seconds, rinsed with pure water and spin-dried to obtain a resist pattern.

Evaluation of Development Defect:

A line pattern was formed by the method above, and the number of development defects (defects/wafer) was measured by KLA2112 (manufactured by KLA Tencor Ltd.) (threshold: 12, pixel size: 0.39).

Evaluation of Scum:

A line pattern was formed by the method above. Thereafter, a cross-sectional SEM was obtained using S4800 (manufactured by Hitachi High-Technologies Corporation), and the residue scum in the space portion was observed and rated as follows.

A: Scum is not observed.
B: Scum is observed but pattern gaps are not bridged.
C: Scum is observed and pattern gaps are partially bridged.

TABLE 3

| | Composition | | | | | |
|---|---|---|---|---|---|---|
| | Resin A (parts by mass) | Acid Generator (parts by mass) | Basic Compound (parts by mass) | Additive (parts by mass) | Surfactant (parts by mass) | Solvent (parts by mass) |
| Example 1 | A-1 (94.75) | X1 (4.5) | N-2 (0.25) | | W-1 (0.50) | SL-1/SL-5 (1140/760) |
| Example 2 | A-2 (94.14) | X2 (4.7) | N-4 (0.20) | AD-1 (0.5) | W-3 (0.50) | SL-1/SL-5/SL-8 (1354/531/15) |
| Example 3 | A-3 (93.02) | X1 (5.8) | N-6 (0.18) | AD-3 (0.5) | W-2 (0.50) | SL-2/SL-6/SL-8 (1354/531/15) |
| Example 4 | A-4 (92.6) | X5/Y-5 (4.0/2.1) | N-5 (0.15) | | W-6 (0.50) | SL-1/SL-5 (1140/760) |
| Example 5 | A-5 (92.6) | X23/X55 (4.2/2.5) | N-3/N-5 (0.10/0.10) | | W-5 (0.50) | SL-1/SL-6 (1369/531) |
| Example 6 | A-6 (92.58) | X4/X63 (4.0/2.5) | N-8 (0.42) | | W-6 (0.50) | SL-2/SL-5 (1656/244) |
| Example 7 | A-7 (92.05) | X64/X1 (3.5/3.0) | N-1/N-3 (0.15/0.10) | AD-2 (0.7) | W-1 (0.50) | SL-1/SL-6/SL-8 (1641/244/15) |
| Example 8 | A-8 (92.75) | Y-11 (5.6) | N-3 (0.15) | | W-4 (0.50) | SL-1/SL-6/SL-7 (1438/442/20) |
| Example 9 | A-9 (92.78) | X23/X66 (3.5/3.0) | N-1/N-2 (0.12/0.10) | | W-7 (0.50) | SL-1/SL-6 (1641/259) |
| Example 10 | A-10 (92.00) | X1/X62 (2.2/4.4) | N-7 (0.22) | AD-2 (0.7) | W-4 (0.50) | SL-3/SL-4 (1438/462) |
| Comparative Example 1 | A-11 (94.75) | X1 (4.5) | N-2 (0.25) | | W-1 (0.50) | SL-1/SL-5 (1140/760) |
| Comparative Example 2 | A-12 (94.75) | X1 (4.5) | N-2 (0.25) | | W-1 (0.50) | SL-1/SL-5 (1140/760) |
| Comparative Example 3 | A-13 (94.75) | X1 (4.5) | N-2 (0.25) | | W-1 (0.50) | SL-1/SL-5 (1140/760) |

Compounds denoted by the abbreviations in Table 3 are the compounds shown below.
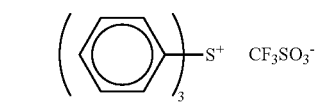
(x1)
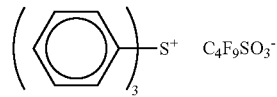
(x2)
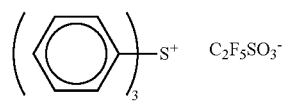
(x4)
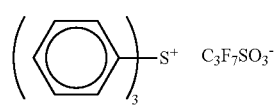
(x5)
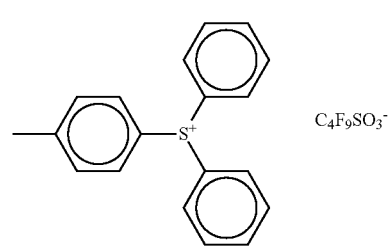
(x23)
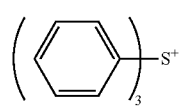
(x62)
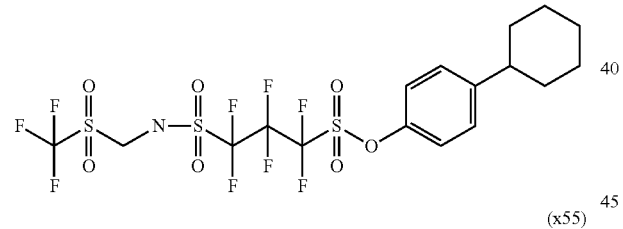
(x55)
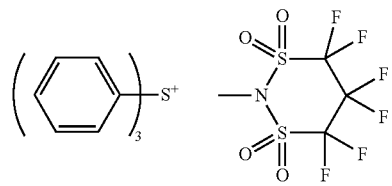
(x63)
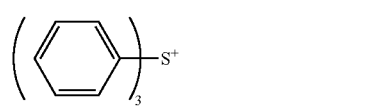
(x64)
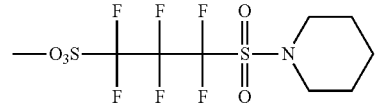
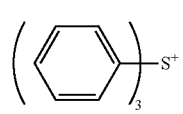
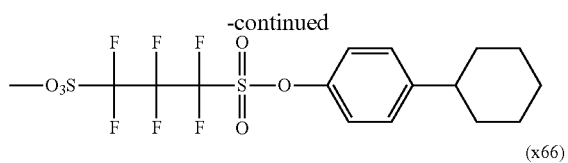
(x66)
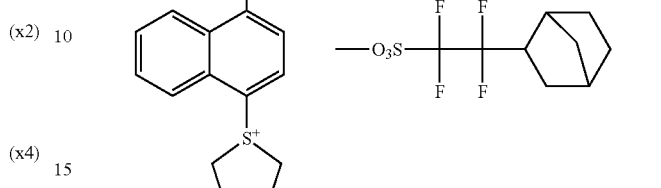
(Y-5)
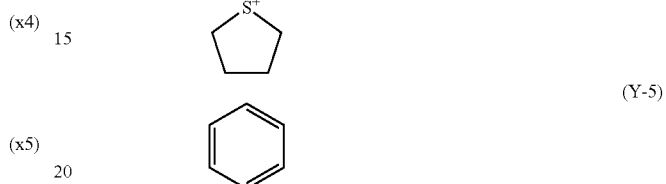
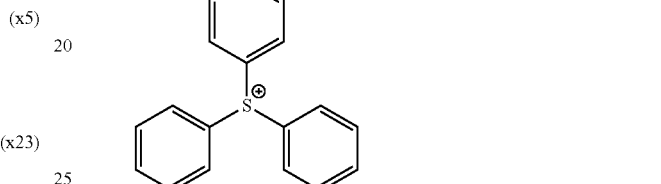
(Y-11)
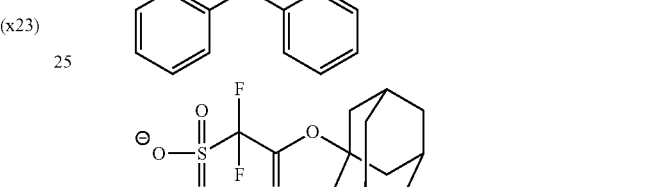
N-1: N,N-Dibutylaniline
N-2: Trioctylamine
N-3: N,N-Dihydroxyethylaniline
N-4: 2,4,5-Triphenylimidazole
N-5: 2,6-Diisopropylaniline
N-6: Hydroxyantipyrine
N-7: Trismethoxymethoxyethylamine
N-8: Triethanolamine
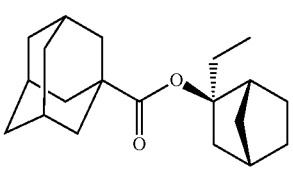
AD-1

AD-2

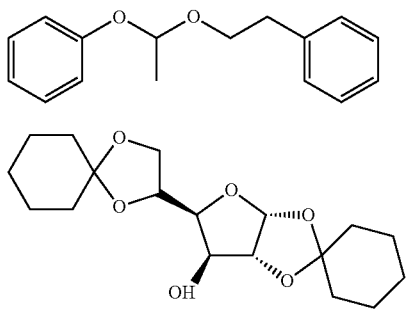

AD-3

W-1: Megaface F176 (produced by Dainippon Ink & Chemicals, Inc.) (fluorine-containing)
W-2: Megaface R08 (produced by Dainippon Ink & Chemicals, Inc.) (fluorine- and silicon-containing)
W-3: Polysiloxane Polymer KP-341 (produced by Shin-Etsu Chemical Co., Ltd.) (silicon-containing)
W-4: Troysol S-366 (produced by Troy Chemical)
W-5: KH-20 (produced by Asahi Kasei Corporation)
W-6: PF6320 (produced by OMNOVA)
W-7: PF6520 (produced by OMNOVA),
SL-1: Propylene glycol monomethyl ether acetate (PGMEA)
SL-2: Propylene glycol monomethyl ether propionate
SL-3: 2-Heptanone
SL-4: Ethyl lactate
SL-5: Propylene glycol monomethyl ether (PGME)
SL-6: Cyclohexanone
SL-7: γ-Butyrolactone
SL-8: Propylene carbonate

TABLE 4

|  | PEB Temperature (° C.) | Number of Defects (defects/wafer) | Scum |
|---|---|---|---|
| Example 1 | 85 | 1800 | A |
| Example 2 | 90 | 2000 | A |
| Example 3 | 90 | 2500 | A |
| Example 4 | 90 | 1200 | A |
| Example 5 | 100 | 1300 | A |
| Example 6 | 95 | 1400 | A |
| Example 7 | 110 | 1900 | A |
| Example 8 | 90 | 2300 | A |
| Example 9 | 95 | 2200 | A |
| Example 10 | 90 | 1800 | A |
| Comparative Example 1 | 90 | 10000 | B |
| Comparative Example 2 | 90 | 9000 | B |
| Comparative Example 3 | 90 | 9500 | B |

As apparent from Table 4, the positive photosensitive compositions of the present invention exhibit excellent performance in terms of development defect and scum.

Examples 11 to 20 and Comparative Examples 4 to 6

Preparation of Resist

The components shown in Table 5 below were dissolved in a solvent to prepare a solution, and the obtained solution was filtered through a polyethylene filter having a pore size of 0.1 µm to prepare a positive resist composition. The prepared positive resist composition was evaluated by the following methods, and the results are shown in Table 6. As for each component in Table 5, when a plurality of kinds were used, the ratio is a ratio by mass.

<Image Performance Test>

An organic antireflection film, ARC29A (produced by Nissan Chemical Industries, Ltd.), was coated on a silicon wafer and baked at 205° C. for 60 seconds to form a 98 nm-thick antireflection film, and the positive resist composition prepared above was coated thereon and baked at 130° C. for 60 seconds to form a 120 nm-thick resist film. The obtained wafer was exposed through a 6% halftone mask having a 1:1 line-and-space pattern of 65 nm pitch using an ArF excimer laser immersion scanner (XT1250i, manufactured by ASML, NA: 0.85). The immersion liquid used was ultrapure water. Thereafter, the wafer was heated on a hot plate at the PEB temperature shown in Table 6 below for 60 seconds, developed with an aqueous tetramethylammonium hydroxide solution (2.38 mass %) for 30 seconds, rinsed with pure water and spin-dried to obtain a resist pattern.

Evaluation of Development Defects:

A line pattern was formed by the method above, and the number of development defects was measured by a KLA2112 machine (manufactured by KLA Tencor Ltd.) (threshold: 12, pixel size: 0.39).

Evaluation of Scum:

A line pattern was formed by the method above. Thereafter, a cross-sectional SEM was obtained using S4800 (manufactured by Hitachi High-Technologies Corporation), and the residue in the space portion was observed and rated as follows.

A: Scum is not observed.
B: Scum is observed but pattern gaps are not bridged.
C: Scum is observed and pattern gaps are partially bridged.

TABLE 5

| | | | | Composition | | | |
|---|---|---|---|---|---|---|---|
| | Resin A (parts by mass) | Acid Generator (parts by mass) | Basic Compound (parts by mass) | Additive (parts by mass) | Surfactant (parts by mass) | Hydrophobic Resin (HR) (parts by mass) | Solvent (parts by mass) |
| Example 11 | A-1 (94.25) | X1 (4.5) | N-2 (0.25) | | W-1 (0.50) | HR-45 (0.5) | SL-1/SL-5 (1140/760) |
| Example 12 | A-2 (93.44) | X2 (4.7) | N-4 (0.20) | AD-1 (0.5) | W-3 (0.50) | HR-45 (0.7) | SL-1/SL-5/SL-8 (1354/531/15) |
| Example 13 | A-3 (92.02) | X1 (5.8) | N-6 (0.18) | AD-3 (0.5) | W-2 (0.50) | HR-45 (1.0) | SL-2/SL-6/SL-8 (1354/531/15) |
| Example 14 | A-4 (91.9) | X5/Y-5 (4.0/2.1) | N-5 (0.15) | | W-6 (0.50) | HR-37 (0.7) | SL-1/SL-5 (1140/760) |
| Example 15 | A-5 (91.8) | X23/X55 (4.2/2.5) | N-3/N-5 (0.10/0.10) | | W-5 (0.50) | HR-37 (0.8) | SL-1/SL-6 (1369/531) |
| Example 16 | A-6 (91.78) | X4/X63 (4.0/2.5) | N-8 (0.42) | | W-6 (0.50) | HR-37 (0.8) | SL-2/SL-5 (1656/244) |

TABLE 5-continued

| | Composition | | | | | | |
|---|---|---|---|---|---|---|---|
| | Resin A (parts by mass) | Acid Generator (parts by mass) | Basic Compound (parts by mass) | Additive (parts by mass) | Surfactant (parts by mass) | Hydrophobic Resin (HR) (parts by mass) | Solvent (parts by mass) |
| Example 17 | A-7 (91.45) | X64/X1 (3.5/3.0) | N-1/N-3 (0.15/0.10) | AD-2 (0.7) | W-1 (0.50) | HR-1 (0.6) | SL-1/SL-6/SL-8 (1641/244/15) |
| Example 18 | A-8 (92.05) | Y-11 (5.6) | N-3 (0.15) | | W-4 (0.50) | HR-1 (0.7) | SL-1/SL-6/SL-7 (1438/442/20) |
| Example 19 | A-9 (92.28) | X23/X66 (3.5/3.0) | N-1/N-2 (0.12/0.10) | | W-7 (0.50) | HR-8 (0.5) | SL-1/SL-6 (1641/259) |
| Example 20 | A-10 (91.40) | X1/X62 (2.2/4.4) | N-7 (0.22) | AD-2 (0.7) | W-4 (0.50) | HR-8 (0.6) | SL-3/SL-4 (1438/462) |
| Comparative Example 4 | A-11 (94.25) | X1 (4.5) | N-2 (0.25) | | W-1 (0.50) | HR-45 (0.5) | SL-1/SL-5 (1140/760) |
| Comparative Example 5 | A-12 (94.25) | X1 (4.5) | N-2 (0.25) | | W-1 (0.50) | HR-45 (0.5) | SL-1/SL-5 (1140/760) |
| Comparative Example 6 | A-13 (94.25) | X1 (4.5) | N-2 (0.25) | | W-1 (0.50) | HR-45 (0.5) | SL-1/SL-5 (1140/760) |

TABLE 6

| | PEB Temperature (° C.) | Number of Defects (defects/wafer) | Scum |
|---|---|---|---|
| Example 11 | 85 | 2000 | A |
| Example 12 | 90 | 1800 | A |
| Example 13 | 90 | 2200 | A |
| Example 14 | 90 | 2300 | A |
| Example 15 | 100 | 2100 | A |
| Example 16 | 95 | 2000 | A |
| Example 17 | 110 | 1800 | A |
| Example 18 | 90 | 1900 | A |
| Example 19 | 95 | 2200 | A |
| Example 20 | 90 | 2400 | A |
| Comparative Example 4 | 90 | 12000 | C |
| Comparative Example 5 | 90 | 11500 | C |
| Comparative Example 6 | 90 | 10000 | C |

As apparent from Table 6, the positive photosensitive composition of the present invention exhibits excellent performance in terms of development defect and scum upon ArF immersion exposure.

INDUSTRIAL APPLICABILITY

According to the positive photosensitive composition of the present invention, a pattern reduced in the development defects and scum can be provided, this composition is suitable particularly as a positive resist composition, and a pattern forming method using the composition are provided.

This application is based on Japanese patent application JP 2008-251921, filed on Sep. 29, 2008, the entire content of which is hereby incorporated by reference, the same as if set forth at length.

The invention claimed is:

1. A positive photosensitive composition, comprising:
(A) a resin having a repeating unit represented by formula (1-1) and a repeating unit represented by formula (2) and being capable of increasing the solubility of the resin (A) in an alkali developer by an action of an acid;
(B) a compound capable of generating an acid upon irradiation with actinic rays or radiation;
(HR) a hydrophobic resin containing at least one group selected from the group consisting of (y) a group capable of decomposing by the action of an alkali developer to increase the hydrophobic resin's solubility in an alkali developer, and (z) a group capable of decomposing by the action of an acid; and
a solvent:

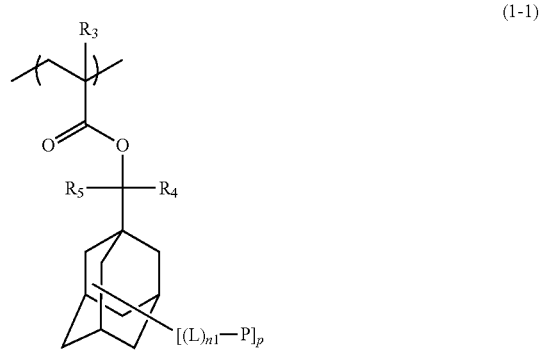

(1-1)

wherein $R_3$ represents a hydrogen atom, a methyl group or a group represented by —$CH_2$—$R_9$ in which $R_9$ represents a hydroxyl group or a monovalent organic group;
each of $R_4$ and $R_5$ independently represents an alkyl group or a cycloalkyl group, and $R_4$ and $R_5$ may combine to form a cycloalkyl group;
L represents a divalent linking group;
$n_1$ is 0 or 1;
p represents an integer of from 1 to 15; and
P represents a polar group:

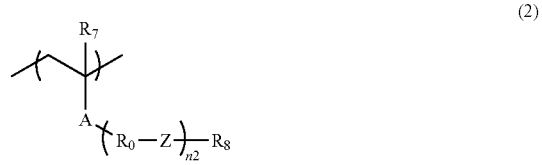

(2)

wherein A represents an ester bond or an amide bond;
$R_0$ represents an alkylene group, a cycloalkylene group or a divalent linking group formed by a combination thereof, and when a plurality of $R_0$'s are present, the plurality of $R_0$'s may be the same or different;
Z represents an ether bond, an ester bond, an amide bond, a urethane bond, a urea bond or a combination thereof, and when a plurality of Z's are present, the plurality of Z's may be the same or different;

$R_8$ represents a monovalent organic group having a lactone structure;

$n_2$ is a repetition number of the structure represented by —$R_0$—Z— in the repeating unit represented by formula (2) and represents an integer of 1 to 5; and $R_7$ represents a hydrogen atom, a halogen atom or an alkyl group.

2. The positive photosensitive composition according to claim 1,
wherein in the repeating unit represented by formula (1-1), P is a hydroxyl group, a cyano group or an amide group.

3. The positive photosensitive composition according to claim 1,
wherein in the repeating unit represented by formula (1-1), L is a branched alkylene group and $n_1$ is 1.

4. The positive photosensitive composition according to claim 1,
wherein in the repeating unit represented by formula (2), $n_2$ is 1.

5. The positive photosensitive composition according to claim 1,
wherein in the repeating unit represented by formula (1-1), p is 1.

6. The positive photosensitive composition according to claim 1,
wherein the repeating unit represented by formula (2) is a repeating unit represented by formula (2-1):

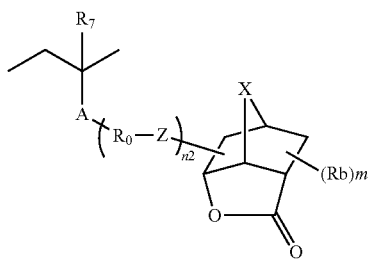

(2-1)

wherein $R_7$, A, $R_0$, Z and $n_2$ have the same meanings as $R_7$, A, $R_0$, Z and $n_2$ in formula (2);

Rb represents an alkyl group, a cycloalkyl group, an alkoxycarbonyl group, a cyano group, a hydroxyl group or an alkoxy group, and when a plurality of Rb's are present, the plurality of Rb's may be the same or different and two members out of the plurality of Rb's may combine to form a ring;

X represents an alkylene group, an oxygen atom or a sulfur atom; and m is the number of substituents and represents an integer of 0 to 5.

7. The positive photosensitive composition according to claim 1,
wherein the content of the repeating unit represented by formula (1-1) is from 5 to 50 mol % based on all repeating units in the resin (A).

8. A pattern forming method, comprising:
forming a resist film from the positive photosensitive composition according to claim 1; and
exposing and developing the resist film.

9. The pattern forming method according to claim 8,
wherein the resist film is exposed through an immersion liquid.

10. The positive photosensitive composition according to claim 1,
wherein in the repeating unit represented by formula (2), $R_0$ represents a methylene group.

11. The positive photosensitive composition according to claim 1, wherein the amount of the hydrophobic resin (HR) is 0.1 to 10% by weight based on the entire solids content of the composition.

12. The positive photosensitive composition according to claim 1, wherein -(L)$_{n1}$-P in formula (1-1) is —C(CH$_3$)$_2$OH.

13. The positive photosensitive composition according to claim 1, wherein the resin (A) contains a repeating unit having an acid decomposable group in addition to the repeating unit represented by formula (1-1).

14. The positive photosensitive composition according to claim 1, wherein the acid generator (B) is a compound represented by formula (Y):

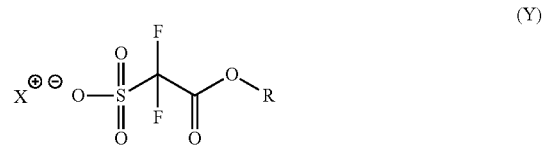

(Y)

wherein in formula (Y), $X^+$ represents an organic counter ion; and R represents a hydrogen atom or an organic group.

15. A positive photosensitive composition, comprising:
(A) a resin having a repeating unit represented by formula (1) and a repeating unit represented by formula (2) and being capable of increasing the solubility of the resin (A) in an alkali developer by an action of an acid;
(B) a compound capable of generating an acid upon irradiation with actinic rays or radiation;
(HR) a hydrophobic resin containing at least one group selected from the group consisting of (y) a group capable of decomposing by the action of an alkali developer to increase the hydrophobic resin's solubility in an alkali developer, and (z) a group capable of decomposing by the action of an acid; and
a solvent:

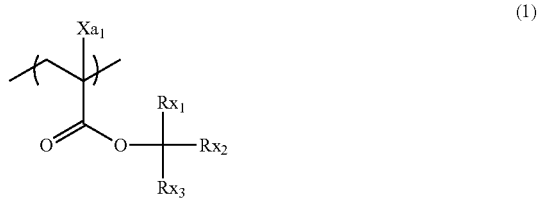

(1)

wherein $Xa_1$ represents a hydrogen atom, a methyl group or a group represented by —CH$_2$—$R_9$ in which $R_9$ represents a hydroxyl group or a monovalent organic group;

each of $Rx_1$ to $Rx_3$ independently represents an alkyl group or a cycloalkyl group, and two members out of $Rx_1$ to $Rx_3$ may combine to form a cycloalkyl group, provided that the group represented by —C($Rx_1$)($Rx_2$)($Rx_3$) in formula (1) has at least one group represented by -(L)$_{n1}$-P as a substituent;

L represents a divalent linking group;

$n_1$ is 0 or 1; and

P represents a polar group:

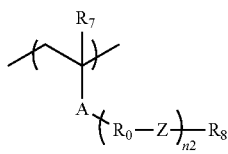

(2)

wherein A represents an ester bond or an amide bond;
$R_0$ represents an alkylene group, a cycloalkylene group or a divalent linking group formed by a combination thereof, and when a plurality of $R_0$'s are present, the plurality of $R_0$'s may be the same or different;
Z represents an ether bond, an ester bond, an amide bond, a urethane bond, a urea bond or a combination thereof, and when a plurality of Z's are present, the plurality of Z's may be the same or different;
$R_8$ represents a monovalent organic group having a lactone structure;
$n_2$ is a repetition number of the structure represented by —$R_0$—Z— in the repeating unit represented by formula (2) and represents an integer of 1 to 5; and
$R_7$ represents a hydrogen atom, a halogen atom or an alkyl group;
wherein in the repeating unit represented by formula (1), $Rx_1$ represents an alkyl group, $Rx_2$ and $Rx_3$ are combined to form a cycloalkyl group and —$C(CH_3)_2$—P in which P represents a hydroxyl group or a cyano group is bonded to the cycloalkyl group formed by $Rx_2$ and $Rx_3$, and
in the repeating unit represented by formula (2), A represents an ester bond, $R_0$ represents an alkylene group, Z represents an ester bond, $n_2$ represents 1 and $R_8$ represents a norbornane lactone.

16. The positive photosensitive composition according to claim 15, wherein $n_1$ in formula (1) is 1.

17. A positive photosensitive composition, comprising:
(A) a resin having a repeating unit represented by formula (1) and a repeating unit represented by formula (2) and being capable of increasing the solubility of the resin (A) in an alkali developer by an action of an acid;
(B) a compound capable of generating an acid upon irradiation with actinic rays or radiation;
(HR) a hydrophobic resin containing at least one group selected from the group consisting of (y) a group capable of decomposing by the action of an alkali developer to increase the hydrophobic resin's solubility in an alkali developer, and (z) a group capable of decomposing by the action of an acid; and
a solvent:

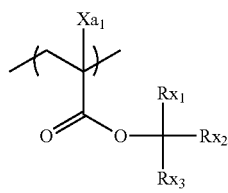

(1)

wherein $Xa_1$ represents a hydrogen atom, a methyl group or a group represented by —$CH_2$—$R_9$ in which $R_9$ represents a hydroxyl group or a monovalent organic group;
each of $Rx_1$ to $Rx_3$ independently represents an alkyl group or a cycloalkyl group, and two members out of $Rx_1$ to $Rx_3$ may combine to form a cycloalkyl group, provided that the group represented by —$C(Rx_1)(Rx_2)(Rx_3)$ in formula (1) has at least one group represented by —$C(CH_3)_2OH$ as a substituent.

* * * * *